United States Patent [19]
Hashizume et al.

[11] Patent Number: 5,703,513
[45] Date of Patent: Dec. 30, 1997

[54] MASTER-SLAVE BISTABLE LATCH WITH CLOCK INPUT CONTROL

[75] Inventors: Takeshi Hashizume; Kazuhiro Sakashita, both of Tokyo, Japan

[73] Assignee: Mitsubishi Denki Kabushiki Kaisha, Tokyo, Japan

[21] Appl. No.: 608,051

[22] Filed: Feb. 28, 1996

[30] Foreign Application Priority Data

Sep. 6, 1995 [JP] Japan .................. 7-229059

[51] Int. Cl.$^6$ .................................... H03K 3/289
[52] U.S. Cl. ........................... 327/202; 327/215
[58] Field of Search ..................... 326/93; 327/141, 327/199, 202, 215, 216, 217, 218, 225

*Primary Examiner*—Timothy P. Callahan
*Assistant Examiner*—Jeffrey Zweizig
*Attorney, Agent, or Firm*—Oblon, Spivak, McClelland, Maier & Neustadt, P.C.

[57] ABSTRACT

It is an object to obtain a semiconductor integrated circuit with reduced power consumption without reducing operation speed. In clock input control means (27), an exclusive OR gate (26a) receives comparison data (S1 and S2) and an NAND gate (27a) receives output of the exclusive OR gate (26a) and a reference clock (T) and outputs its output, a control signal (SC1) to an AND gate (G1) and an AND gate (G2) in a data holding portion (31a). An exclusive OR gate (26b) receives comparison data (S3 and S4) and an NAND gate (27b) receives the output of the exclusive OR gate (26b) and the reference clock (T), and outputs its output, a control signal (SC2) to an OR gate (G5) and an OR gate (G6) in a data holding portion (31b). Appropriately selecting the comparison data (S1–S4) allows data transfer at high speed of input data (D), output data (Q), inverted output data (QC), and so forth.

11 Claims, 36 Drawing Sheets

MASTER-SLAVE BISTABLE LATCH WITH CLOCK INPUT CONTROL

BACKGROUND OF THE INVENTION

1. Field of the Invention

The present invention relates to semiconductor integrated circuits, and particularly to, a semiconductor integrated circuit having data holding means built therein, such as a microprocessor, microcontroller, etc.

2. Description of the Background Art

In recent semiconductor integrated circuits, attempts have been made to raise levels of functions by improving the parallelism of data processing and complicating the control. This means that data holding means such as flip-flops (which may be referred to as FF, hereinafter) for data processing and control are increased in the integrated circuits.

As well as the progress in functions, the semiconductor integrated circuits are required to achieve high speed and low power consumption, and synchronous design with constantly applied free-running one-phase clock is supposed as measures to be taken for the former, considering easy skew control.

FIG. 67 shows the structure of a conventional semiconductor integrated circuit which is synchronously designed with free-running one-phase clock. As shown in the figure, a semiconductor integrated circuit 3 includes FF's 1a–1d, combinational circuits (CB) 2a–2d and input signal selecting circuits 6a–6d. The respective FF's 1a–1d exist in parallel for 32 bits, respectively, and perform data processing of 32 bits with the combinational circuits or with the external of the integrated circuit. A clock signal line 4 is provided in common to the clock inputs T of the FF's 1a–1d. Accordingly, 32×4=128 FF's exist in the semiconductor integrated circuit 3, and gate capacitance for 128 FF's is provided to the clock signal line 4 as well as the wire capacitance. All the FF's are always supplied with clock, and the selecting operation of the input signal selecting circuits 6a–6d under control by control signals 5a–5d generated by the FF controlling combinational circuit 2b controls whether data from previous stage circuit blocks or FF's are to be written or data already held are to be rewritten.

Next, a specific example of detailed internal structure of the FF shown in FIG. 67 is shown in FIG. 68 and FIG. 69. FIG. 68 shows the structure of the FF at the gate level, and FIG. 69 shows its more detailed structure at the transistor level.

As shown in FIG. 68, input data D inputted from the input terminal PI is provided as one input to an OR gate G11 and as an input to an inverter 32. The inverter 32 outputs inverted input data DC which is obtained by logically inverting the input data D to one input of an OR gate G12. The output of the OR gate G11 is provided as one input to an NAND gate G13 and the output of the OR gate G12 is provided as one input to an NAND gate G14. The output of the NAND gate G13 is provided as the other input to the NAND gate G14 and also as one input to an AND gate G15, and the output of the NAND gate G14 is provided as the other input of the NAND gate G13 and also as one input to an AND gate G16.

The output of the AND gate G15 is provided as one input to an NOR gate G17 and the output of the AND gate G16 is provided as one input to an NOR gate G18. The output of the NOR gate G17 is provided as the other input to the NOR gate G18 and also as an input to an inverter 33 and the output of the NOR gate G18 is provided as the other input to the NOR gate G17 and also as an input to an inverter 34. The outputs of the inverters 33 and 34 are provided as output data Q and inverted output data QC, respectively.

Then, a clock T inputted from a clock terminal PC is provided in common as the other inputs to the OR gates G11, G12, and the AND gates G15, G16.

If such a circuit as shown in FIG. 68 is implemented with MOS transistors, it can be formed with transistors T1–T30 as shown in FIG. 69, for example. In the figure, the transistors T1 and T2 form the inverter 32, the transistors T4–T8 form the OR gate G12 and the NAND gate G14, the transistors T9–T14 form the OR gate G11 and the NAND gate G13, the transistors T15–T20 form the AND gate G15 and the NOR gate G17, the transistors T21–T26 form the AND gate G16 and the NOR gate G18, the transistors T27 and T28 form the inverter 33, and the transistors T29 and T30 form the inverter 34.

The reference clock T is inputted to the gates of the transistors T3, T7, T11, T13, T17, T19, T23 and T26. That is to say, gate capacitance for 8 transistors per one FF is applied to the clock signal line 4.

Hence, in the semiconductor integrated circuit shown in FIG. 67, gate capacitance for 128×8=1024 is applied to the clock signal line 4 and charge/discharge current flows for the clock wire capacitance and the gate capacitance of the 1024 transistors every time the clock changes.

Next, FF's which use clocked gates to reduce power consumption will be described. In the semiconductor integrated circuit 17 shown in FIG. 70, as compared with the semiconductor integrated circuit shown in FIG. 67, the clock T to be inputted respectively to the clock inputs of the FF's 1a–1d is provided through the AND gates 19a–19d. These AND gates 19a–19d receive the reference clock T in common at their one inputs and receive FF write control signals 5a–5d outputted from the combinational circuit 2b as their other inputs. The input signal selecting circuits 6a–6d are removed.

Accordingly, by rendering the FF write control signals 5a–5d "L", control can be made to make the reference clock T invalid and to apply a signal fixed to "L" to the clock inputs of the FF's 1a–1d. Such control is made for every 32 bits, and the reference clock T is selectively applied to the respective FF groups 1a–1d in writing and the application of the reference clock T to the FF's is selectively made invalid in no-writing.

FIG. 71 shows a specific example of the structure of the AND gates 19a–19d shown in FIG. 70 at the transistor level. Referring to the figure, sources of PMOS transistors 20a and 20b are connected to the power-source $V_{DD}$, and the drains are connected in common to a drain of an NMOS transistor 20d through a node N1. The source of the NMOS transistor 20d is connected to a drain of an NMOS transistor 20c, and the source of the NMOS transistor 20c is grounded.

A source of a PMOS transistor 20e is connected to the power-source and its drain is connected to a drain of an NMOS transistor 20f through a node N2. The source of the NMOS transistor 20f is grounded.

Then, the FF write control signals 5a–5d are applied to the gates of the transistors 20a and 20d as input A, the reference clock T is applied to the gates of the transistors 20b and 20c as input B, and a logical product Y of the input A and the input B is obtained from the node N2.

When the reference clock T is applied as the input B, gate capacitance for two transistors is added to the reference clock T. Hence, when the FF is in a no-write state, that is, when the FF write control signals 5a–5d inputted as the input A are in a no-write state (a "L" level is applied), the outputs of the AND gates 19a–19d do not change and are fixed to "L", and therefore charge/discharge is made only for the clock signal line 4 and the gate capacitance of two transistors, 20b and 20c.

However, since the reference clock T is propagated to the clock inputs of the FF's 1a–1d via the AND gates 19a–19d when the FF's are in a write state, charge/discharge is performed by the output signals of the AND gates in addition to the charge/discharge in the clock interconnection 4. This means the charge made via the PMOS transistor 20b to the AND gate internal interconnection 21 (node N1) shown in FIG. 71, the discharge made via the NMOS transistors 20c and 20d from the AND gate internal interconnection 21, and further, the charge made via the PMOS transistor 20e to the AND gate output signal line 22 (node N2), and the discharge via the NMOS transistor 20f from the AND gate output signal line 22.

At this time, the charge/discharge to the AND gate internal interconnection 21 also includes the gate capacitance of the transistors 20e–20f in addition to the internal wire capacitance. Similarly, the gate capacitance for 8×32=256 transistors for each FF group of 32 bits is added to the charge/discharge to the output signal line 22 of the AND gate.

Accordingly, the charge/discharge by the reference clock T in the semiconductor integrated circuit 17 is made for the capacitance indicated as (the capacitance of the clock interconnection 4)+(the gate capacitance for 2 Trs.×4=8 Trs. of the AND gates 19a–19d)+((the capacitance of the AND gate internal interconnection 21)+(the gate capacitance of 2 Trs. of the AND gate internal transistors 20e, 20f)+(the capacitance of the AND gate output interconnection 22)+(the gate capacitance for 8 Trs.×32=256 Trs. connected to clock terminals of FF's of 32 bits))×(the number of write FF groups).

For example, the conventional semiconductor integrated circuit which is synchronously designed with free-running one-phase clock using FF's as shown in FIG. 67 had a problem that a large number of FF groups operate at the same time irrespective of write/no-write of the respective FF groups and gates of a large number of transistors are connected to the clock signal lines 4 of the respective FF's to increase the gate capacitance applied onto the clock signal line 4, which increases the charge/discharge current on the clock signal line 4 caused as the clock changes, incurring an increase in power consumption.

Furthermore, the conventional semiconductor integrated circuit which uses FF's using clocked gates as shown in FIG. 70 had a problem that the charge/discharge additionally increases for the clock control gates in the writing operation mode, though the gate capacitance charged/discharged in a no-writing operation decreases.

Moreover, the semiconductor integrated circuits shown in FIG. 67 and FIG. 70 both require a control circuit (the combinational circuit 2b) for controlling write/no-write of data into FF's. Particularly, the semiconductor integrated circuit shown in FIG. 70 has a feature that less charge/discharge is performed as a larger number of FF groups are in no-write operation, to reduce the power consumption. Accordingly, in the semiconductor integrated circuit shown in FIG. 70, configuring the control circuit to enable finer control to maximize the feature will complex the control circuit more and increase the number of gates, incurring a delay of the clock control signal, resulting in reduced operation speed.

SUMMARY OF THE INVENTION

According to a first aspect of the present invention, a semiconductor integrated circuit comprises an input terminal receiving input data, first and second output terminals, input data inverting means for outputting inverted input data obtained by logically inverting the input data obtained through the input terminal, first data holding means receiving the input data and the inverted input data, for holding a logical value indicated by the input data as first internal output data and holding a logical value indicated by the inverted input data as first inverted internal output data in synchronization with a first controlling clock, second data holding means receiving the first internal output data and the first inverted internal output data, for holding a logical value indicated by the first internal output data as second internal output data and holding a logical value indicated by the first inverted internal output data as second inverted internal output data in synchronization with a second controlling clock, first external data output means for logically inverting the second inverted internal output data to output data from the first output terminal, second external data output means for logically inverting the second internal output data to output inverted output data from the second output terminal, first clock control means receiving first and second comparison data and a reference clock, for outputting the reference clock/a fixed voltage as the first controlling clock on the basis of match/mismatch of logical values of the first comparison data and the second comparison data, and second clock control means receiving third and fourth comparison data and the reference clock, for outputting the reference clock/a fixed voltage as the second controlling clock on the basis of match/mismatch of logical values of the third comparison data and the fourth comparison data, wherein the first comparison data is one data of the input data and the inverted input data, and the second comparison data is one data of the first internal data, the second internal data, the output data, the first inverted internal data, the second inverted internal data and the inverted output data, when the first comparison data is the input data, the second comparison data is one data of the first internal data, the second internal data and the output data, and when the first comparison data is the inverted input data, the second comparison data is one data of the first inverted internal data, the second inverted internal data and the inverted output data, and the third comparison data is one data of the input data, the first internal data, the inverted input data and the first inverted internal data, and the fourth comparison data is one data of the first internal data, the second internal data, the output data, the first inverted internal data, the second inverted internal data and the inverted output data, when the third comparison data is the input data, the fourth comparison data is one data of the first internal data, the second internal data and the output data, when the third comparison data is the first internal data, the fourth comparison data is one data of the second internal data and the output data, when the third comparison data is the inverted input data, the fourth comparison data is one data of the first inverted internal data, the second inverted internal data and the inverted output data, and when the third comparison data is the first inverted internal data, the fourth comparison data is one data of the second inverted internal data and the inverted output data.

Preferably, according to a second aspect of the present invention, in the semiconductor integrated circuit, when the first comparison data is the input data, the second comparison data is one data of the first internal data and the second internal data, when the third comparison data is the input data, the fourth comparison data is one data of the first internal data and the second internal data, and when the third comparison data is the first internal data, the fourth comparison data is the second internal data.

Preferably, according to a third aspect of the present invention, in the semiconductor integrated circuit, when the first comparison data is the inverted input data, the second comparison is one of the first inverted internal data and the inverted output data, when the third comparison data is the inverted input data, the fourth comparison data is one data of the first inverted internal data and the inverted output data, and when the third comparison data is the first inverted internal data, the fourth comparison data is the inverted output data.

Preferably, according to a fourth aspect of the present invention, in the semiconductor integrated circuit, when the first comparison data is the inverted input data, the second comparison data is one data of the first inverted internal data and the second inverted internal data, when the third comparison data is the inverted input data, the fourth comparison data is one data of the first inverted internal data and the second inverted internal data, and when the third comparison data is the first inverted internal data, the fourth comparison data is the second inverted internal data.

Preferably, according to a fifth aspect of the present invention, in the semiconductor integrated circuit, when the first comparison data is the input data, the second comparison data is one data of the first internal data and the output data, when the third comparison data is the input data, the fourth comparison data is one data of the first internal data and the inverted output data, and when the third comparison data is the first internal data, the fourth comparison data is the output data.

Preferably, according to a sixth aspect of the present invention, in the semiconductor integrated circuit, the first comparison data is the inverted input data, and the third comparison data is one data of the first internal data, the inverted input data and the first inverted internal data.

Preferably, according to a seventh aspect of the present invention, in the semiconductor integrated circuit, when the first comparison data is the input data, the second comparison data is one data of the first internal data and the second internal data, when the first comparison data is the inverted input data, the second comparison data is one data of the first inverted internal data and the second inverted internal data, when the third comparison data is the input data, the fourth comparison data is one data of the first internal data and the second internal data, when the third comparison data is the first internal data, the fourth comparison data is the second inverted internal data, when the third comparison data is the inverted input data, the fourth comparison data is one data of the first inverted internal data and the second inverted internal data, and when the third comparison data is the first inverted internal data, the fourth comparison data is the second inverted internal data.

Preferably, according to an eighth aspect of the present invention, in the semiconductor integrated circuit, when the first comparison data is the input data, the second comparison data is the output data, the third comparison data is one data of the inverted input data and the first inverted internal data, and the fourth comparison data is the inverted output data, and when the first comparison data is the inverted input data, the second comparison data is the inverted output data, the third comparison data is one data of the input data and the first internal data, and the fourth comparison data is the output data.

According to a ninth aspect of the present invention, a semiconductor integrated circuit comprises input data inverting means receiving input data for outputting inverted input data obtained by logically inverting the input data, first data holding means receiving the input data and the inverted input data, for holding a logical value indicated by the input data as first internal output data and holding a logical value indicated by the inverted input data as first inverted internal output data in synchronization with a controlling clock, second data holding means receiving the first internal output data and the first inverted internal output data, for holding a logical value indicated by the first internal output data as second internal output data and holding a logical value indicated by the first inverted internal output data as second inverted internal output data in synchronization with the controlling clock, first external data output means for logically inverting the second inverted internal output data to output output data, second external data output means for logically inverting the second internal output data to output inverted output data, and clock control means receiving first to fourth comparison data and a reference clock, for outputting the reference clock or a fixed voltage as the controlling clock on the basis of the first to fourth comparison data, wherein the clock control means comprises, a first AND gate receiving the first and second comparison data for executing AND operation of the first comparison data and the second comparison data to output first logical data, a second AND gate receiving the third and fourth comparison data for executing AND operation of the third comparison data and the fourth comparison data to output second logical data, an OR gate for executing OR of the first and second logical data to output third logical data, and a clock control gate receiving the reference clock and the third logical data for outputting the reference clock/the fixed voltage as the controlling clock on the basis of "H"/"L" of the third logical data, wherein the first comparison data is one data of the input data and the inverted input data, when the first comparison data is the input data, the second comparison data is one data of the first inverted internal data, the second inverted internal data and the inverted output data, the third comparison data is data of the inverted input data, and the fourth comparison data is one data of the first internal data, the second internal data and the output data, and when the first comparison data is the inverted input data, the second comparison data is one data of the first internal data, the second internal data and the output data, the third comparison data is the input data, and the fourth comparison data is one data of the first inverted internal data, the second inverted internal data, and the inverted output data.

According to a tenth aspect of the present invention, a semiconductor integrated circuit comprises first to n-th data holding means respectively receiving first to n-th input data, for in synchronization with a common controlling clock holding logical values indicated by the first to n-th input data respectively as first to n-th output data and holding inverted values of the logical values respectively indicated by the first to n-th input data as first to n-th inverted output data, first to n-th comparison means respectively receiving the first to n-th input data and the first to n-th output data, for respectively comparing the first to n-th input data and the first to n-th output data to respectively output first to n-th comparison signals indicating match/mismatch, and clock control means receiving the first to n-th comparison signals and a reference clock, for outputting a fixed voltage as the controlling clock only when the first to n-th comparison signals all indicate match and otherwise outputting the reference clock as the controlling clock.

According to an eleventh aspect of the present invention, a semiconductor integrated circuit comprises input data selecting means receiving input data and scan input data, for outputting one data of the input data and the scan input data as selection data on the basis of a selection signal, data holding means receiving the selection data for holding a logical value indicated by the selection data as output data in synchronization with a controlling clock, and clock control means receiving the selection data, the output data and a reference clock, for comparing the selection data and the output data to output a fixed voltage/the reference clock as the controlling clock on the basis of match/mismatch thereof.

The semiconductor integrated circuit according to the first aspect of the present invention includes a first clock control means for outputting a fixed voltage/a reference clock as a first controlling clock on the basis of match/mismatch of logical values of the first comparison data and the second comparison data, and a second clock control means for outputting a fixed voltage/the reference clock as a second controlling clock on the basis of match/mismatch of logical values of the third comparison data and the fourth comparison data.

Then, the first and second comparison data have the correspondence relation as follows.

When the first comparison data is the input data, the second comparison data is one data of the first internal data, the second internal data and the output data, and when the first comparison data is the inverted input data, then the second comparison data is one data of the first inverted internal data, the second inverted internal data and the inverted output data.

Accordingly, when the logical values of the first and second comparison data match, newly inputted data and the output data held in the first or second data holding means (the first and second internal data) can be regarded as having the same value.

The third and fourth comparison data have the correspondence relation as follows.

When the third comparison data is the input data, the fourth comparison data is one data of the first internal data, the second internal data and the output data, when the third comparison data is the first internal data, then the fourth comparison data is one data of the second internal data and the output data, when the third comparison data is the inverted input data, then the fourth comparison data is one data of the first inverted internal data, the second inverted internal data and the inverted output data, and when the third comparison data is the first inverted internal data, then the fourth comparison data is one data of the second inverted internal data and the inverted output data.

Accordingly, when the logical values of the third and fourth comparison data match, then newly inputted data or the first internal data newly held in the first data holding means and the output data held in the first or second data holding means (the first and second internal data) can be regarded as having the same value.

As a result, the semiconductor integrated circuit according to the first aspect can minimize an increase in power consumption due to charge/discharge of the controlling clock without causing any trouble in operation of the first data holding means by outputting a fixed voltage as the first controlling clock from the first clock control means when the logical values of the first and second comparison data match, and it can minimize an increase in power consumption due to charge/discharge of the second controlling clock without causing any trouble in operation of the second data holding means by outputting a fixed voltage as the second controlling clock from the second clock control means when the logical values of the third and fourth comparison data match.

Furthermore, in the semiconductor integrated circuit according to the second aspect, when the first comparison data is the input data, then the second comparison data is one data of the first internal data and the second internal data, when the third comparison data is the input data, the fourth comparison data is one data of the first internal data and the second internal data, and when the third comparison data is the first internal data, then the fourth comparison data is the second internal data, so that the output data corresponds to none of the first to fourth comparison data.

As a result, since the semiconductor integrated circuit of the second aspect can minimize the load put on the first output terminal, it can perform data transfer of the output data at high speed with a minimized propagation delay time even if the fan-out of the first output terminal is large in the relation with the outside.

Furthermore, in the semiconductor integrated circuit according to the third aspect, when the first comparison data is the inverted input data, then the second comparison data is one data of the first inverted internal data and the inverted output data, when the third comparison data is the inverted input data, then the fourth comparison data is one data of the first inverted internal data and the inverted output data, and when the third comparison data is the first inverted internal data, then the fourth comparison data is the inverted output data, where the output data and the second inverted internal data correspond to none of the first to fourth comparison data.

As a result, the semiconductor integrated circuit according to the third aspect can minimize the load put on the input/output of the first external data output means, so that data transfer of the output data can be achieved at still higher speed by minimizing a propagation delay time even if the first output terminal has large fan-out.

In the semiconductor integrated circuit according to the fourth aspect, when the first comparison data is the inverted input data, then the second comparison data is one data of the first inverted internal data and the second inverted internal data, when the third comparison data is the inverted input data, then the fourth comparison data is one data of the first inverted internal data and the second inverted internal data, and when the third comparison data is the first inverted internal data, then the fourth comparison data is the second inverted internal data, so that the inverted output data corresponds to none of the first to fourth comparison data.

As a result, the semiconductor integrated circuit according to the fourth aspect can minimize the load put on the second output terminal, and therefore it can perform data transfer of the inverted output data at high speed by minimizing a propagation delay time even if the fan-out of the second output terminal is large in the relation to the external.

Furthermore, in the semiconductor integrated circuit according to the fifth aspect, when the first comparison data is the input data, then the second comparison data is one data of the first internal data and the output data, when the third comparison data is the input data, then the fourth comparison data is one data of the first internal data and the output data, and when the third comparison data is the first internal data, then the fourth comparison data is the output data, so that the inverted output data and the second internal data correspond to none of the first to fourth comparison data.

As a result, in the semiconductor integrated circuit of the fifth aspect, as the load put on the input/output of the second external data output means can be minimized, data transfer of the output data can be made at still higher speed by minimizing a propagation delay time even if the second output terminal has large fan-out.

In the semiconductor integrated circuit according to the sixth aspect, as the first comparison data is the inverted input data and the third comparison data is one data of the first internal data, the inverted input data and the first inverted internal data, so that the input data corresponds to none of the first to fourth comparison data.

As a result, the semiconductor integrated circuit according to the sixth aspect can minimize load on the input terminal, and it can perform data transfer of the input data at high speed by minimizing a propagation delay time even if the input terminal has large fan-in in the relation to the external.

Furthermore, in the semiconductor integrated circuit according to the seventh aspect, when the first comparison data is the input data, the second comparison data is one data of the first internal data and the second internal data, when the first comparison data is the inverted input data, then the second comparison data is one data of the first inverted internal data and the second inverted internal data, when the third comparison data is the input data, then the fourth comparison data is one data of the first internal data and the second internal data, when the third comparison data is the first internal data, the fourth comparison data is the second inverted internal data, when the third comparison data is the inverted input data, then the fourth comparison data is one data of the first inverted internal data and the second inverted internal data, and when the third comparison data is the first inverted internal data, then the fourth comparison data is the second inverted internal data, so that the output data and the inverted output data correspond to none of the first to fourth comparison data.

As a result, the semiconductor integrated circuit according to the seventh aspect can minimize load put on the first and second output terminals, and therefore it can perform data transfer of the output data and the inverted output data at high speed with a minimized propagation delay time even if the first and second output terminals have large fan-out in the relation to the exterior.

Moreover, as an equal load is provided on the first and second output terminals, when the first and second output terminals have equal fan-out in the relation to the external, a signal propagation delay can be eliminated between the output data and the inverted output data.

In the semiconductor integrated circuit according to the eighth aspect, when the first comparison data is the input data, then the second comparison data is the output data, the third comparison data is one data of the inverted input data and the first inverted internal data, and the fourth comparison data is the inverted output data, and when the first comparison data is the inverted input data, then the second comparison data is the inverted output data, the third comparison data is one data of the input data and the first internal data, and the fourth comparison data is the output data, so that one of the second comparison data and the fourth comparison data is the output data and the other is the inverted output data.

As a result, the semiconductor integrated circuit according to the eighth aspect can put an equal load on the first and second output terminals to prevent a signal propagation delay between the output data and the inverted output data when the first and second output terminals have equal fan-out in the relation with the external.

The clock control means of the semiconductor integrated circuit according to the ninth aspect of the present invention includes a first AND gate receiving the first and second comparison data for obtaining AND of the first comparison data and the second comparison data to output first logical data, a second AND gate receiving the third and fourth comparison data for obtaining AND of the third comparison data and the fourth comparison data to output second logical data, an OR gate for obtaining OR of the first and second logical data to output third logical data, and a clock control gate for outputting a reference clock/a fixed voltage as a controlling clock on the basis of "H"/"L" of the third logical data, which minimizes the number of transistors for constituting the clock control means.

As a result, a semiconductor integrated circuit with increased degree of integration can be obtained.

The semiconductor integrated circuit according to the tenth aspect of the present invention includes first to n-th comparing means respectively receiving first to n-th input data and first to n-th output data, for respectively comparing the first to n-th input data and the first to n-th output data to respectively output first to n-th comparison signals indicating match/mismatch, and clock control means receiving the first to n-th comparison signals, for outputting a fixed voltage as a controlling clock only when all the first to n-th comparison signals indicate match, and otherwise outputting a reference clock as a controlling clock.

Accordingly, when all the first to n-th comparison signals indicate match, all newly inputted first to n-th input data and the first to n-th output data held respectively in the first to n-th data holding means can be regarded as having the same value.

As a result, the semiconductor integrated circuit according to the tenth aspect outputs a fixed voltage as a controlling clock from the clock control means when all the first through n-th comparison signals indicate match to minimize an increase in power consumption due to charge/discharge of the controlling clock without causing any trouble in operation of the first through n-th data holding means.

The clock control means of the semiconductor integrated circuit according to the eleventh aspect of the present invention compares selection data and output data and outputs a fixed voltage/a reference clock as a controlling clock on the basis of its match/mismatch, the controlling clock can therefore be fixed when newly inputted selection data and output data held in the data holding means are the same.

As a result, the semiconductor integrated circuit according to the eleventh aspect can minimize an increase in power consumption due to charge/discharge of the controlling clock without disturbing operation of the data holding means.

Furthermore, as the input data selecting means outputs one data of input data and scan input data as selection data on the basis of the selection signal, selecting the scan input data as selection data enables a scan test to be executed with low power consumption.

The present invention has been made to solve such problems as discussed above, and it is an object of the present invention to obtain a semiconductor integrated circuit with reduced power consumption without reducing the operating speed.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First to Sixtieth Preferred Embodiments>><Entire Structure>

Figure 1:
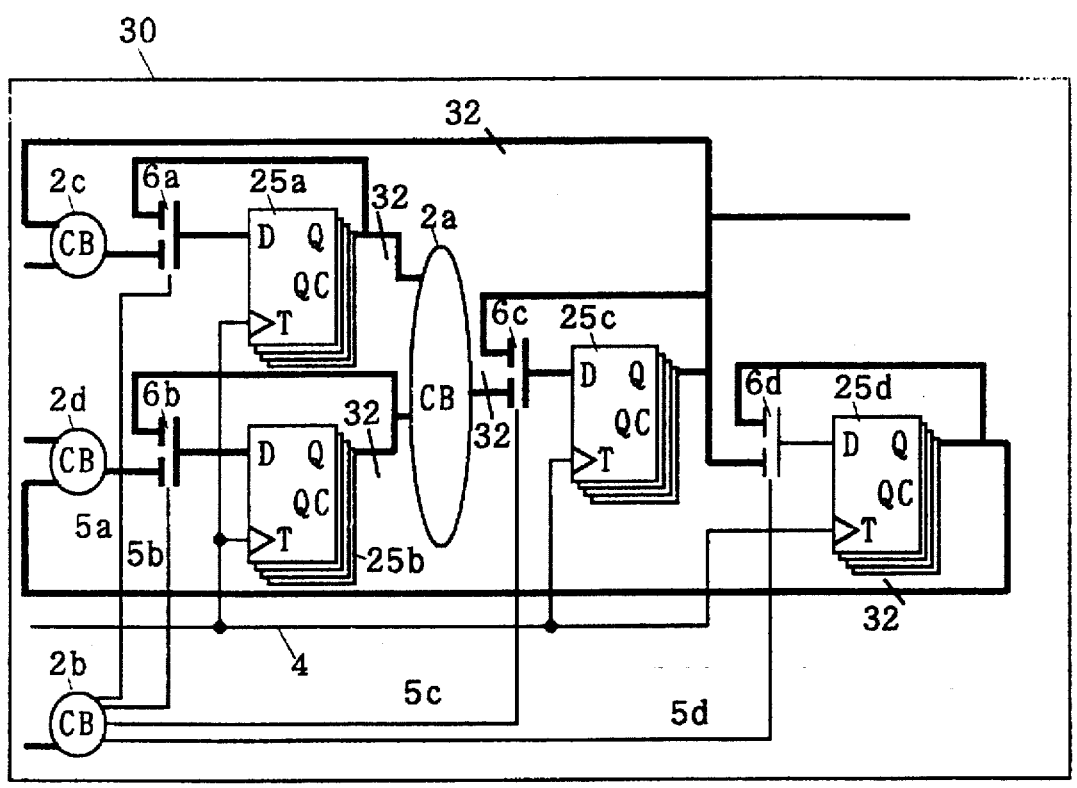
FIG. 1 is a descriptive diagram showing the entire structure of first to sixtieth preferred embodiments of the present invention.

FIG. 1 is a descriptive diagram showing the entire structure of a preferred embodiment of the present invention. As shown in the figure, the semiconductor integrated circuit 30 includes FF's 25a–25d, combinational circuits (CB) 2a–1d and input signal selecting circuits 6a–6d. The respective FF's 25a–25d exist in parallel for 32 bits, respectively, and perform data processing of 32 bits with the combinational circuits or the external of the semiconductor integrated circuit 30. The clock signal line 4 is provided in common to the clock inputs T of the FF's 25a–25d. Accordingly, 32×4= 128 FF's exist in the semiconductor integrated circuit 30 and the clock signal line 4 is provided with gate capacitance for 128 FF's together with the wire capacitance. All the FF's are always supplied with clock, and signal selecting operation of the input signal selecting circuits 6a–6d performed under control by the control signals 5a–5d generated by the FF controlling combinational circuit 2b controls whether data from previous stage circuit blocks or FF's are to be written, or data already held are to be rewritten.

<Basic Structure of FF>

Figure 2:
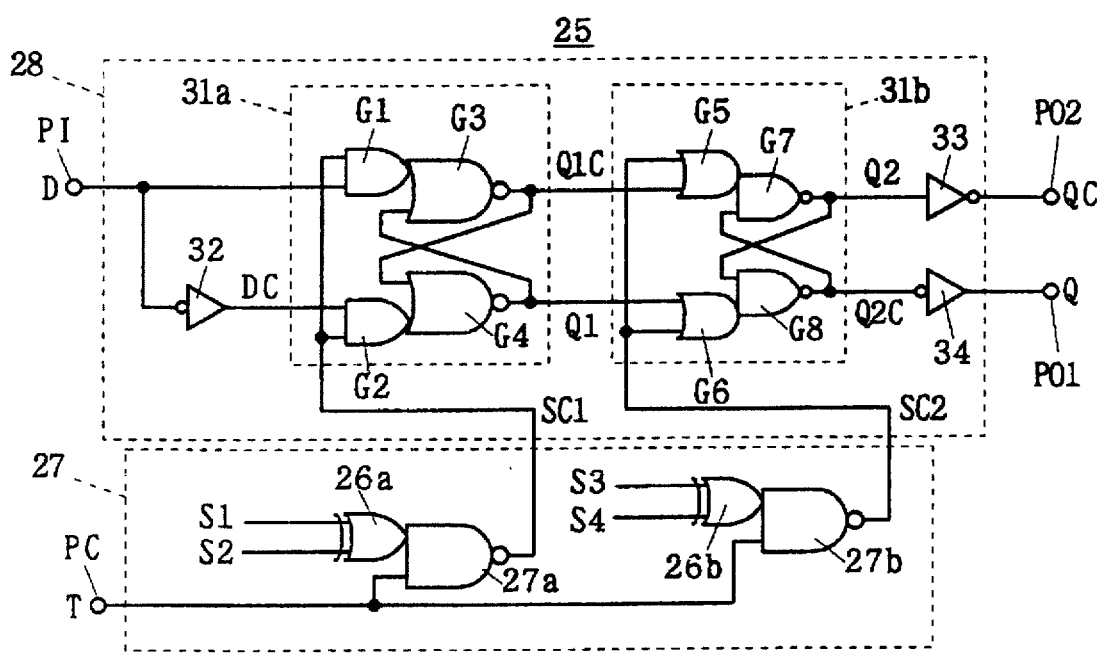
FIG. 2 is a circuit diagram showing a basic structure of the first through sixtieth preferred embodiments of the present invention.

FIG. 2 is a circuit diagram showing the structure of one unit (1 bit) of the FF 25 (25a–25d). As shown in the figure, the FF 25 includes clock input control means 27 and data holding means 28. It has as its external input/output terminals an input terminal PI receiving input data D, a clock input terminal PC receiving reference clock T, an output terminal PO1 outputting output data Q and an output terminal PO2 outputting inverted output data QC.

The data holding means 28 includes data holding portions 31a and 31b, and inverters 32–34. The inverter 32 receives the input data D and outputs inverted input data DC obtained by logically inverting the input data D.

The data holding portion 31a includes AND gates G1 and G2 and NOR gates G3 and G4, where the AND gate G1 receives the input data D and a control signal SC1, the AND gate G2 receives the inverted input data DC and the control signal SC1, the NOR gate G3 receives the output of the AND gate G1 and the output of the NOR gate G4, and the NOR gate G4 receives the output of the AND gate G2 and the output of the NOR gate G3. The output of the NOR gate G3 is provided as inverted internal data Q1C and the output of the NOR gate G4 is provided as internal data Q1.

When the control signal SC1 is "H", the data holding portion 31a with such structure holds the same logical value as the input data D as the internal data Q1 and holds a logical value opposite to the input data D (the logical value of the inverted input data DC) as the inverted interval data Q1C. When the control signal SC1 is "L", it maintains the current internal data Q1 and inverted internal data Q1C without regard to the input data D and the inverted input data DC.

The data holding portion 31b includes OR gates G5 and G6 and NAND gates G7 and G8, where the OR gate G5 receives the inverted internal data Q1C and a control signal SC2 and the OR gate G6 receives the internal data Q1 and the control signal SC2. The NAND gate G7 receives the output of the OR gate G5 and the output of the NAND gate G8, and the NAND gate G8 receives the output of the OR gate G6 and the output of the NAND gate G7. The output of the NOR gate G7 becomes internal data Q2 and the output of the NAND gate G8 becomes inverted internal data Q2C.

When the control signal SC2 is "L", the data holding portion 31b with such structure holds the same logical value as the internal data Q1 as the internal data Q2 and holds the logical value opposite to the internal data Q1 (the logical value of the inverted internal data Q1C) as the inverted internal data Q2C. When the control signal SC2 is "H", it maintains the current internal data Q2 and inverted internal data Q2C independently of the internal data Q1 and the inverted internal data Q1C.

The inverter 33 receives the internal data Q2 which is an output of the NAND gate G7 and outputs the inverted output data QC obtained by logically inverting its value from the output terminal PO2. The inverter 34 receives the inverted internal data Q2C which is an output of the NAND gate G8 and outputs the output data Q obtained by logically inverting its value from the output terminal PO1.

The clock input control means 27 includes exclusive OR gates 26a and 26b and NAND gates 27a and 27b. The exclusive OR gate 26a receives comparison data S1 and comparison data S2, the NAND gate 27a receives the output of the exclusive OR gate 26a and the reference clock T to provide its output, the control signal SC1, to the AND gate G1 and the AND gate G2. The exclusive OR gate 26b receives comparison data S3 and comparison data S4 and the NAND gate 27b receives the output of the exclusive OR gate 26b and the reference clock T to provide its output, the control signal SC2, to the OR gate G5 and the OR gate G6.

<Comparison Data S1–S4>

Candidates for the comparison data S1 of the exclusive OR gate 26a include the input data D and the inverted input data DC. Candidates for the comparison data S2 include the internal data Q1, the internal data Q2, the output data Q, the inverted internal data Q1C, the inverted internal data Q2C and the inverted output data QC.

Referring to Table 1 which shows the correspondence relation between the comparison data S1 and the comparison data S2, if the comparison data S1 is the input data D, the comparison data S2 is one data of the internal data Q1, the internal data Q2 and the output data Q, and if the comparison data S1 is the inverted input data DC, the comparison data S2 is one data of the inverted internal data Q1C, the inverted internal data Q2C and the inverted output data QC.

TABLE 1

| Comparison Data | |
|---|---|
| S1 | S2 |
| D | Q1 |
|   | Q2 |
|   | Q |
| DC | Q1C |
|   | Q2C |
|   | QC |

Candidates for the comparison data S3 of the exclusive OR gate 26b include the input data D, the internal data Q1, the inverted input data DC and the inverted internal data Q1C. Candidates for the comparison data S4 include the internal data Q1, the internal data Q2, the output data Q, the inverted internal data Q1C, the inverted internal data Q2C and the inverted output data QC.

Referring to Table 2 showing the correspondence relation between the comparison data S3 and the comparison data S4, when the comparison data S3 is the input data D, the comparison data S4 is one data of the internal data Q1, the internal data Q2 and the output data Q, and when the comparison data S3 is the internal data Q1, the comparison data S4 is one data of the internal data Q2 and the output data Q. If the comparison data S3 is the inverted input data DC, the comparison data S4 is then one data of the inverted internal data Q1C, the inverted internal data Q2C and the inverted output data QC, and when the comparison data S3 is the inverted internal data Q1C, then the comparison data S4 is one data of the inverted internal data Q2C and the inverted output data QC.

TABLE 2

| Comparison Data | |
|---|---|
| S3 | S4 |
| D | Q1 |
|   | Q2 |
|   | Q |
| Q1 | Q2 |
|   | Q |
| DC | Q1C |
|   | Q2C |
|   | QC |
| Q1C | Q2C |
|   | QC |

Accordingly, when the logical value of the comparison data S1 agrees with the logical value of the comparison data S2, it is considered that newly inputted input data D and the output data Q held in the data holding portion 31a or 31b (the internal data Q1, the internal data Q2) have the same value, and there is no need of writing the input data D into the data holding portion 31a, then the output of the exclusive OR gate 26a goes "L" to fix the control signal SC1 to "H" and the reference clock T is made invalid.

If the comparison data S1 and the comparison data S2 do not agree, it is considered that the newly inputted input data D and the output data Q held in the data holding portion 31a or 31b (the internal data Q1, the internal data Q2) have different values, and the input data D must be written into the data holding portion 31a, and then the output of the exclusive OR gate 26a goes "H" so that the reference clock T is provided unchanged as the control signal SC1 and data writing operation of the input data D is performed by the data holding portion 31a in synchronization with the control signal SC1 (the reference clock T).

Similarly, when the logical values of the comparison data S3 and the comparison data S4 match, it is considered that the newly inputted input data D or the internal data Q1 newly held in the data holding portion 31a and the output data Q held in the data holding portion 31a or 31b (the internal data Q1, the internal data Q2) have the same value, and it is not necessary to write the internal data Q1 into the data holding portion 31b, and then the output of the exclusive OR gate 26a goes "L" so that the control signal SC1 is fixed to "H" and the reference clock T is made invalid.

If the logical values of the comparison data S3 and the comparison data S4 do not match, it is considered that the newly inputted input data D or the internal data Q1 newly held in the data holding portion 31a and the output data Q held in the data holding portion 31a or 31b (the internal data Q1, the internal data Q2) have different values, then the internal data Q1 must be written into the data holding portion 31b, and the output of the exclusive OR gate 26a attains "H" and the reference clock T unchanged (actually an inverted value of the reference clock T) is provided as the control signal SC2 and the data holding portion 31b is caused to perform data writing operation of the input data D in synchronization with the control signal SC2 (the reference clock T).

This way, the semiconductor integrated circuit 30 provides the reference clock T as the control signals SC1 and SC2 only when data writing operation by each of the data holding portion 31a and the data holding portion 31b is necessary, and when there is no need of writing, it makes the reference clock T invalid and provides a fixed voltage as the control signals SC1 and SC2. Accordingly, the semiconductor integrated circuit 30 has a low power consumption effect in which the reference clock T is charged/discharged only for the wire capacitance of the clock signal line 4 and gate capacitance of transistors serving as input stages of the NAND gates 27a and 27b of each FF 25 when there is no need of writing.

Furthermore, since the respective control signal SC1 and control signal SC2 are independently provided to the data holding portion 31a and the data holding portion 31b, the driving ability can be higher in the case where the control signals SC1 and SC2 are respectively provided as controlling clocks as compared with the case where the reference clock T is provided to the data holding portion 31a and the data holding portion 31b in common, so that it has a high speed operation effect in which the data writing operations by the data holding portions 31a and 31b can be made at high speed.

<First to Seventh Features>

Candidates for the comparison data S1–S4 have been shown in Table 1 and Table 2, and the first to seventh features shown below can be obtained by narrowing down the candidates.

<First Feature>

Candidates for the comparison data S1 of the exclusive OR gate 26a include the input data D and the inverted input data DC. Candidates for the comparison data S2 include the internal data Q1, the internal data Q2, the inverted internal data Q1C, the inverted internal data Q2C and the inverted output data QC.

Table 3 shows the correspondence relation between the comparison data S1 and the comparison data S2, where when the comparison data S1 is the input data D, the comparison data S2 is one data of the internal data Q1 and the internal data Q2, and when the comparison data S1 is the inverted input data DC, the comparison data S2 is one data of the inverted internal data Q1C, the inverted internal data Q2C and the inverted output data QC.

TABLE 3

| Comparison Data | |
|---|---|
| S1 | S2 |
| D | Q1 |
|  | Q2 |
| DC | Q1C |
|  | Q2C |
|  | QC |

Candidates for the comparison data S3 of the exclusive OR gate 26b include the input data D, the internal data Q1, the inverted input data DC and the inverted internal data Q1C. Candidates for the comparison data S4 include the internal data Q1, the internal data Q2, the inverted internal data Q1C, the inverted internal data Q2C and the inverted output data QC.

Table 4 shows the correspondence relation between the comparison data S3 and the comparison data S4, where if the comparison data S3 is the input data D, then the comparison data S4 is one data of the internal data Q1 and the internal data Q2, and if the comparison data S3 is the internal data Q1, then the comparison data S4 is the data of the internal data Q2. If the comparison data S3 is the inverted input data DC, then the comparison data S4 is one data of the inverted internal data Q1C, the inverted internal data Q2C and the inverted output data QC, and if the comparison data S3 is the inverted internal data Q1C, then the comparison data S4 is one data of the inverted internal data Q2C and the inverted output data QC.

TABLE 4

| Comparison Data | |
|---|---|
| S3 | S4 |
| D | Q1 |
|  | Q2 |
| Q1 | Q2 |
| DC | Q1C |
|  | Q2C |
|  | QC |
| Q1C | Q2C |
|  | QC |

The semiconductor integrated circuit having the first feature described above can obtain the low power consumption effect and the high speed operation effect in the same way as the semiconductor integrated circuit with the basic structure.

In addition, in the semiconductor integrated circuit having the first feature, the output data Q corresponds to none of the comparison data S1–S4. Accordingly, load put on the output terminal PO1 can be suppressed to the minimum, and it has the first effect that the output data Q can be transferred at high speed with a minimum propagation delay time even if the output terminal PO1 has large fan-out in the relation with the external.

<Second Feature>

Candidates for the comparison data S1 of the exclusive OR gate 26a include the input data D and the inverted input data DC. Candidates for the comparison data S2 include the internal data Q1, the internal data Q2, the inverted internal data Q1C and the inverted output data QC.

Table 5 shows the correspondence relation between the comparison data S1 and the comparison data S2, where if the comparison data S1 is the input data D, the comparison data S2 is one data of the internal data Q1 and the internal data Q2, and if the comparison data S1 is the inverted input data DC, the comparison data S2 is one data of the inverted internal data Q1C and the inverted output data QC.

TABLE 5

| Comparison Data | |
|---|---|
| S1 | S2 |
| D | Q1 |
|  | Q2 |
| DC | Q1C |
|  | QC |

Candidates for the comparison data S3 of the exclusive OR gate 26b include the input data D, the internal data Q1, the inverted input data DC and the inverted internal data Q1C. Candidates for the comparison data S4 include the internal data Q1, the internal data Q2, the inverted internal data Q1C and the inverted output data QC.

Table 6 shows the correspondence relation between the comparison data S3 and the comparison data S4, where when the comparison data S3 is the input data D, the comparison data S4 is one data of the internal data Q1 and the internal data Q2, and when the comparison data S3 is the internal data Q1, the comparison data S4 is the data of the internal data Q2. When the comparison data S3 is the inverted input data DC, the comparison data S4 is one data of the inverted internal data Q1C and the inverted output data QC, and when the comparison data S3 is the inverted internal data Q1C, the comparison data S4 is the inverted output data QC.

TABLE 6

| Comparison Data | |
|---|---|
| S3 | S4 |
| D | Q1 |
|  | Q2 |
| Q1 | Q2 |
| DC | Q1C |
|  | QC |
| Q1C | QC |

The semiconductor integrated circuit having the second feature can obtain the low power consumption effect and the high speed operation effect similarly to the semiconductor integrated circuit with the basic structure.

Furthermore, in the semiconductor integrated circuit having the second feature, in the same way as the semiconductor integrated circuit having the first feature, the output data Q corresponds to none of the comparison data S1–S4. Accordingly, load on the output terminal PO1 can be minimized, and it has the first effect that the output data Q can be transferred at high speed with a minimized propagation delay time even if the output terminal PO1 has large fan-out in the relation with the exterior.

In addition, in the semiconductor integrated circuit having the second feature, since the inverted internal data Q2C corresponds to none of the comparison data S1–S4, either, load put on the input/output of the inverter 34 can be suppressed to the minimum. As a result, it also has the second effect that data transfer of the output data Q is performed at still higher speed with a minimized propagation delay time even if the output terminal PO1 has large fan-out.

<Third Feature>

Candidates for the comparison data S1 of the exclusive OR gate 26a include the input data D and the inverted input data DC. Candidates for the comparison data S2 include the internal data Q1, the internal data Q2, the output data Q, the inverted internal data Q1C and the inverted internal data Q2C.

Table 7 shows the correspondence relation between the comparison data S1 and the comparison data S2, where if the comparison data S1 is the input data D, the comparison data S2 is one data of the internal data Q1, the internal data Q2 and the output data Q, and if the comparison data S1 is the inverted input data DC, then the comparison data S2 is one data of the inverted internal data Q1C and the inverted internal data Q2C.

TABLE 7

| Comparison Data | |
|---|---|
| S1 | S2 |
| D | Q1 |
|   | Q2 |
|   | Q |
| DC | Q1C |
|   | Q2C |

Candidates for the comparison data S3 of the exclusive OR gate 25b include the input data D, the internal data Q1, the inverted input data DC and the inverted internal data Q1C. Candidates for the comparison data S4 include the internal data Q1, the internal data Q2, the output data Q, the inverted internal data Q1C and the inverted internal data Q2C.

Then Table 8 shows the correspondence relation between the comparison data S3 and the comparison data S4, where if the comparison data S3 is the input data D, the comparison data S4 is one data of the internal data Q1, the internal data Q2 and the output data Q, and if the comparison data S3 is the internal data Q1, the comparison data S4 is one data of the internal data Q2 and the output data Q. If the comparison data S3 is the inverted input data DC, then the comparison data S4 is one data of the inverted internal data Q1C and the inverted internal data Q2C, and if the comparison data S3 is the inverted internal data Q1C, the comparison data S4 is data of the inverted internal data Q2C.

TABLE 8

| Comparison Data | |
|---|---|
| S3 | S4 |
| D | Q1 |
|   | Q2 |
|   | Q |
| Q1 | Q2 |
|   | Q |
| DC | Q1C |
|   | Q2C |
| Q1C | Q2C |

The semiconductor integrated circuit having the above-described third feature can obtain the low power consumption effect and the high speed operation effect in the same way as the semiconductor integrated circuit with the basic structure.

In addition, in the semiconductor integrated circuit having the third feature, the inverted output data QC corresponds to none of the comparison data S1–S4. Accordingly, load put on the output terminal PO2 can be minimized, and it has the third effect that the data transfer of the inverted output data QC can be achieved at high speed with a minimized propagation delay time even if the output terminal PO2 has large fan-out in the relation to the external.

<Fourth Feature>

Candidates for the comparison data S1 of the exclusive OR gate 26a include the input data D and the inverted input data DC. Candidates for the comparison data S2 include the internal data Q1, the output data Q, the inverted internal data Q1C and the inverted internal data Q2C.

Then, Table 9 shows the correspondence relation between the comparison data S1 and the comparison data S2, where when the comparison data S1 is the input data D, then the comparison data S2 is one data of the internal data Q1 and the output data Q, and when the comparison data S1 is the inverted input data DC, then the comparison data S2 is one data of the inverted internal data Q1C and the inverted internal data Q2C.

TABLE 9

| Comparison Data | |
|---|---|
| S1 | S2 |
| D | Q1 |
|   | Q |
| DC | Q1C |
|   | Q2C |

Candidates for the comparison data S3 of the exclusive OR gate 26b include the input data D, the internal data Q1, the inverted input data DC and the inverted internal data Q1C. Candidates for the comparison data S4 include the internal data Q1, the output data Q, the inverted internal data Q1C and the inverted internal data Q2C.

Table 10 shows the correspondence relation between the comparison data S3 and the comparison data S4, where when the comparison data S3 is the input data D, the comparison data S4 is one data of the internal data Q1 and the output data Q, and when the comparison data S3 is the internal data Q1, then the comparison data S4 is the output data Q. When the comparison data S3 is the inverted input data DC, then the comparison data S4 is one data of the inverted internal data Q1C and the inverted internal data Q2C, and when the comparison data S3 is the inverted internal data Q1C, then the comparison data S4 is data of the inverted internal data Q2C.

TABLE 10

| Comparison Data | |
|---|---|
| S3 | S4 |
| D | Q1 |
|  | Q |
| Q1 | Q |
| DC | Q1C |
|  | Q2C |
| Q1C | Q2C |

The semiconductor integrated circuit having the fourth feature can obtain the low power consumption effect and the high speed operation effect in the same way as the semiconductor integrated circuit with the basic structure.

Furthermore, in the semiconductor integrated circuit having the fourth feature, in the same way as the semiconductor integrated circuit having the third feature, the inverted output data QC corresponds to none of the comparison data S1–S4. Accordingly, the load on the output terminal PO2 can be suppressed to the minimum and the third effect can be obtained in which the inverted output data QC can be transferred at high speed with a minimized propagation delay time even if the output terminal PO2 has large fan-out in the relation with the external.

In addition, in the semiconductor integrated circuit having the fourth feature, the internal data Q2 corresponds to none of the comparison data S1–S4, either, so that the load put on the input/output of the inverter 33 can be suppressed to the minimum. As a result, the fourth effect is also obtained in which the inverted output data QC can be transferred at still higher speed with a minimized propagation delay time even if the output terminal PO2 has large fan-out.

<Fifth Feature>

The candidate for the comparison data S1 of the exclusive OR gate 26a includes the inverted input data DC. Candidates for the comparison data S2 include the inverted internal data Q1C, the inverted internal data Q2C and the inverted output data QC.

Table 11 shows the correspondence relation between the comparison data S1 and the comparison data S2, where if the comparison data S1 is the inverted input data DC, then the comparison data S2 is one data of the inverted internal data Q1C, the inverted internal data Q2C and the inverted output data QC.

TABLE 11

| Comparison Data | |
|---|---|
| S1 | S2 |
| DC | Q1C |
|  | Q2C |
|  | QC |

Candidates for the comparison data S3 of the exclusive OR gate 26b include the internal data Q1, the inverted input data DC and the inverted internal data Q1C. Candidates for the comparison data S4 include the internal data Q2, the output data Q, the inverted internal data Q1C, the inverted internal data Q2C and the inverted output data QC.

Then, Table 12 shows the correspondence relation between the comparison data S3 and the comparison data S4, where when the comparison data S3 is the internal data Q1, the comparison data S4 is one data of the internal data Q2 and the output data Q. When the comparison data S3 is the inverted input data DC, then the comparison data S4 is one data of the inverted internal data Q1C, the inverted internal data Q2C and the inverted output data QC, and when the comparison data S3 is the inverted internal data Q1C, then the comparison data S4 is one data of the inverted internal data Q2C and the inverted output data QC.

TABLE 12

| Comparison Data | |
|---|---|
| S3 | S4 |
| Q1 | Q2 |
|  | Q |
| DC | Q1C |
|  | Q2C |
|  | QC |
| Q1C | Q2C |
|  | QC |

The semiconductor integrated circuit having the fifth feature can obtain the low power consumption effect and the high speed operation effect in the same way as the semiconductor integrated circuit with the basic structure.

In addition, in the semiconductor integrated circuit having the fifth feature, the input data D corresponds to none of the comparison data S1–S4. Accordingly, the load on the input terminal PI can be suppressed to the minimum, and the fifth effect can be obtained in which data transfer of the input data D can be achieved at high speed with a minimized propagation delay time even if the input terminal PI has large fan-in in the relation with the outside.

<Sixth Feature>

Candidates for the comparison data S1 of the exclusive OR gate 26a include the input data D and the inverted input data DC. Candidates for the comparison data S2 include the internal data Q1, the internal data Q2, the inverted internal data Q1C and the inverted internal data Q2C.

Table 13 shows the correspondence relation between the comparison data S1 and the comparison data S2, where when the comparison data S1 is the input data D, then the comparison data S2 is one data of the internal data Q1 and the internal data Q2, and when the comparison data S1 is the inverted input data DC, then the comparison data S2 is one data of the inverted internal data Q1C and the inverted internal data Q2C.

TABLE 13

| Comparison Data | |
|---|---|
| S1 | S2 |
| D | Q1 |
|  | Q2 |
| DC | Q1C |
|  | Q2C |

Candidates for the comparison data S3 of the exclusive OR gate 26b include the input data D, the internal data Q1, the inverted input data DC and the inverted internal data Q1C. Candidates for the comparison data S4 include the internal data Q1, the internal data Q2, the inverted internal data Q1C and the inverted internal data Q2C.

Table 14 shows the correspondence relation between the comparison data S3 and the comparison data S4, where when the comparison data S3 is the input data D, then the comparison data S4 is one data of the internal data Q1 and the internal data Q2, and when the comparison data S3 is the internal data Q1, then the comparison data S4 is data of the internal data Q2. When the comparison data S3 is the inverted input data DC, then the comparison data S4 is one data of the inverted internal data Q1C and the inverted internal data Q2C, and when the comparison data S3 is the inverted internal data Q1C, then the comparison data S4 is the inverted internal data Q2C.

TABLE 14

| Comparison Data | |
|---|---|
| S3 | S4 |
| D | Q1 |
|  | Q2 |
| Q1 | Q2 |
| DC | Q1C |
|  | Q2C |
| Q1C | Q2C |

The semiconductor integrated circuit having the sixth feature can obtain the low power consumption effect and the high speed operation effect, in the same way as the semiconductor integrated circuit with the basic structure.

In addition, in the semiconductor integrated circuit having the sixth feature, the output data Q and the inverted output data QC correspond to none of the comparison data S1–S4. Accordingly, the load put on the output terminal PO1 and the output terminal PO2 can be minimized, and it has the sixth effect that the output data Q and the inverted output data QC can be transferred at high speed with a minimized propagation delay time even if the fan-outs of the output terminal PO1 and the output terminal PO2 are large in the relation with the external.

Furthermore, as equal load is provided on the output terminal PO1 and the output terminal PO2, the seventh effect can also be produced that a signal propagation delay will not occur between the output data Q and the inverted output data QC when the fan-outs of the output terminal PO1 and the output terminal PO2 are equal in the relation to the external.

<Seventh Feature>

Candidates for the comparison data S1 of the exclusive OR gate 26a include the input data D and the inverted input data DC, candidates for the comparison data S2 include the output data Q and the inverted output data QC, candidates for the comparison data S3 include the input data D, the internal data Q1, the inverted input data DC, and the internal data Q1, and candidates for the comparison data S4 include the output data Q and the inverted output data QC.

Then, in the correspondence relation among the comparison data S1–S4, as shown in Table 15, when the comparison data S1 is the input data D, then the comparison data S2 is the output data Q, the comparison data S3 is one data of the inverted input data DC and the inverted internal data Q1C, and the comparison data S4 is the inverted output data QC.

When the comparison data S1 is the inverted input data DC, then the comparison data S2 is the inverted output data QC, the comparison data S3 is one data of the input data D and the internal data Q1, and the comparison data S4 is the output data Q.

TABLE 15

| Comparison Data | | | |
|---|---|---|---|
| S1 | S2 | S3 | S4 |
| D | Q | DC | QC |
|  |  | Q1C |  |
| DC | QC | D | Q |
|  |  | Q1 |  |

The semiconductor integrated circuit having the seventh feature can obtain the low power consumption effect and the high speed operation effect, in the same way as the semiconductor integrated circuit with the basic structure.

In addition, in the semiconductor integrated circuit having the seventh feature, one of the comparison data S2 and the comparison data S4 is always the output data Q and the other is the inverted output data QC, and therefore equal load can be provided on the output terminal PO1 and the output terminal PO2, and if the output terminal PO1 and the output terminal PO2 have equal fan-out in the relation to the external, the seventh effect is produced in which a signal propagation delay will not be caused between the output data Q and the inverted output data QC.

<First Preferred Embodiment>

Figure 3:
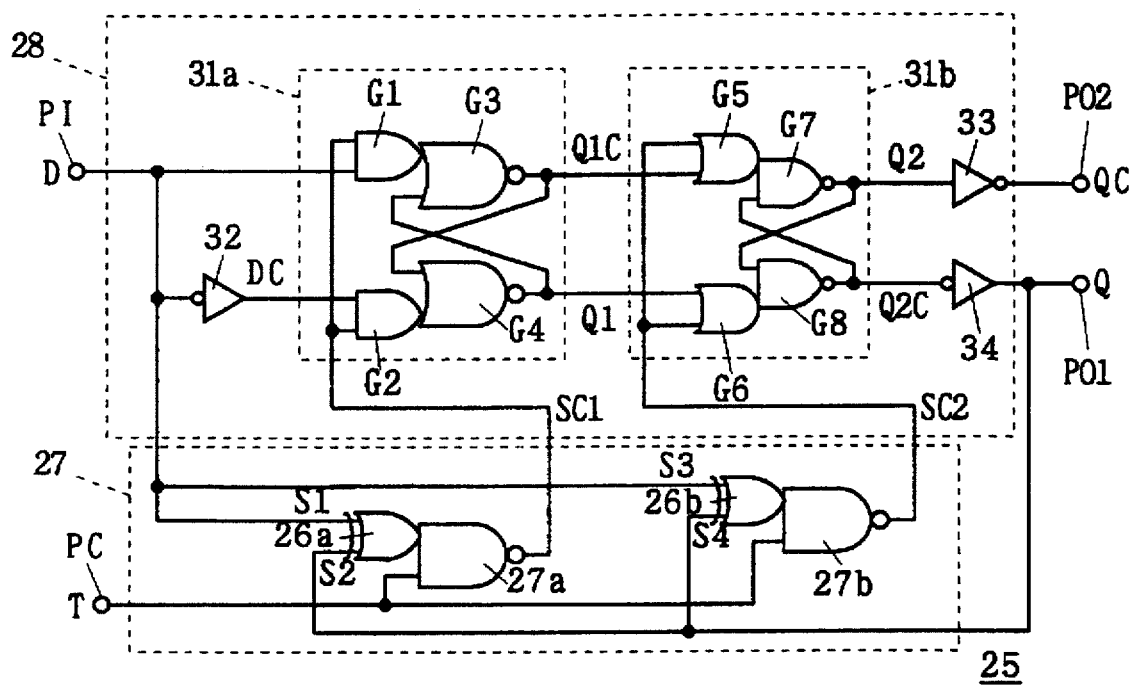
FIG. 3 is a circuit diagram showing the structure of the first preferred embodiment of the present invention.

FIG. 3 is a circuit diagram showing one unit structure of the FF 25 according to a first preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D

Comparison data S2 . . . Output data Q

Comparison data S3 . . . Input data D

Comparison data S4 . . . Output data Q

The correspondence relation among the comparison data S1–S4 in the first preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Second Preferred Embodiment>

Figure 4:
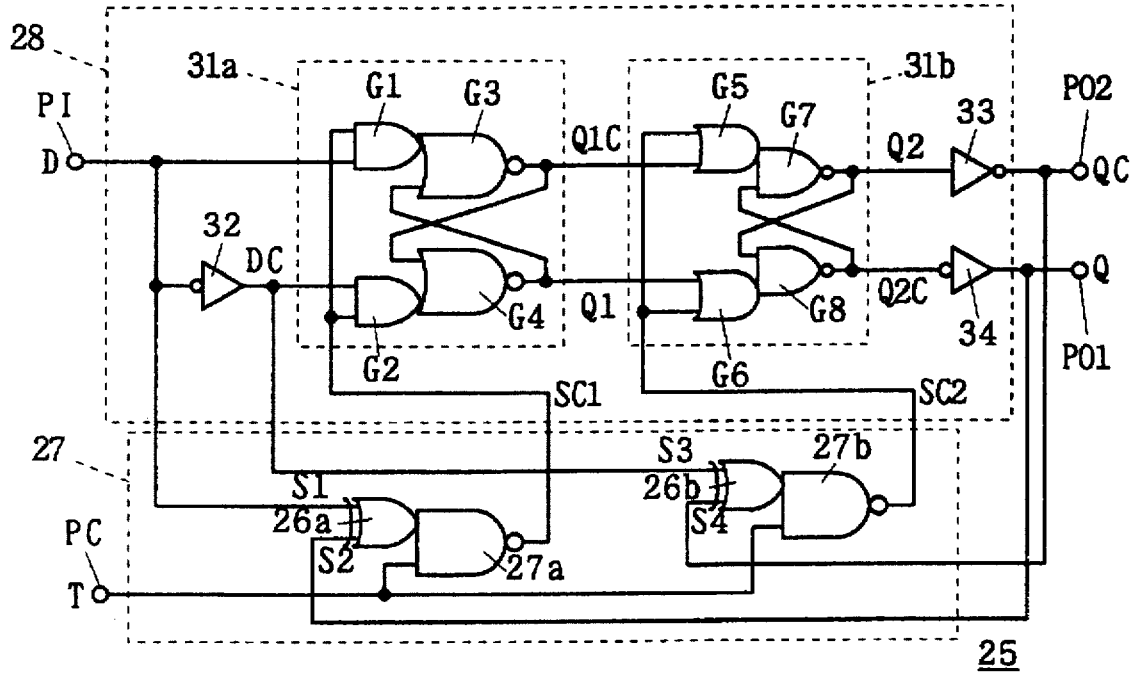
FIG. 4 is a circuit diagram showing the structure of the second preferred embodiment of the present invention.

FIG. 4 is a circuit diagram showing one unit structure of the FF 25 according to a second preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D

Comparison data S2 . . . Output data Q

Comparison data S3 . . . Inverted input data DC

Comparison data S4 . . . Inverted output data QC

The correspondence relation among the comparison data S1–S4 in the second preferred embodiment corresponds to

[Table 15], and it has the seventh feature. Accordingly, since one of the comparison data S2 and the comparison data S4 is always the output data Q and the other is the inverted output data QC, equal loads can be provided on the output terminal PO1 and the output terminal PO2. As a result, in addition to the low power consumption effect and the high speed operation effect of the basic structure, it has the seventh effect of eliminating a signal propagation delay between the output data Q and the inverted output data QC when the output terminal PO1 and the output terminal PO2 have equal fan-out in the relation with the external.

<Third Preferred Embodiment>

Figure 5:
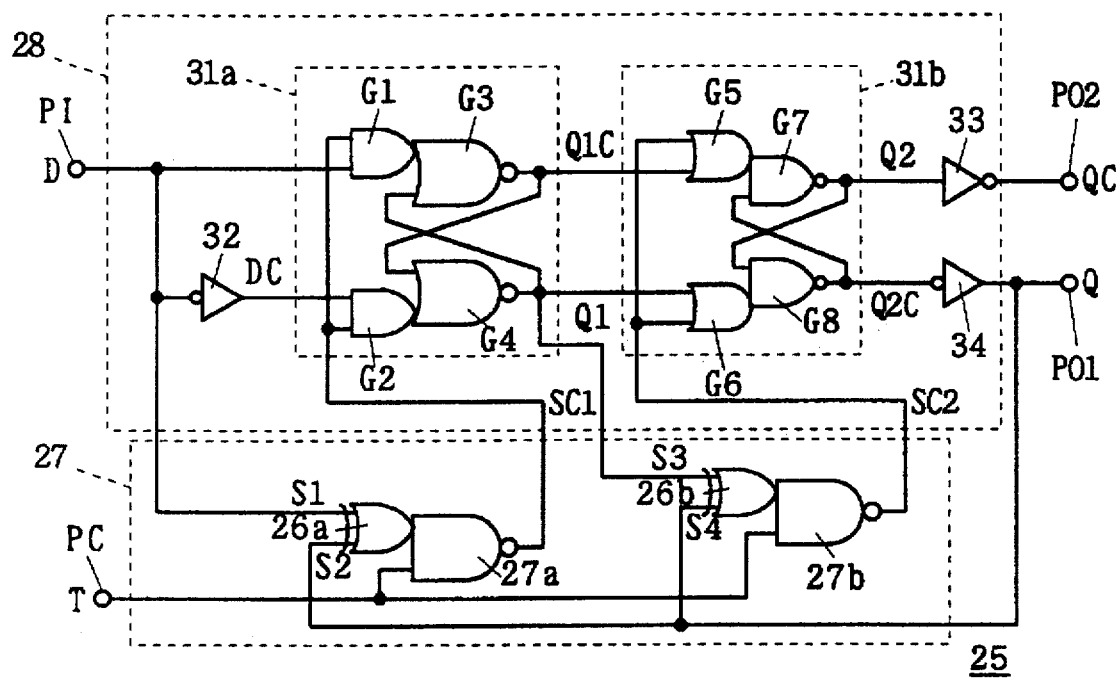
FIG. 5 is a circuit diagram showing the structure of the third preferred embodiment of the present invention.

FIG. 5 is a circuit diagram showing one unit structure of the FF 25 according to a third preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Output data Q
Comparison data S3 . . . Internal data Q1
Comparison data S4 . . . Output data Q The correspondence relation among the comparison data S1–S4 in the third preferred embodiment corresponds to [Table 9, Table 10], and it has the fourth feature. Accordingly, since the inverted output data QC and the internal data Q2 correspond to none of the comparison data S1–S4, the load on the output terminal PO2 can be minimized and the load on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Fourth Preferred Embodiment>

Figure 6:
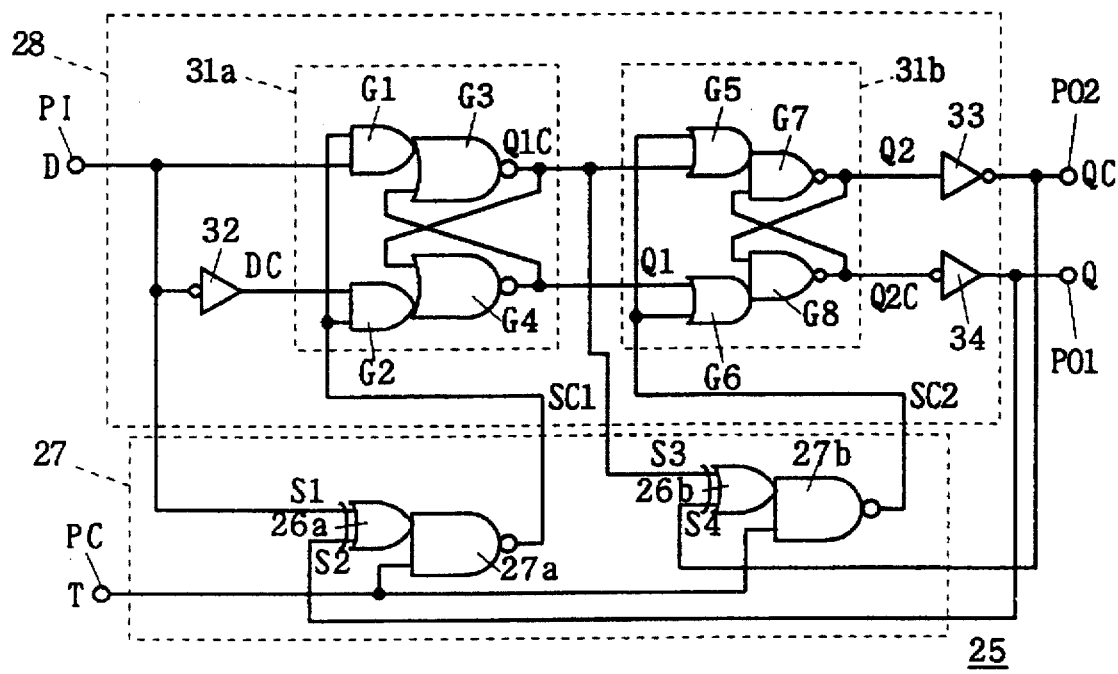
FIG. 6 is a circuit diagram showing the structure of the fourth preferred embodiment of the present invention.

FIG. 6 is a circuit diagram showing one unit structure of the FF 25 according to a fourth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Output data Q
Comparison data S3 . . . Inverted internal data Q1C
Comparison data S4 . . . Inverted output data QC The correspondence relation among the comparison data S1–S4 in the fourth preferred embodiment corresponds to [Table 15], and it has the seventh feature. Accordingly, since one of the comparison data S2 and the comparison data S4 is always the output data Q and the other is the inverted output data QC, equal loads can be provided on the output terminal PO1 and the output terminal PO2. As a result, in addition to the low power consumption effect and the high speed operation effect of the basic structure, it has the seventh effect of eliminating a signal propagation delay between the output data Q and the inverted output data QC when the output terminal PO1 and the output terminal PO2 have equal fan-out in the relation with the external.

<Fifth Preferred Embodiment>

Figure 7:
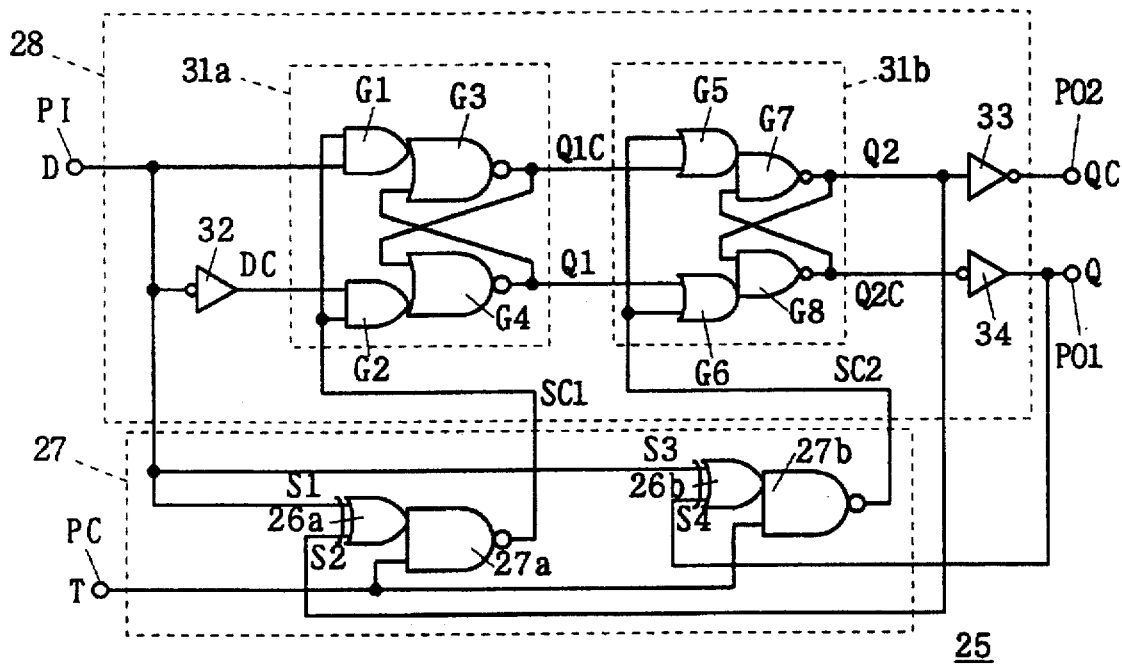
FIG. 7 is a circuit diagram showing the structure of the fifth preferred embodiment of the present invention.

FIG. 7 is a circuit diagram showing one unit structure of the FF 25 according to a fifth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . internal data Q2
Comparison data S3 . . . Input data D
Comparison data S4 . . . Output data Q The correspondence relation among the comparison data S1–S4 in the fifth preferred embodiment corresponds to [Table 7, Table 8], and it has the third feature. Accordingly, since the inverted output data QC and the internal data Q2 correspond to none of the comparison data S1–S4, the load on the output terminal PO2 can be minimized and the load on the input/output of the inverter 33 can also be minimized. As a result, in addition to the low power consumption effect and the high speed operation effect of the basic structure, it has the third effect of transferring the inverted output data Q at high speed with a minimized propagation delay time even if the output terminal PO2 has large fan-out.

<Sixth Preferred Embodiment>

Figure 8:
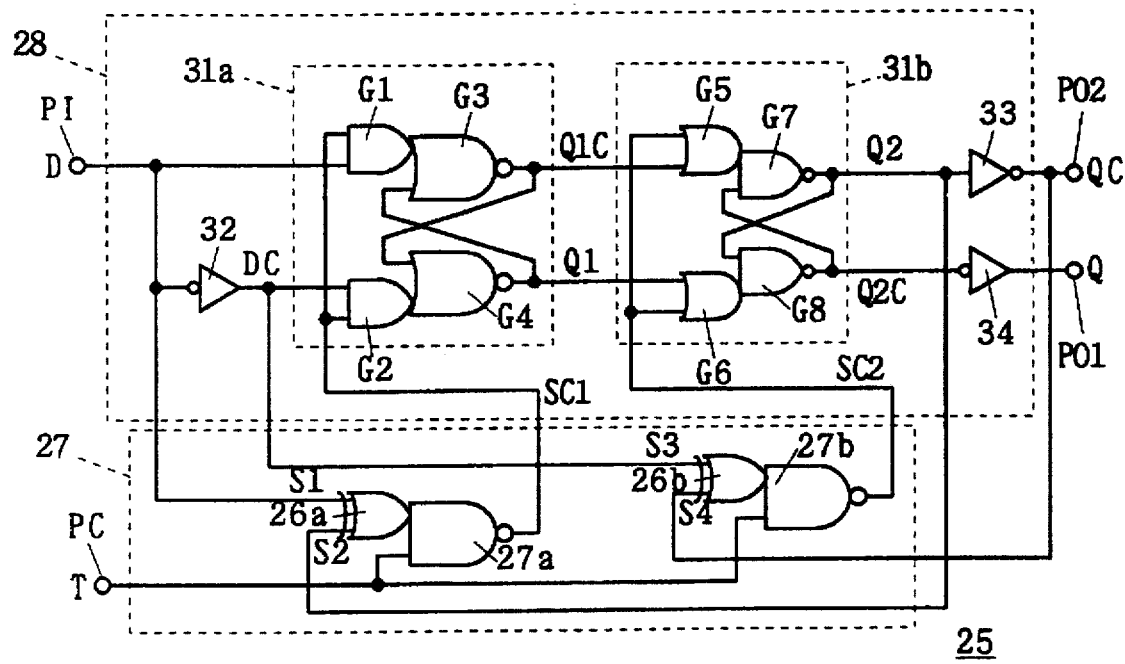
FIG. 8 is a circuit diagram showing the structure of the sixth preferred embodiment of the present invention.

FIG. 8 is a circuit diagram showing one unit structure of the FF 25 according to a sixth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q2
Comparison data S3 . . . Inverted input data DC
Comparison data S4 . . . Inverted output data QC The correspondence relation among the comparison data S1–S4 in the sixth preferred embodiment corresponds to [Table 5, Table 6], and it has the second feature. Accordingly, since the output data Q and the inverted internal data Q2C correspond to none of the comparison data S1–S4, the load put on the output terminal PO1 can be minimized and the load put on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Seventh Preferred Embodiment>

Figure 9:
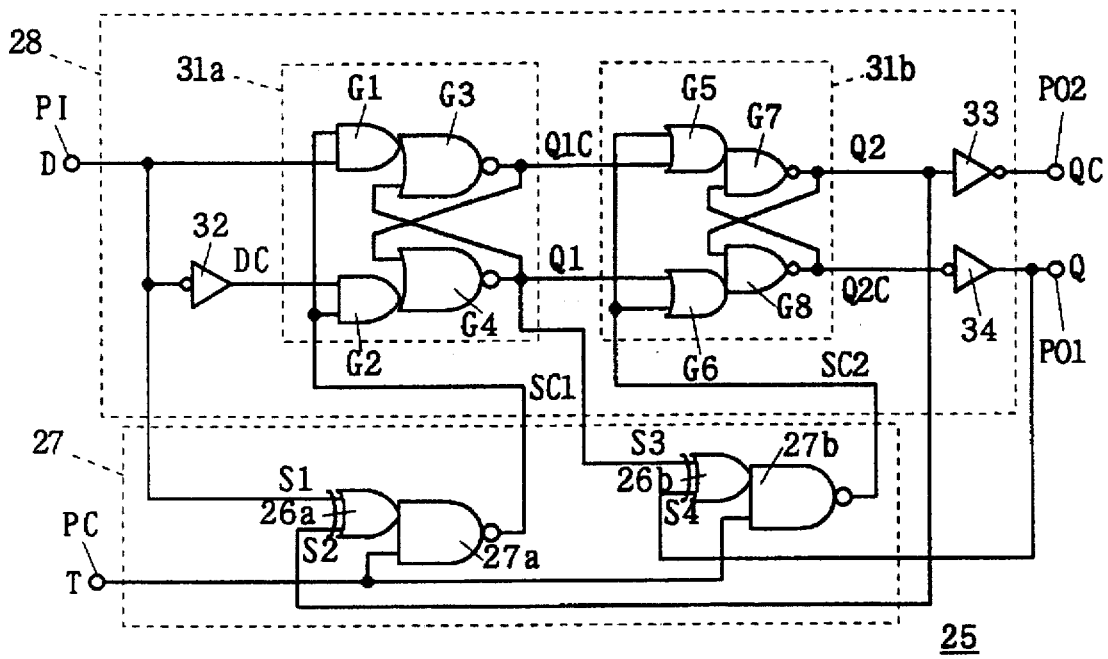
FIG. 9 is a circuit diagram showing the structure of the seventh preferred embodiment of the present invention.

FIG. 9 is a circuit diagram showing one unit structure of the FF 25 according to a seventh preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q2
Comparison data S3 . . . Inverted input data DC
Comparison data S4 . . . Inverted output data QC The correspondence relation among the comparison data S1–S4 in the seventh preferred embodiment corresponds to [Table 7, Table 8], and it has the third feature. Accordingly, since the inverted output data QC corresponds to none of the comparison data S1–S4, the load on the output terminal PO2 can be minimized. As a result, in addition to the low power consumption effect and the high speed operation effect of the basic structure, it has the third effect of transferring the inverted output data QC at high speed with a minimized propagation delay time even if the fan-out of the output terminal PO2 is large.

<Eighth Preferred Embodiment>

Figure 10:
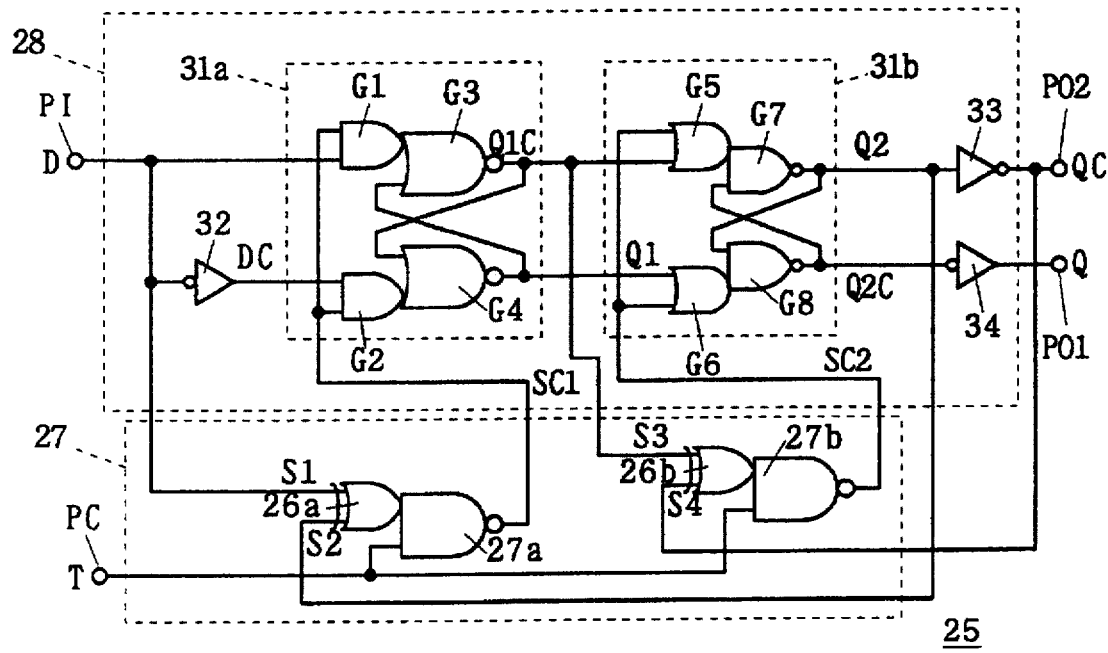
FIG. 10 is a circuit diagram showing the structure of the eighth preferred embodiment of the present invention.

FIG. 10 is a circuit diagram showing one unit structure of the FF 25 according to an eighth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q2
Comparison data S3 . . . Inverted internal data Q1C
Comparison data S4 . . . Inverted output data QC The correspondence relation among the comparison data S1–S4 in the eighth preferred embodiment corresponds to [Table 5, Table 6], and it has the second feature. Accordingly, since the output data Q and the inverted internal data Q2C correspond to none of the comparison data S1–S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Ninth Preferred Embodiment>

Figure 11:
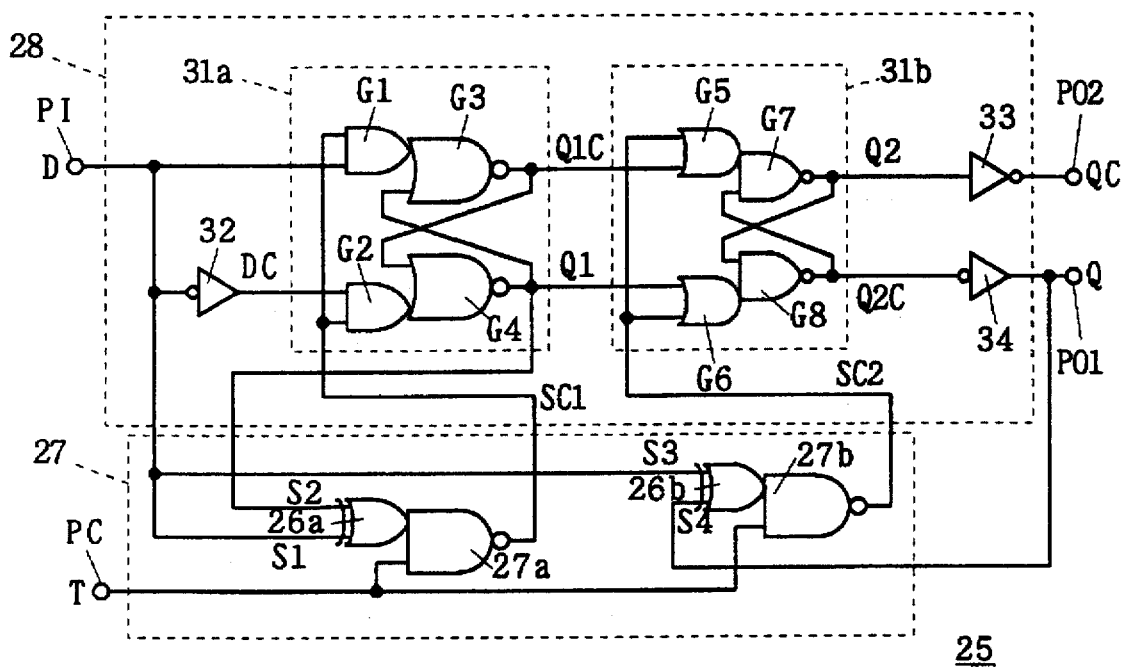
FIG. 11 is a circuit diagram showing the structure of the ninth preferred embodiment of the present invention.

FIG. 11 is a circuit diagram showing one unit structure of the FF 25 according to a ninth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q1
Comparison data S3 . . . Input data D
Comparison data S4 . . . Output data Q The correspondence relation among the comparison data S1–S4 in the ninth preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the output terminal PO2 has large fan-out.

<Tenth Preferred Embodiment>

Figure 12:
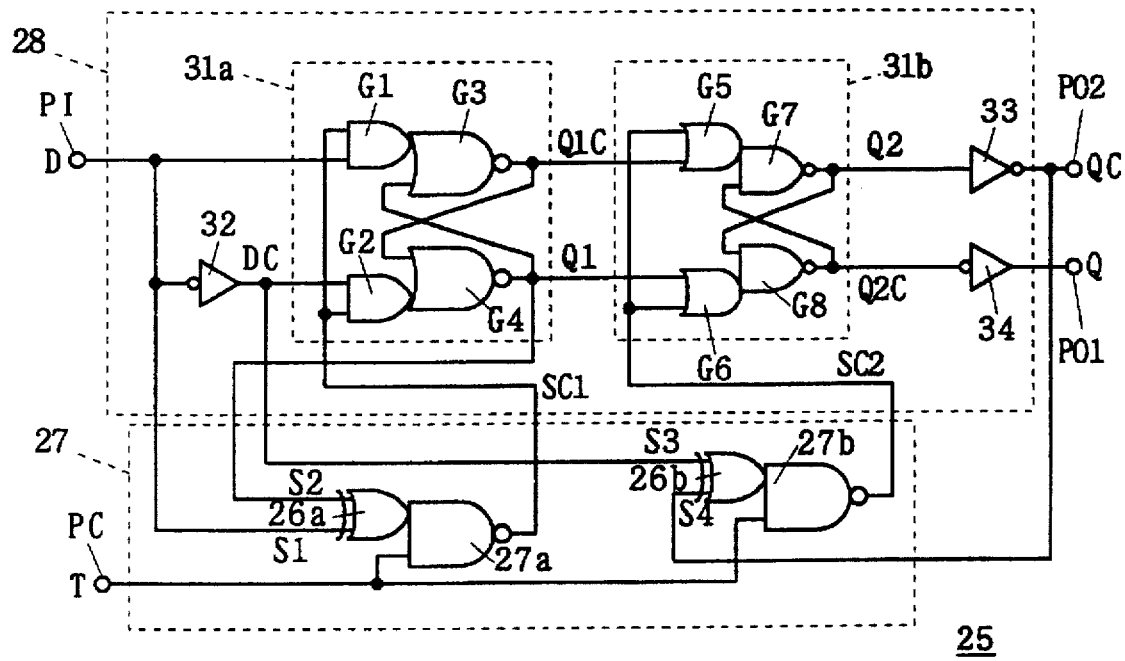
FIG. 12 is a circuit diagram showing the structure of the tenth preferred embodiment of the present invention.

FIG. 12 is a circuit diagram showing one unit structure of the FF 25 according to a tenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q1
Comparison data S3 . . . Inverted input data DC
Comparison data S4 . . . Inverted output data QC The correspondence relation among the comparison data S1–S4 in the tenth preferred embodiment corresponds to [Table 5, Table 6], and it has the second feature. Accordingly, since the output data Q and the inverted internal data Q2C correspond to none of the comparison data S1–S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Eleventh Preferred Embodiment>

Figure 13:
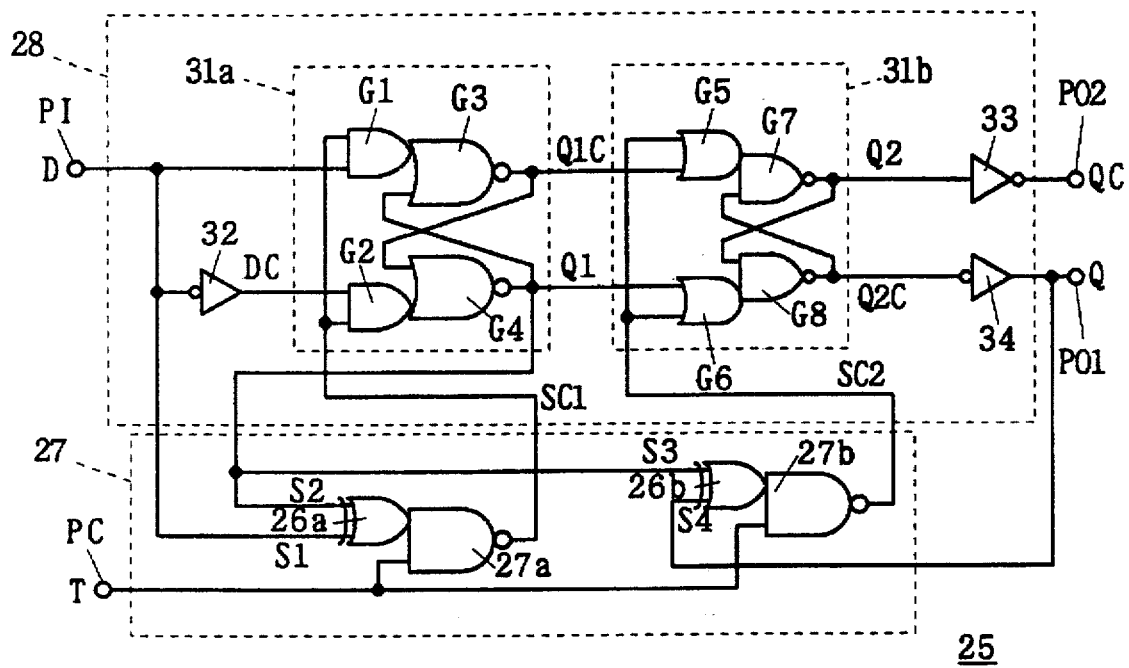
FIG. 13 is a circuit diagram showing the structure of the eleventh preferred embodiment of the present invention.

FIG. 13 is a circuit diagram showing one unit structure of the FF 25 according to an eleventh preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q1
Comparison data S3 . . . Internal data Q1
Comparison data S4 . . . Output data Q The correspondence relation among the comparison data S1–S4 in the eleventh preferred embodiment corresponds to [Table 9, Table 10], and it has the fourth feature. Accordingly, since the inverted output data QC and the internal data Q2 correspond to none of the comparison data S1–S4, the load on the output terminal PO2 can be minimized and the load on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Twelfth Preferred Embodiment>

Figure 14:
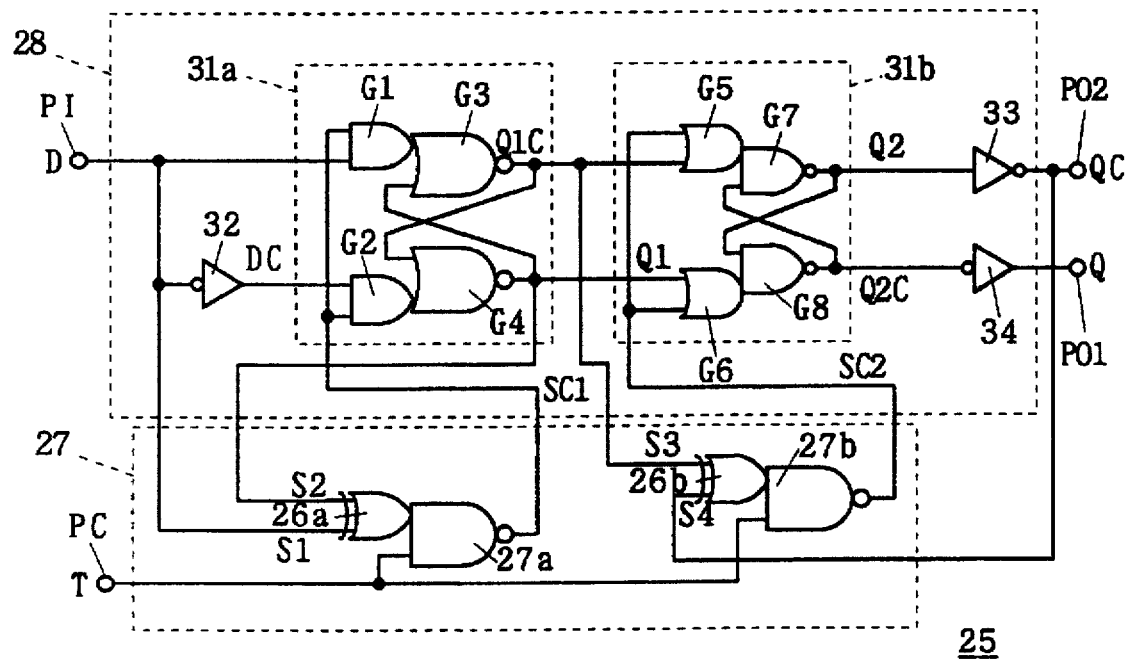
FIG. 14 is a circuit diagram showing the structure of the twelfth preferred embodiment of the present invention.

FIG. 14 is a circuit diagram showing one unit structure of the FF 25 according to a twelfth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q1
Comparison data S3 . . . Inverted internal data Q1C
Comparison data S4 . . . Inverted output data QC The correspondence relation among the comparison data S1–S4 in the twelfth preferred embodiment corresponds to [Table 5, Table 6], and it has the second feature. Accordingly, since the output data Q and the inverted internal data Q2C correspond to none of the comparison data S1–S4, the load put on the output terminal PO1 can be minimized and the load put on the input/output of the inverter can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Thirteenth Preferred Embodiment>

Figure 15:
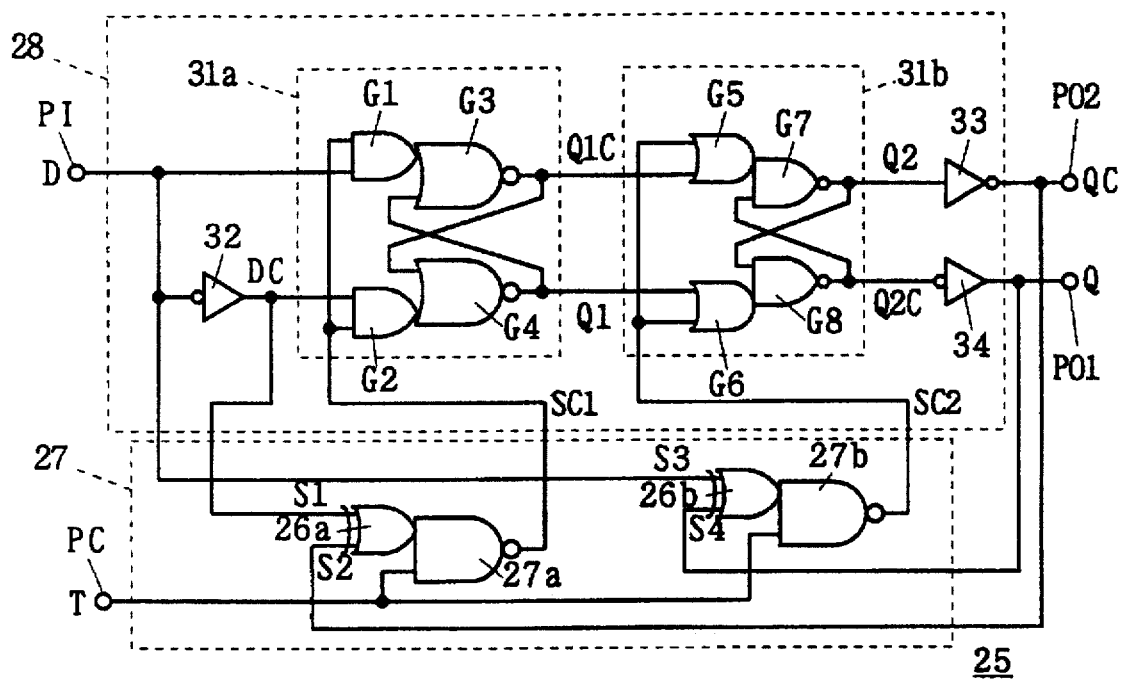
FIG. 15 is a circuit diagram showing the structure of the thirteenth preferred embodiment of the present invention.

FIG. 15 is a circuit diagram showing one unit structure of the FF 25 according to a thirteenth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted output data QC
Comparison data S3 . . . Input data D
Comparison data S4 . . . Output data Q The correspondence relation among the comparison data S1–S4 in the thirteenth preferred embodiment corresponds to [Table 15], and it has the seventh feature. Accordingly, since one of the comparison data S2 and the comparison data S4 is always the output data Q and the other is the inverted output data QC, equal loads can be provided on the output terminal PO1 and the output terminal PO2. As a result, in addition to the low power consumption effect and the high speed operation effect of the basic structure, it has the seventh effect of eliminating a signal propagation delay between the output data Q and the inverted output data QC when the output terminal PO1 and the output terminal PO2 have equal fan-out in the relation with the external.

<Fourteenth Preferred Embodiment>

Figure 16:
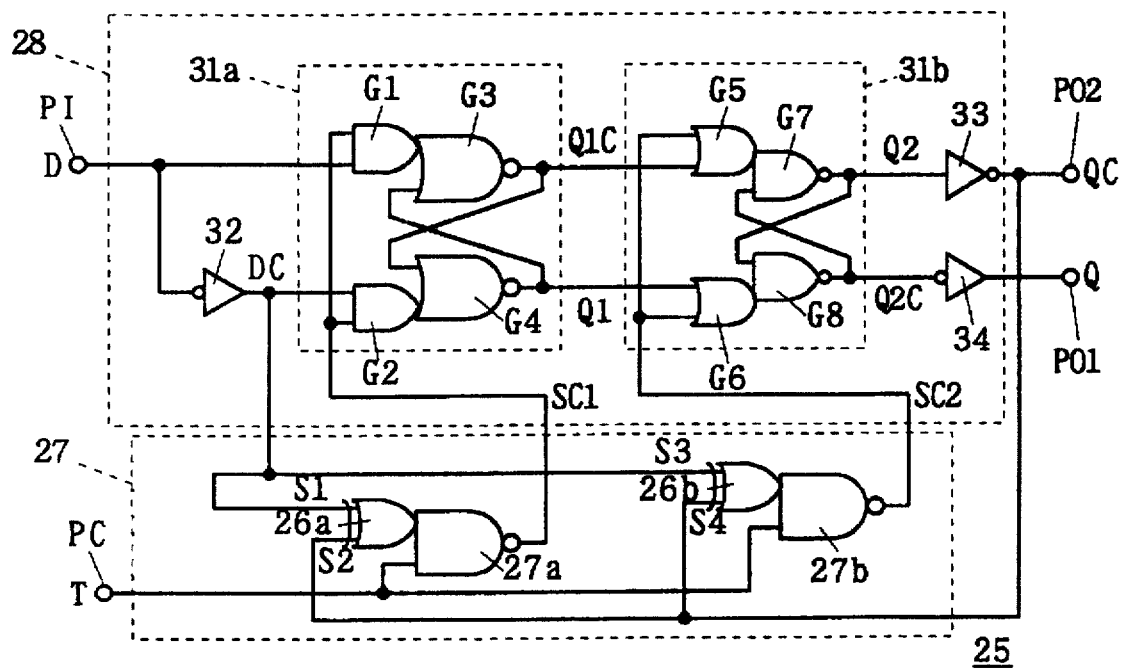
FIG. 16 is a circuit diagram showing the structure of the fourteenth preferred embodiment of the present invention.

FIG. 16 is a circuit diagram showing one unit structure of the FF 25 according to a fourteenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted output data QC
Comparison data S3 . . . Inverted input data DC
Comparison data S4 . . . Inverted output data QC The correspondence relation among the comparison data S1–S4 in the fourteenth preferred embodiment corresponds to [Table 5, Table 6], and it has the second feature. Accordingly, since the output data Q and the inverted internal data Q2C correspond to none of the comparison data S1–S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

In addition, the correspondence relation among the comparison data S1–S4 of the fourteenth preferred embodiment also corresponds to [Table 11, Table 12], and it has the fifth feature, too. Accordingly, since the input data D corresponds to none of the comparison data S1–S4, the load on the input terminal PI can be minimized. As a result, it has the fifth effect of transferring the input data D at high speed with a minimized propagation delay time even if the fan-in of the input terminal PI is large in the relation with the external.

<Fifteenth Preferred Embodiment>

Figure 17:
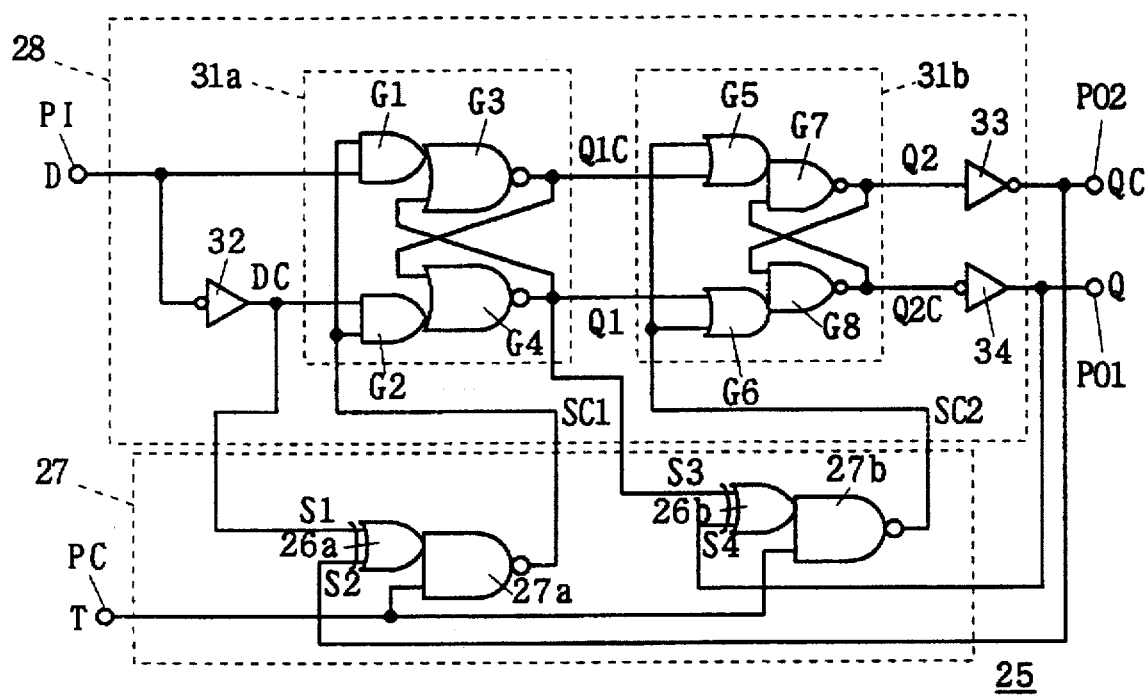
FIG. 17 is a circuit diagram showing the structure of the fifteenth preferred embodiment of the present invention.

FIG. 17 is a circuit diagram showing one unit structure of the FF 25 according to a fifteenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted Input data DC
Comparison data S2 . . . Inverted output data QC
Comparison data S3 . . . Internal data Q1
Comparison data S4 . . . Output data Q The correspondence relation among the comparison data S1–S4 in the fifteenth preferred embodiment corresponds to [Table 11, Table 12], and it has the fifth feature. Accordingly, since the input data D corresponds to none of the comparison data S1–S4, the load on the input terminal PI can be minimized. As a result, it has the fifth effect of transferring the input data D at high speed with a minimized propagation delay time even if the fan-in of the input terminal PI is large in the relation with the external.

The correspondence relation among the comparison data S1–S4 in the fifteenth preferred embodiment also corresponds to [Table 15], and it has the seventh feature, too. Accordingly, since one of the comparison data S2 and the comparison data S4 is always the output data Q and the other is the inverted output data QC, equal loads can be provided on the output terminal PO1 and the output terminal PO2. As a result, in addition to the low power consumption effect and the high speed operation effect of the basic structure, it has the seventh effect of eliminating a signal propagation delay between the output data Q and the inverted output data QC when the output terminal PO1 and the output terminal PO2 have equal fan-out in the relation with the external.

<Sixteenth Preferred Embodiment>

Figure 18:
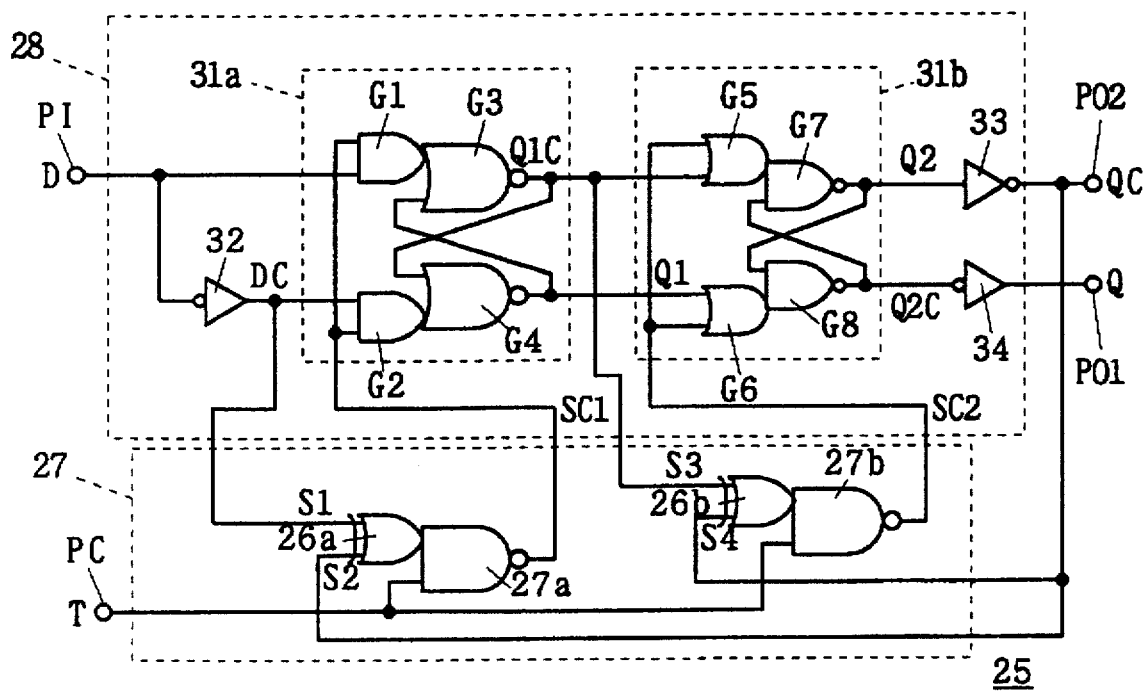
FIG. 18 is a circuit diagram showing the structure of the sixteenth preferred embodiment of the present invention.

FIG. 18 is a circuit diagram showing one unit structure of the FF 25 according to a sixteenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted output data QC
Comparison data S3 . . . Inverted internal data Q1C
Comparison data S4 . . . Inverted output data QC The correspondence relation among the comparison data S1–S4 in the sixteenth preferred embodiment corresponds to [Table 5, Table 6], and it has the second feature. Accordingly, since the output data Q and the inverted internal data Q2C correspond to none of the comparison data S1–S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

In addition, the correspondence relation among the comparison data S1–S4 of the sixteenth preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation with the external.

<Seventeenth Preferred Embodiment>

Figure 19:
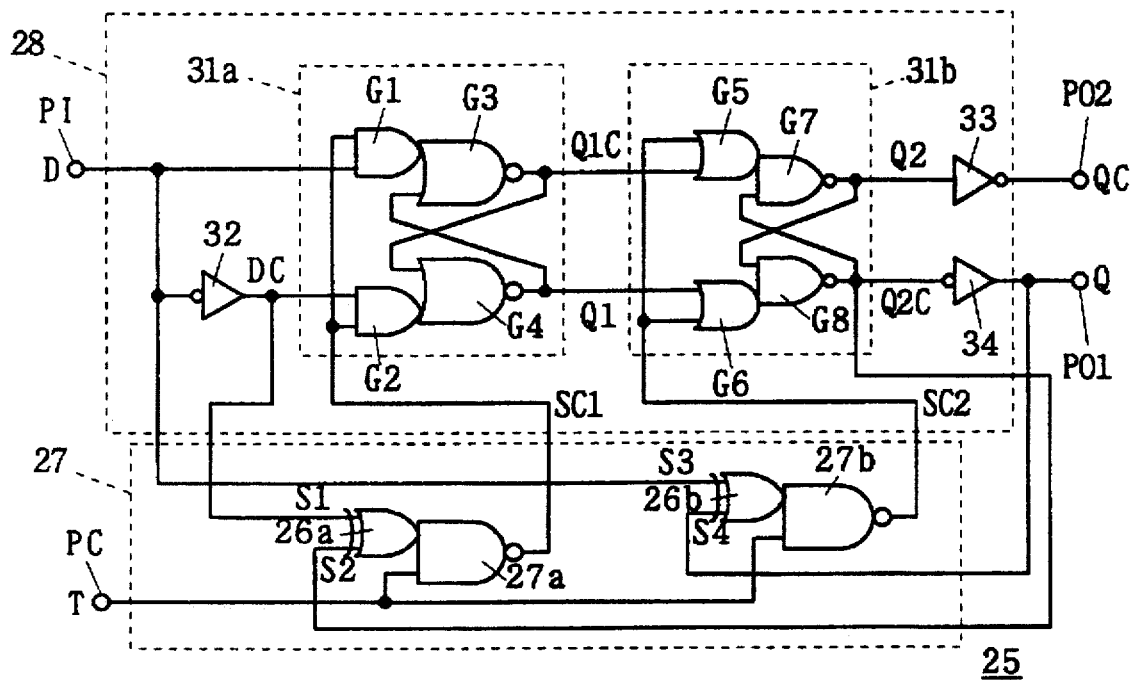
FIG. 19 is a circuit diagram showing the structure of the seventeenth preferred embodiment of the present invention.

FIG. 19 is a circuit diagram showing one unit structure of the FF 25 according to a seventeenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q2C
Comparison data S3 . . . Input data D
Comparison data S4 . . . Output data Q The correspondence relation among the comparison data S1–S4 in the seventeenth preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Eighteenth Preferred Embodiment>

Figure 20:
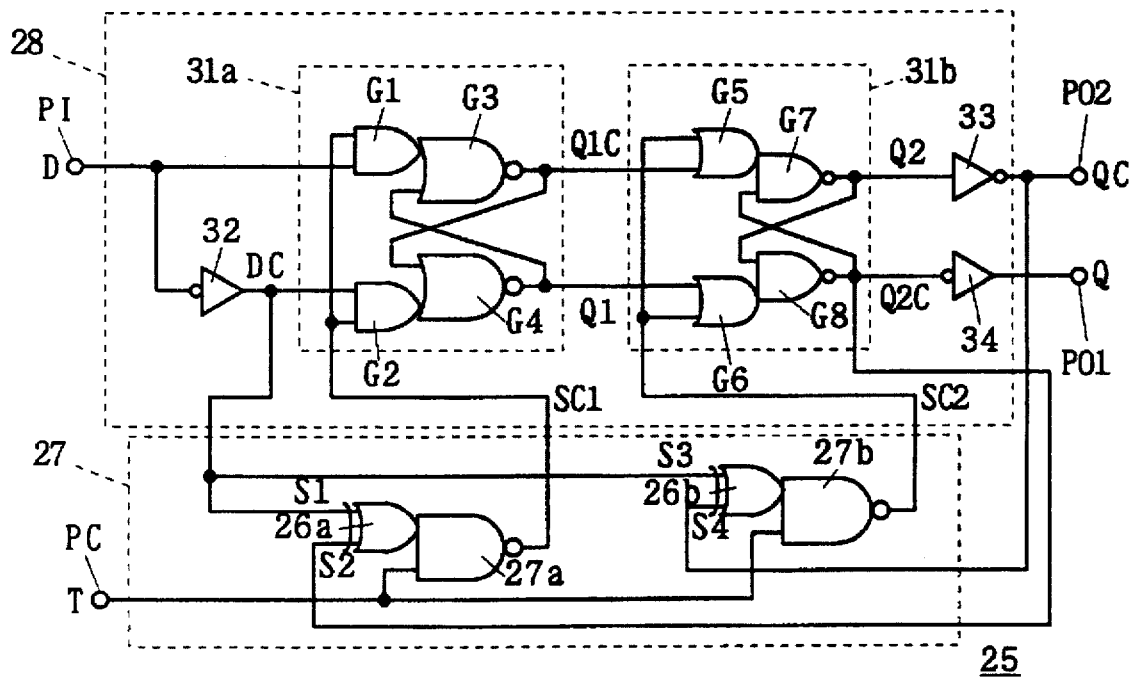
FIG. 20 is a circuit diagram showing the structure of the eighteenth preferred embodiment of the present invention.

FIG. 20 is a circuit diagram showing one unit structure of the FF 25 according to an eighteenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q2C
Comparison data S3 . . . Inverted input data DC
Comparison data S4 . . . Inverted output data QC The correspondence relation among the comparison data S1–S4 in the eighteenth preferred embodiment corresponds to [Table 3, Table 4], and it has the first feature. Accordingly, since the output data Q corresponds to none of the comparison data S1–S4, the load put on the output terminal PO1 can be minimized. As a result, in addition to the low power consumption effect and the high speed operation effect of the basic structure, it has the first effect of transferring the inverted output data QC at high speed with a minimized propagation delay time even if the fan-out of the output terminal PO1 is large.

Furthermore, the correspondence relation among the comparison data S1–S4 of the eighteenth preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation with the external.

<Nineteenth Preferred Embodiment>

Figure 21:
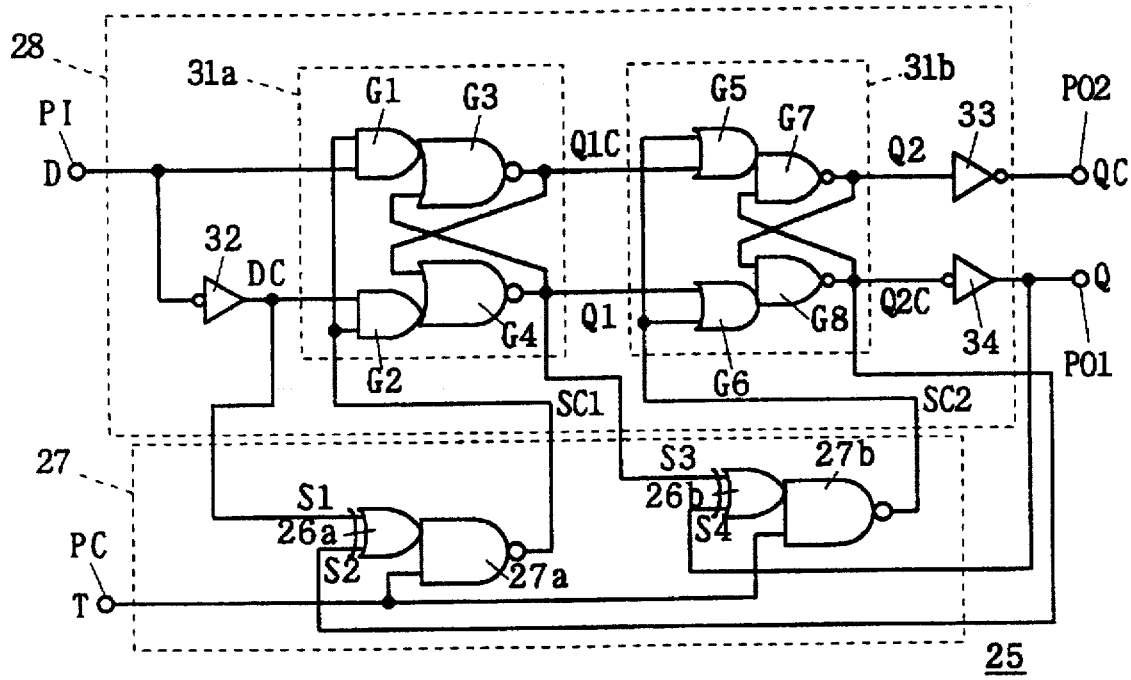
FIG. 21 is a circuit diagram showing the structure of the nineteenth preferred embodiment of the present invention.

FIG. 21 is a circuit diagram showing one unit structure of the FF 25 according to a nineteenth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q2C
Comparison data S3 . . . Internal data Q1
Comparison data S4 . . . Output data Q The correspondence relation among the comparison data S1–S4 in the nineteenth preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

In addition, the correspondence relation among the comparison data S1–S4 of the nineteenth preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation with the external.

<Twentieth Preferred Embodiment>

Figure 22:
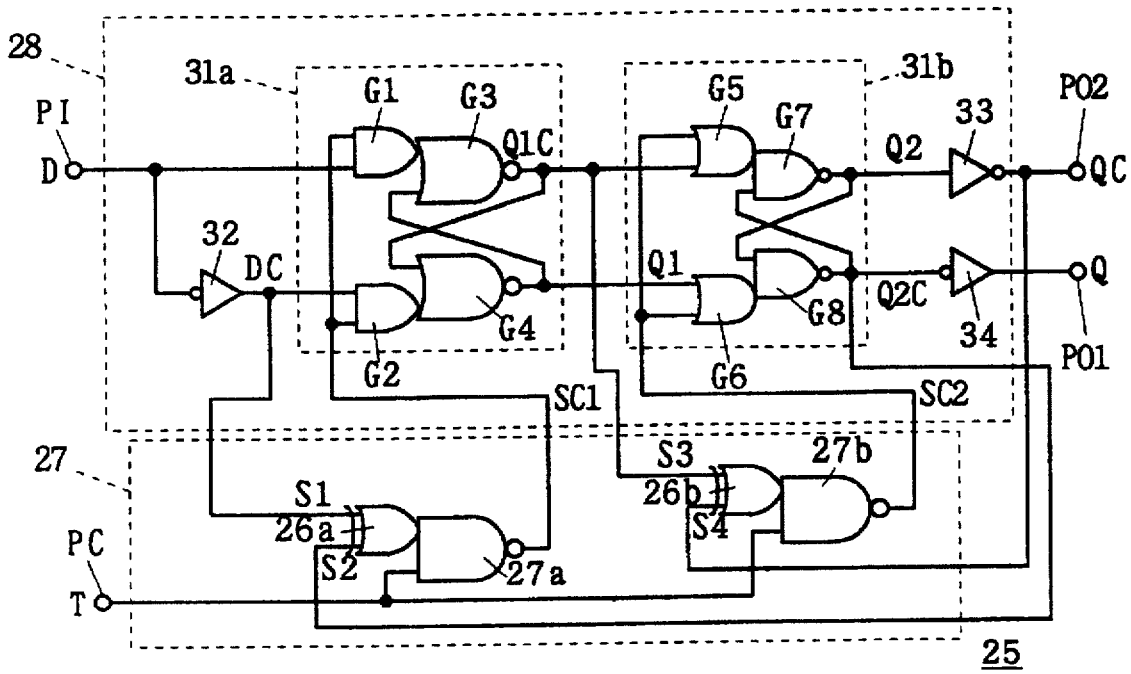
FIG. 22 is a circuit diagram showing the structure of the twentieth preferred embodiment of the present invention.

FIG. 22 is a circuit diagram showing one unit structure of the FF 25 according to a twentieth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q2C
Comparison data S3 . . . Inverted internal data Q1C
Comparison data S4 . . . Inverted output data QC The correspondence relation among the comparison data S1–S4 in the twentieth preferred embodiment corresponds to [Table 3, Table 4], and it has the first feature. Accordingly, since the output data Q corresponds to none of the comparison data S1–S4, the load put on the output terminal PO1 can be minimized. As a result, in addition to the low power consumption effect and the high speed operation effect of the basic structure, it has the first effect of transferring the inverted output data QC at high speed with a minimized propagation delay time even if the output terminal PO1 has large fan-out.

Furthermore, the correspondence relation among the comparison data S1–S4 of the twentieth preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation with the external.

<Twenty-first Preferred Embodiment>

Figure 23:
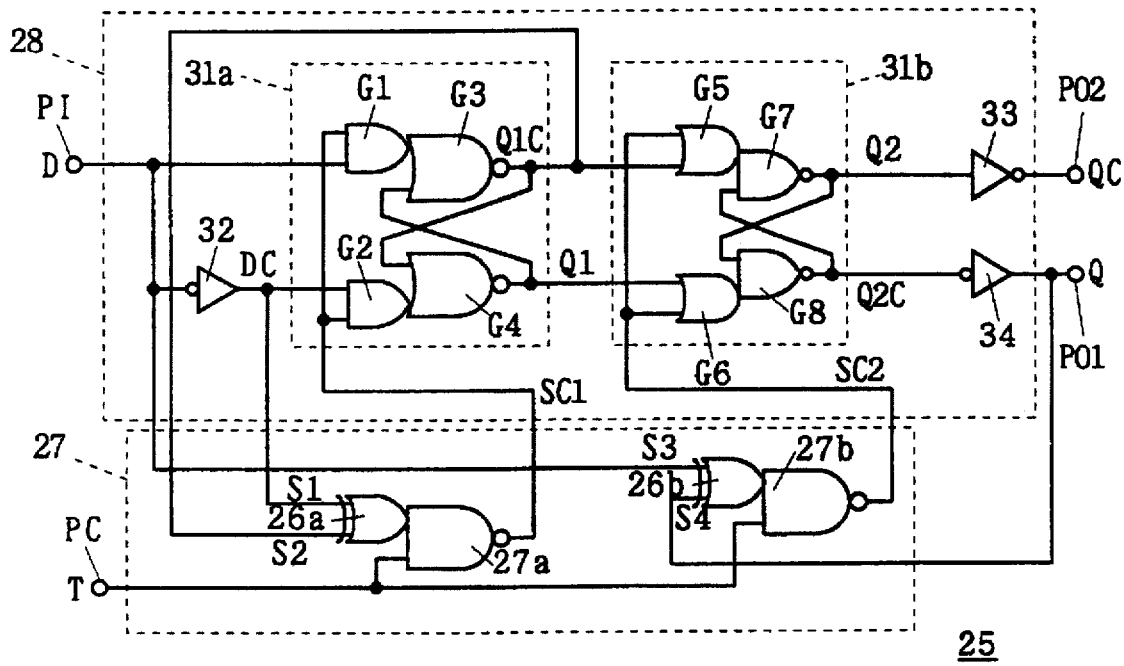
FIG. 23 is a circuit diagram showing the structure of the twenty-first preferred embodiment of the present invention.

FIG. 23 is a circuit diagram showing one unit structure of the FF 25 according to a twenty-first preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Input data D
Comparison data S4 . . . Output data Q The correspondence relation among the comparison data S1–S4 in the twenty-first preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Twenty-second Preferred Embodiment>

Figure 24:
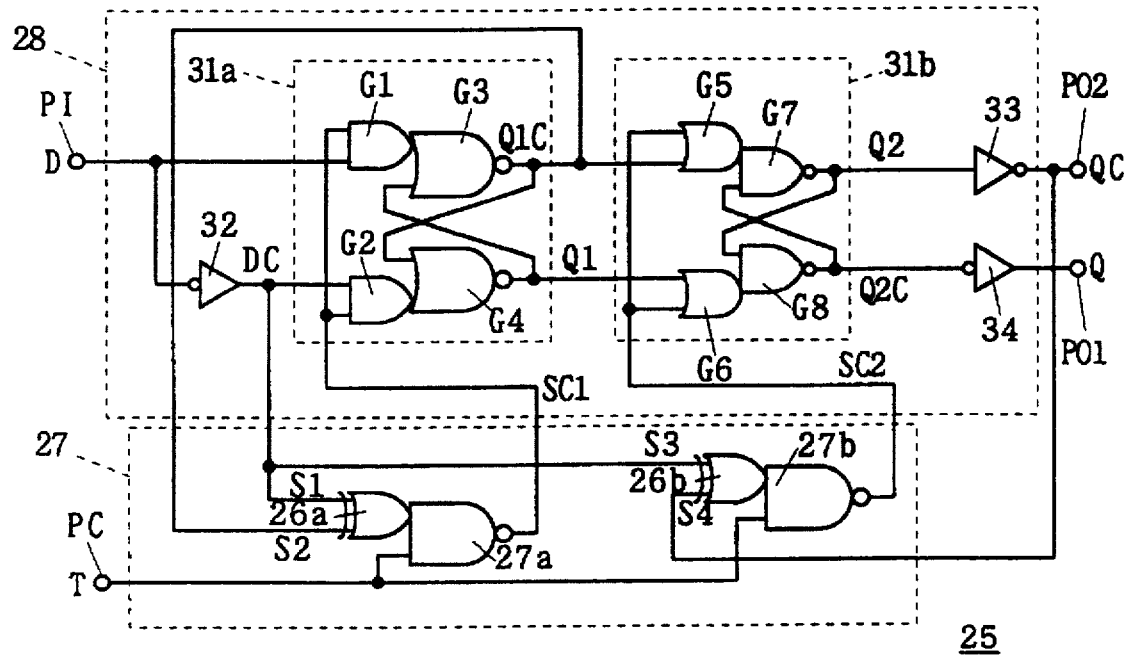
FIG. 24 is a circuit diagram showing the structure of the twenty-second preferred embodiment of the present invention.

FIG. 24 is a circuit diagram showing one unit structure of the FF 25 according to a twenty-second preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Inverted input data DC
Comparison data S4 . . . Inverted output data QC The correspondence relation among the comparison data S1–S4 in the twenty-second preferred embodiment corresponds to [Table 5, Table 6], and it has the second feature. Accordingly, since the output data Q and the inverted internal data Q2C correspond to none of the comparison data S1–S4, the load put on the output terminal PO1 can be minimized and the load put on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

Furthermore, the correspondence relation among the comparison data S1–S4 of the twenty-second preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

<Twenty-third Preferred Embodiment>

Figure 25:
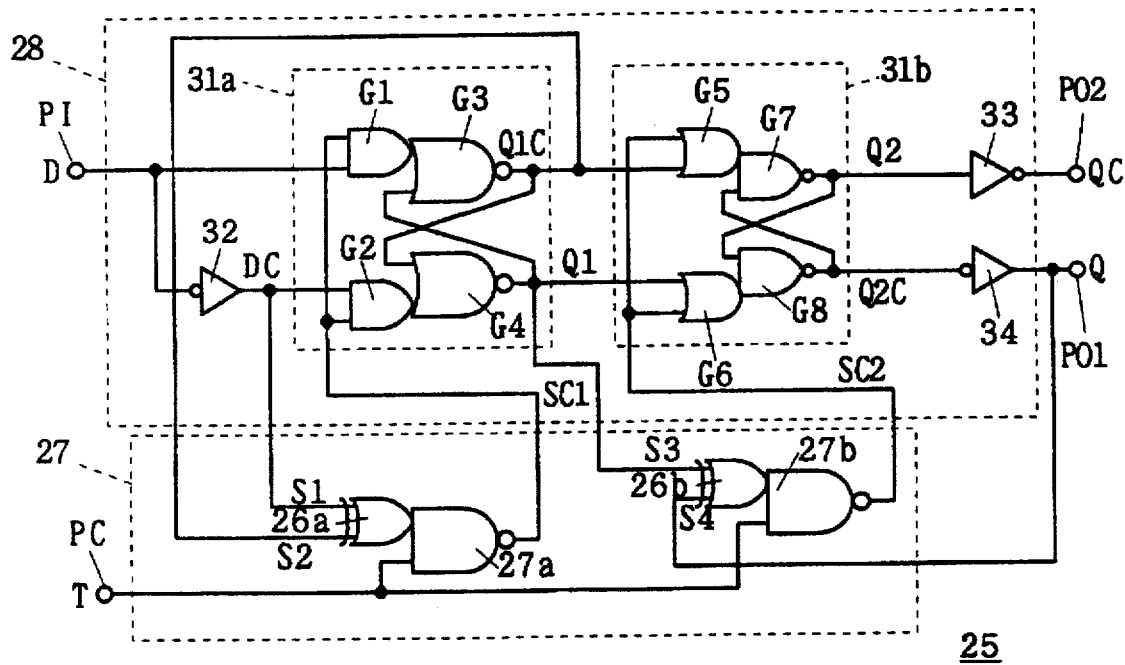
FIG. 25 is a circuit diagram showing the structure of the twenty-third preferred embodiment of the present invention.

FIG. 25 is a circuit diagram showing one unit structure of the FF 25 according to a twenty-third preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Internal data Q1
Comparison data S4 . . . Output data Q The correspondence relation among the comparison data S1–S4 in the twenty-third preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

Furthermore, the correspondence relation among the comparison data S1–S4 of the twenty-third preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation with the external.

<Twenty-fourth Preferred Embodiment>

Figure 26:
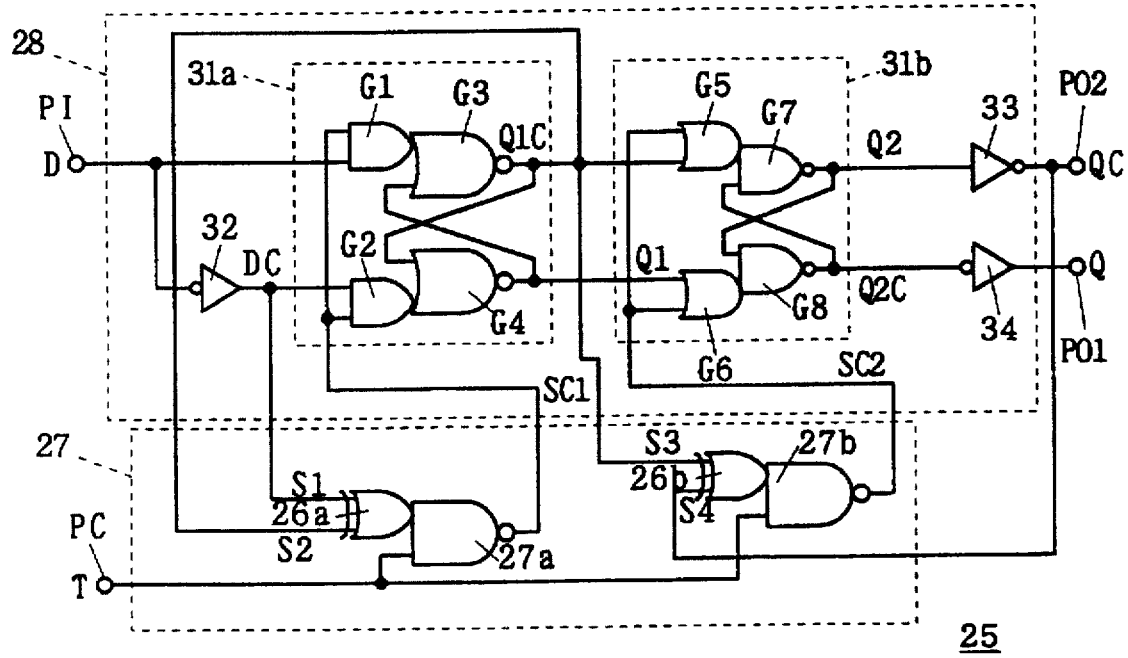
FIG. 26 is a circuit diagram showing the structure of the twenty-fourth preferred embodiment of the present invention.

FIG. 26 is a circuit diagram showing one unit structure of the FF 25 according to a twenty-fourth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Inverted internal data Q1C
Comparison data S4 . . . Inverted output data QC The correspondence relation among the comparison data S1–S4 in the twenty-fourth preferred embodiment corresponds to [Table 5, Table 6], and it has the second feature. Accordingly, since the output data Q and the inverted internal data Q2C correspond to none of the comparison data S1–S4, the load put on the output terminal PO1 can be minimized and the load put on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

Furthermore, the correspondence relation among the comparison data S1–S4 of the twenty-fourth preferred embodiment also corresponds to [Table 11, Table 12], and it has the fifth feature, too. Accordingly, since the input data D corresponds to none of the comparison data S1–S4, the load on the input terminal PI can be minimized. As a result, it has the fifth effect of transferring the input data D at high speed with a minimized propagation delay time even if the fan-in of the input terminal PI is large in the relation to the external.

<Twenty-fifth Preferred Embodiment>

Figure 27:
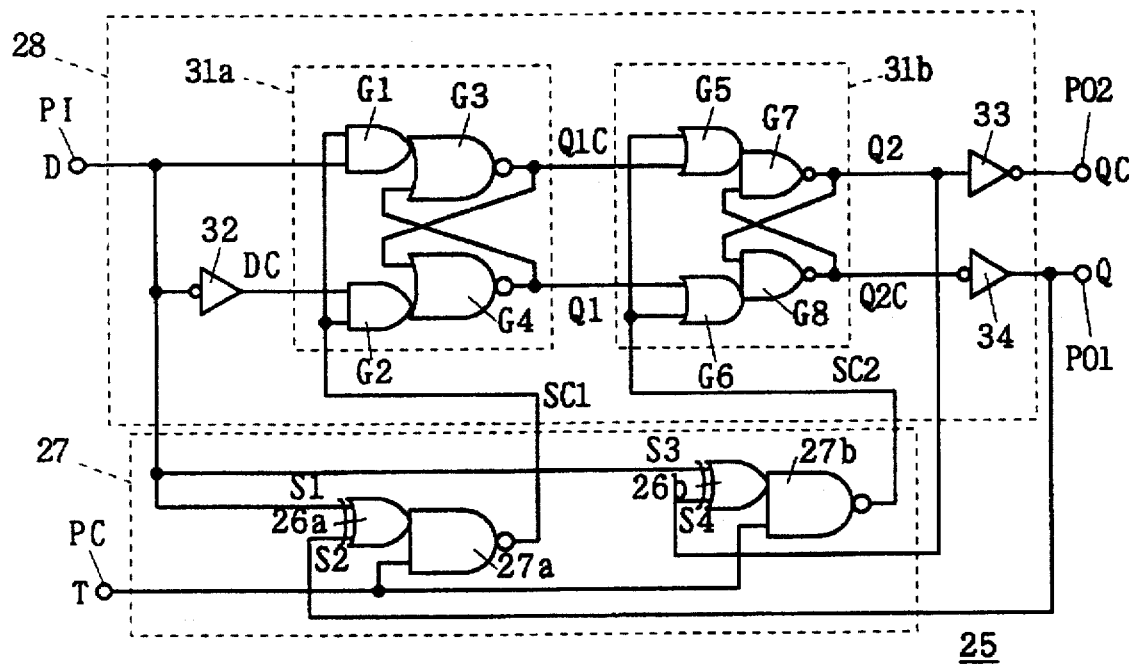
FIG. 27 is a circuit diagram showing the structure of the twenty-fifth preferred embodiment of the present invention.

FIG. 27 is a circuit diagram showing one unit structure of the FF 25 according to a twenty-fifth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Output data Q
Comparison data S3 . . . Input data D
Comparison data S4 . . . Internal data Q2

The correspondence relation among the comparison data S1–S4 in the twenty-fifth preferred embodiment corresponds to [Table 7, Table 8], and it has the third feature. Accordingly, since the inverted output data QC corresponds to none of the comparison data S1–S4, the load put on the output terminal PO2 can be minimized. As a result, in addition to the low power consumption effect and the high speed operation effect of the basic structure, it has the third effect of transferring the inverted output data QC at high speed with a minimized propagation delay time even if the fan-out of the output terminal PO2 is large.

<Twenty-sixth Preferred Embodiment>

Figure 28:
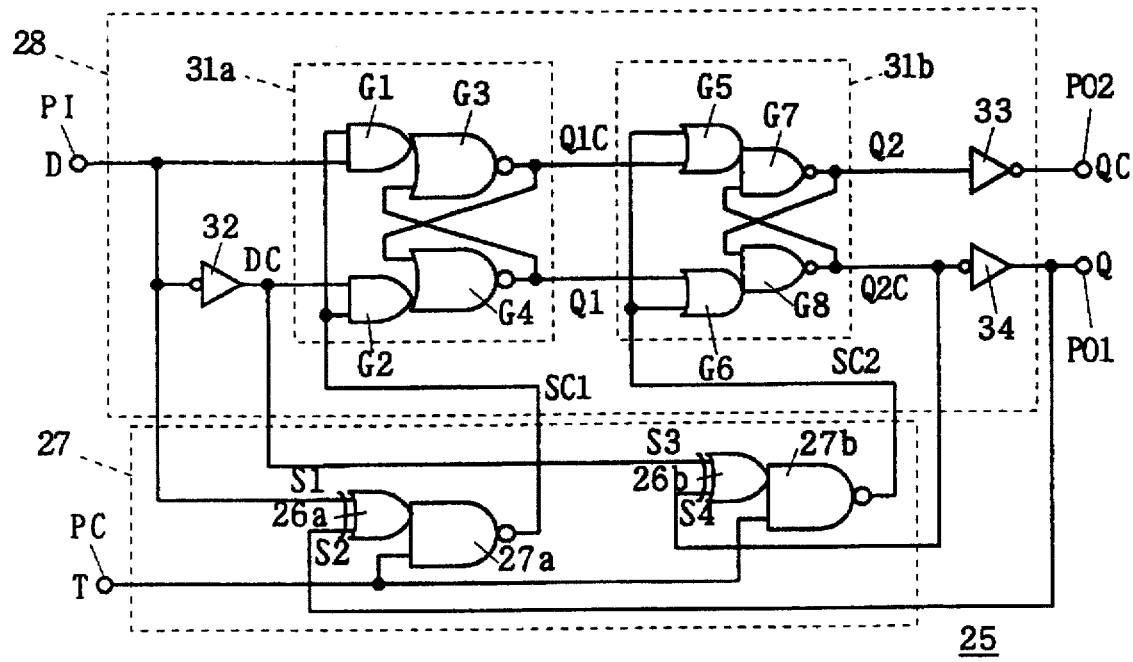
FIG. 28 is a circuit diagram showing the structure of the twenty-sixth preferred embodiment of the present invention.

FIG. 28 is a circuit diagram showing one unit structure of the FF 25 according to a twenty-sixth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Output data Q
Comparison data S3 . . . Inverted input data DC
Comparison data S4 . . . Inverted internal data Q2C The correspondence relation among the comparison data S1–S4 in the twenty-sixth preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO1 is large.

<Twenty-seventh Preferred Embodiment>

Figure 29:
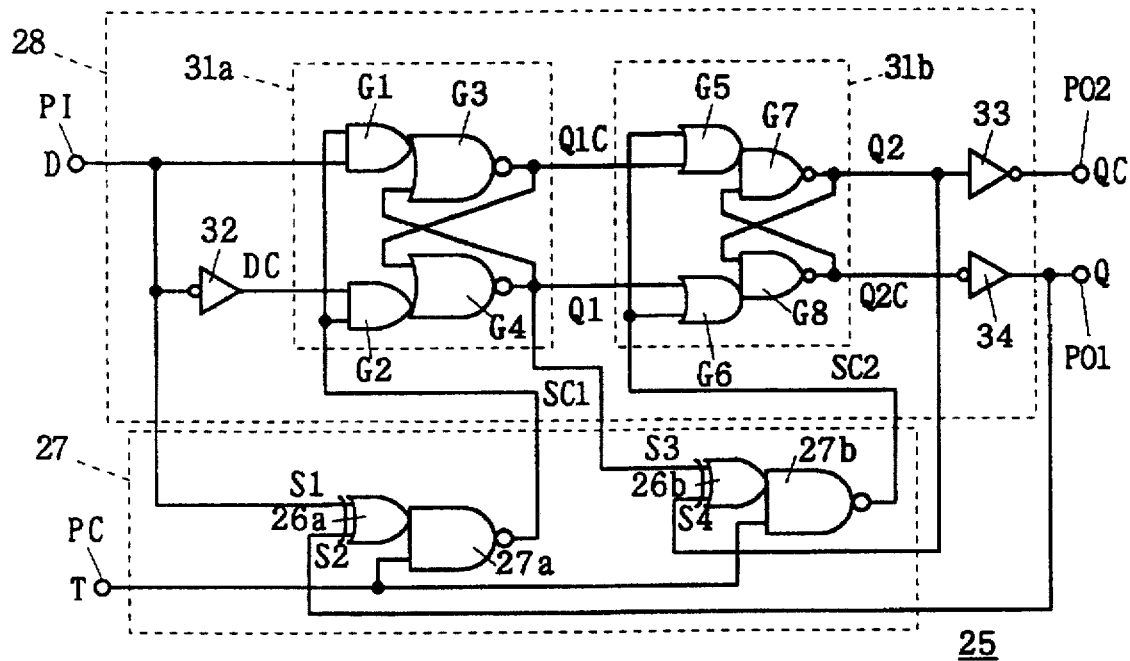
FIG. 29 is a circuit diagram showing the structure of the twenty-seventh preferred embodiment of the present invention.

FIG. 29 is a circuit diagram showing one unit structure of the FF 25 according to a twenty-seventh preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Output data Q
Comparison data S3 . . . Internal data Q1
Comparison data S4 . . . Internal data Q2

The correspondence relation among the comparison data S1–S4 in the twenty-seventh preferred embodiment corresponds to [Table 7, Table 8], and it has the third feature. Accordingly, since the inverted output data QC corresponds to none of the comparison data S1–S4, the load on the output terminal PO2 can be minimized. As a result, in addition to the low power consumption effect and the high speed operation effect of the basic structure, it has the third effect of transferring the inverted output data QC at high speed with a minimized propagation delay time even if the fan-out of the output terminal PO2 is large.

<Twenty-eighth Preferred Embodiment>

Figure 30:
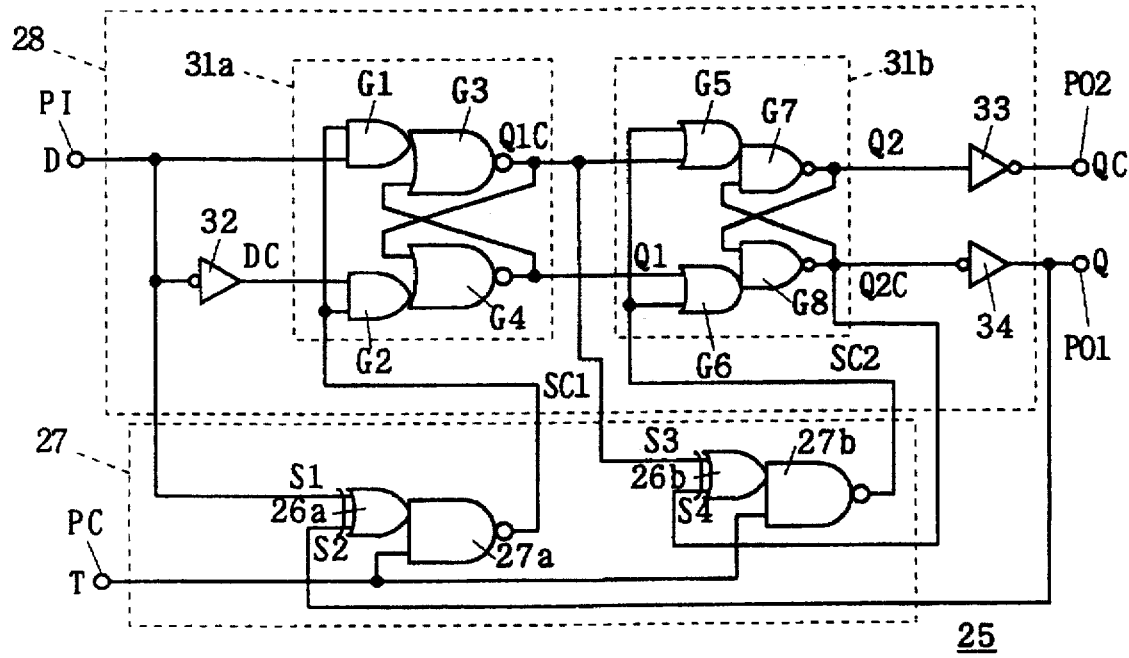
FIG. 30 is a circuit diagram showing the structure of the twenty-eighth preferred embodiment of the present invention.

FIG. 30 is a circuit diagram showing one unit structure of the FF 25 according to a twenty-eighth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Output data Q
Comparison data S3 . . . Inverted Internal data Q1C
Comparison data S4 . . . Inverted internal data Q2C The correspondence relation among the comparison data S1–S4 in the twenty-eighth preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Twenty-ninth Preferred Embodiment>

Figure 31:
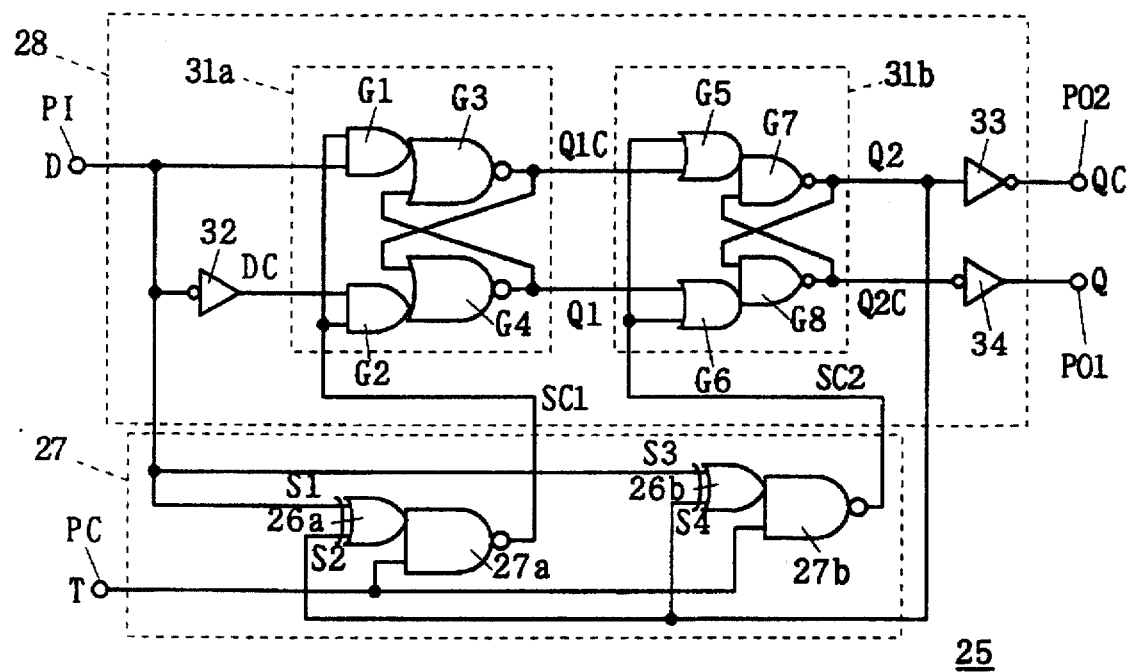
FIG. 31 is a circuit diagram showing the structure of the twenty-ninth preferred embodiment of the present invention.

FIG. 31 is a circuit diagram showing one unit structure of the FF 25 according to a twenty-ninth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q2
Comparison data S3 . . . Input data D
Comparison data S4 . . . Internal data Q2

The correspondence relation among the comparison data S1–S4 in the twenty-ninth preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-out of the output terminal PO1 and the output terminal PO2 is large in the relation to the external.

In addition, since equal loads are provided on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirtieth Preferred Embodiment>

Figure 32:
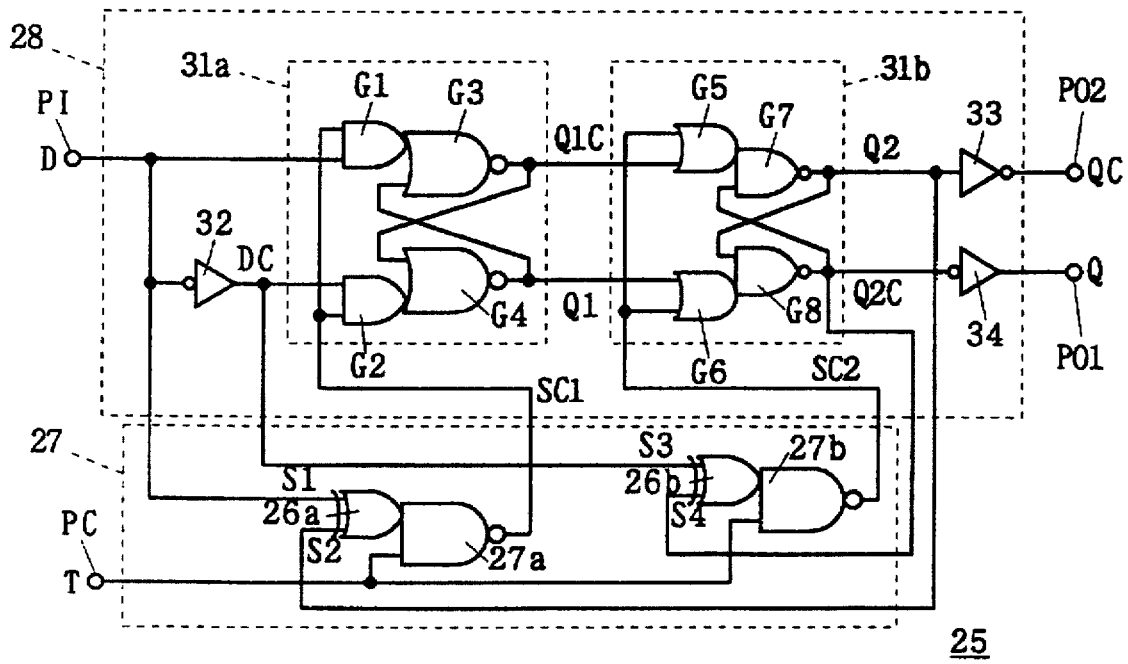
FIG. 32 is a circuit diagram showing the structure of the thirtieth preferred embodiment of the present invention.

FIG. 32 is a circuit diagram showing one unit structure of the FF 25 according to a thirtieth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q2
Comparison data S3 . . . Inverted input data DC
Comparison data S4 . . . Inverted internal data Q2C The correspondence relation among the comparison data S1–S4 in the thirtieth preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, since equal loads are provided on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty-first Preferred Embodiment>

Figure 33:
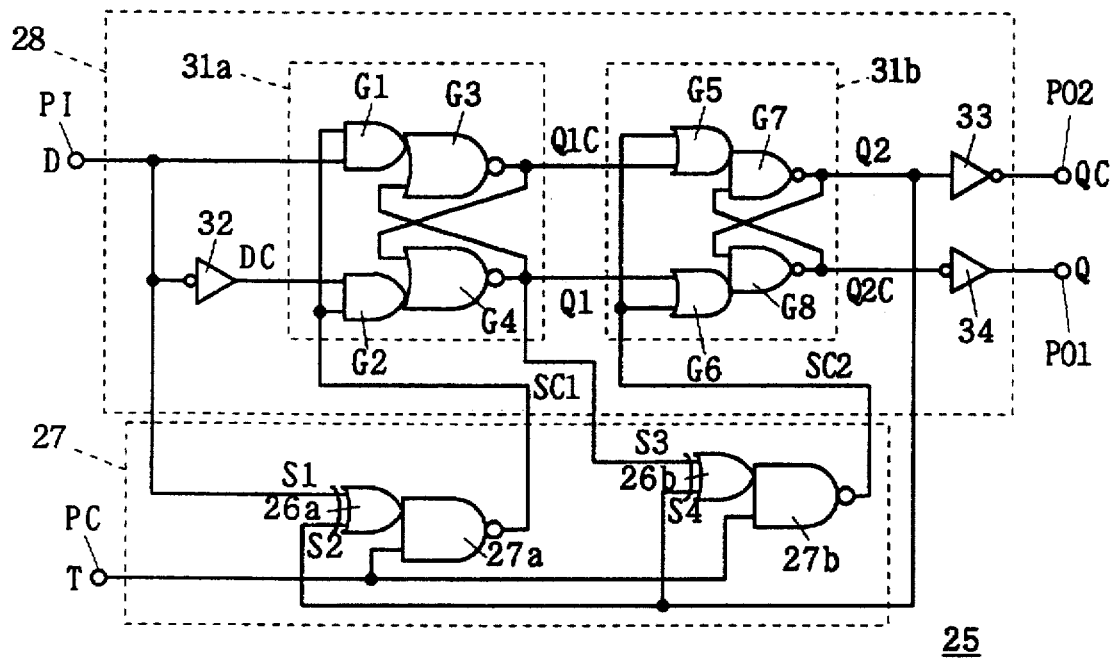
FIG. 33 is a circuit diagram showing the structure of the thirty-first preferred embodiment of the present invention.

FIG. 33 is a circuit diagram showing one unit structure of the FF 25 according to a thirty-first preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q2
Comparison data S3 . . . Internal data Q1
Comparison data S4 . . . Internal data Q2

The correspondence relation among the comparison data S1–S4 in the thirty-first preferred embodiment corresponds to [Table 13, Table 14], and it has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty-second Preferred Embodiment>

Figure 34:
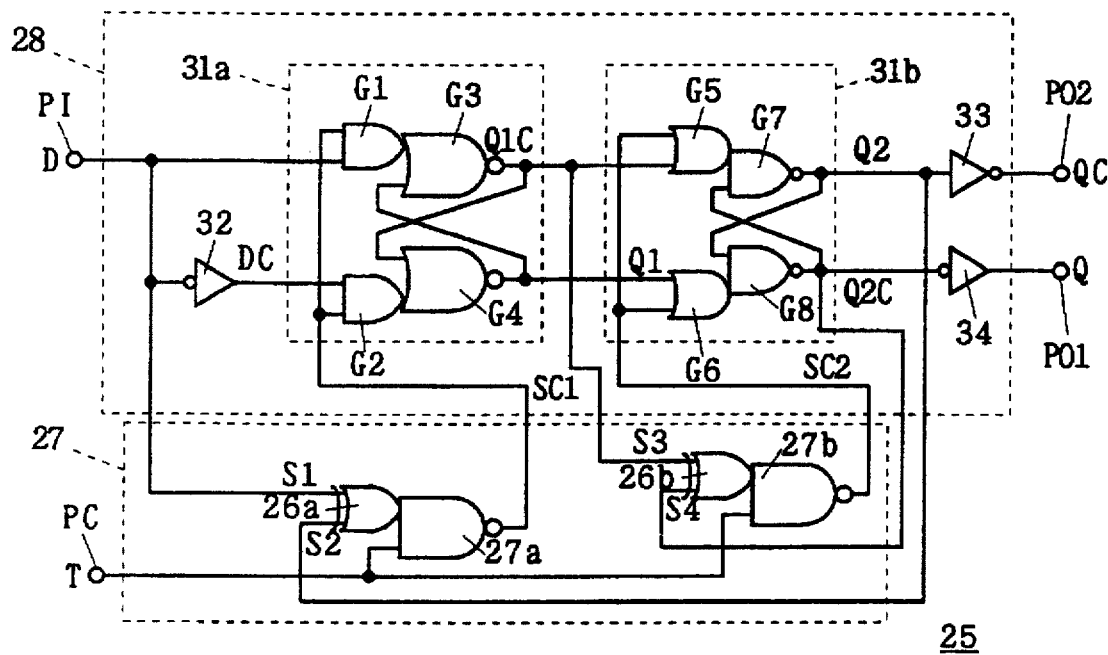
FIG. 34 is a circuit diagram showing the structure of the thirty-second preferred embodiment of the present invention.

FIG. 34 is a circuit diagram showing one unit structure of the FF 25 according to a thirty-second preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q2
Comparison data S3 . . . Inverted internal data Q1C
Comparison data S4 . . . Inverted internal data Q2C The correspondence relation among the comparison data S1–S4 in the thirty-second preferred embodiment corresponds to [Table 13, Table 14], and it has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty-third Preferred Embodiment>

Figure 35:
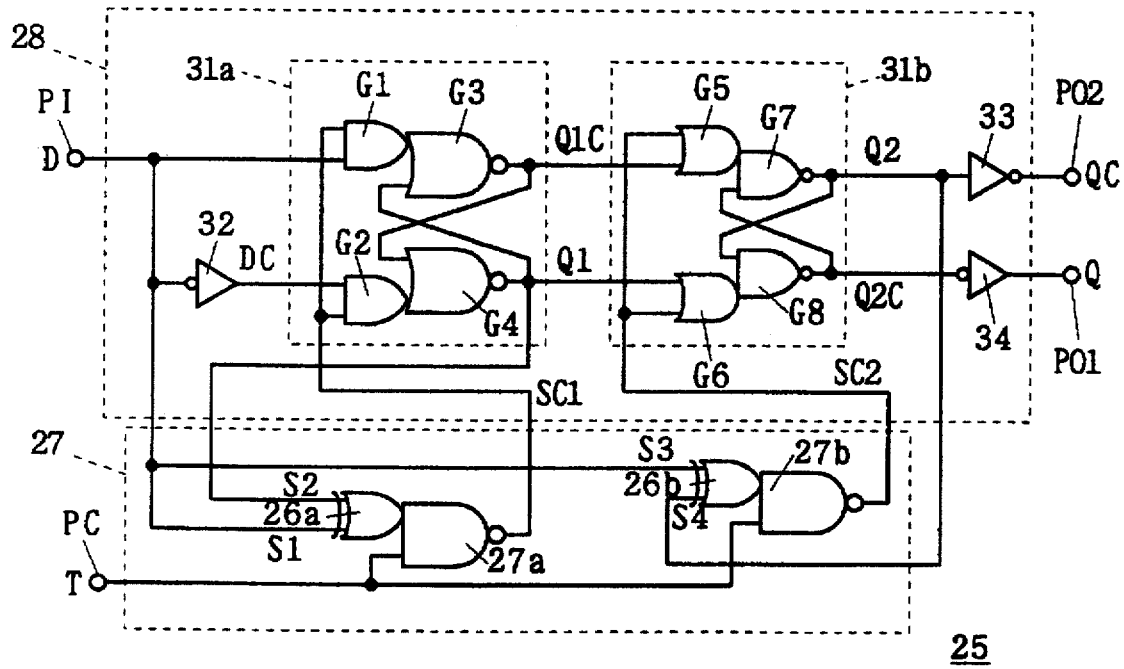
FIG. 35 is a circuit diagram showing the structure of the thirty-third preferred embodiment of the present invention.

FIG. 35 is a circuit diagram showing one unit structure of the FF 25 according to a thirty-third preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q1
Comparison data S3 . . . Input data D
Comparison data S4 . . . Internal data Q2

The correspondence relation among the comparison data S1–S4 in the thirty-third preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty-fourth Preferred Embodiment>

Figure 36:
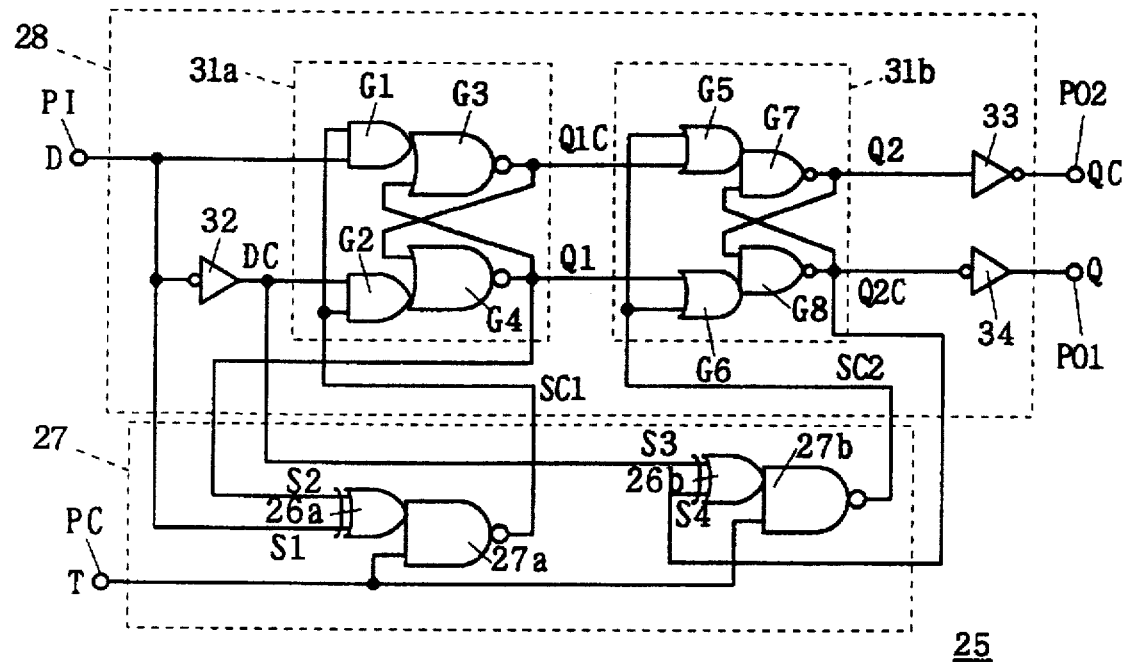
FIG. 36 is a circuit diagram showing the structure of the thirty-fourth preferred embodiment of the present invention.

FIG. 36 is a circuit diagram showing one unit structure of the FF 25 according to a thirty-fourth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q1
Comparison data S3 . . . Inverted input data DC
Comparison data S4 . . . Inverted internal data Q2C The correspondence relation among the comparison data S1–S4 in the thirty-fourth preferred embodiment corresponds to [Table 13, Table 14], and it has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty-fifth Preferred Embodiment>

Figure 37:
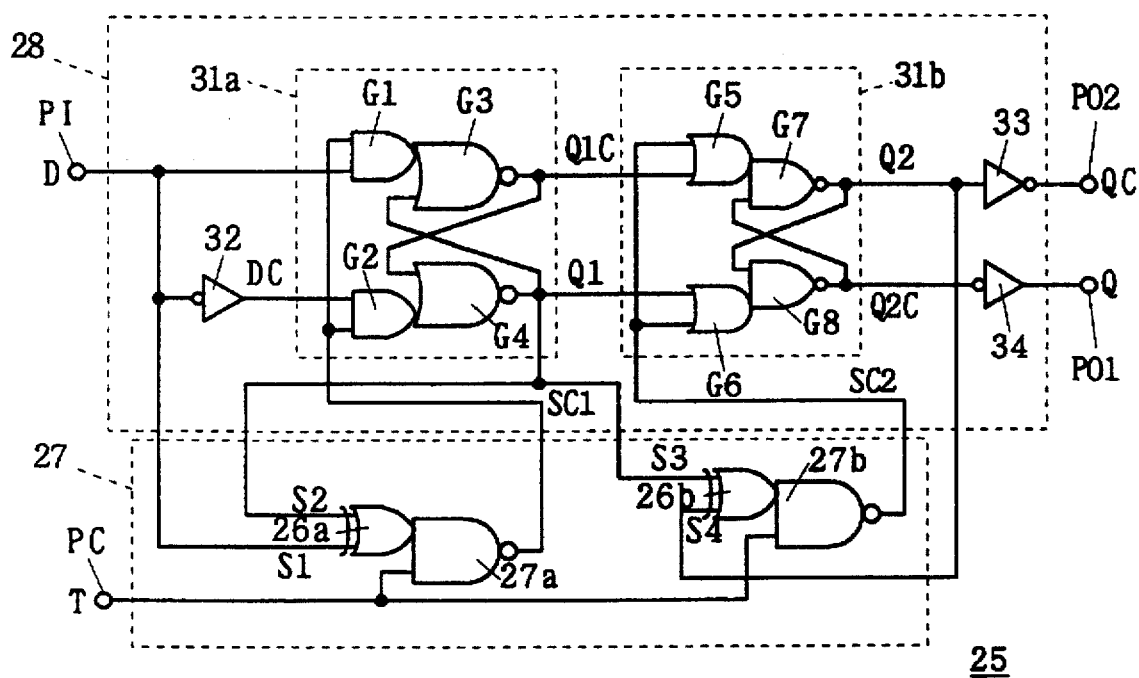
FIG. 37 is a circuit diagram showing the structure of the thirty-fifth preferred embodiment of the present invention.

FIG. 37 is a circuit diagram showing one unit structure of the FF 25 according to a thirty-fifth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q1
Comparison data S3 . . . Internal data Q1
Comparison data S4 . . . Internal data Q2

The correspondence relation among the comparison data S1–S4 in the thirty-fifth preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty sixth Preferred Embodiment>

Figure 38:
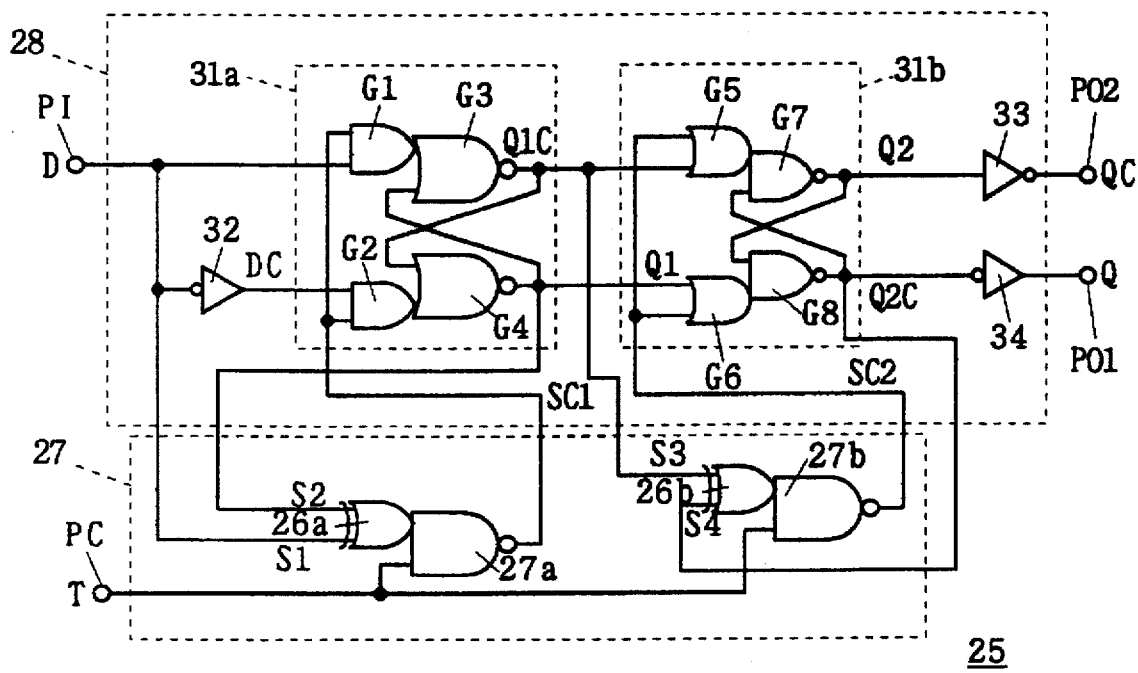
FIG. 38 is a circuit diagram showing the structure of the thirty-sixth preferred embodiment of the present invention.

FIG. 38 is a circuit diagram showing one unit structure of the FF 25 according to a thirty-sixth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q1
Comparison data S3 . . . Inverted internal data Q1C
Comparison data S4 . . . Inverted internal data Q2C The correspondence relation among the comparison data S1–S4 in the thirty-sixth preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Thirty-seventh Preferred Embodiment>

Figure 39:
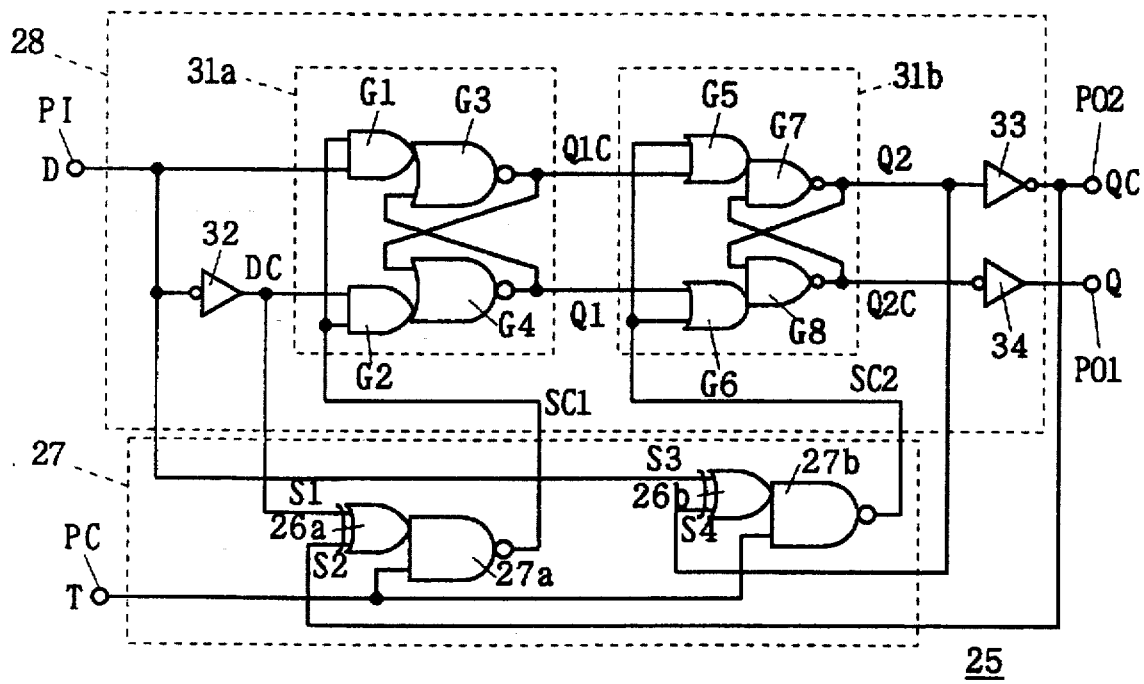
FIG. 39 is a circuit diagram showing the structure of the thirty-seventh preferred embodiment of the present invention.

FIG. 39 is a circuit diagram showing one unit structure of the FF 25 according to a thirty-seventh preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted output data QC
Comparison data S3 . . . Input data D
Comparison data S4 . . . Internal data Q2

The correspondence relation among the comparison data S1–S4 in the thirty-seventh preferred embodiment corresponds to [Table 5, Table 6], and it has the second feature. Accordingly, since the output data Q and the inverted internal data Q2C correspond to none of the comparison data S1–S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Thirty-eighth Preferred Embodiment>

Figure 40:
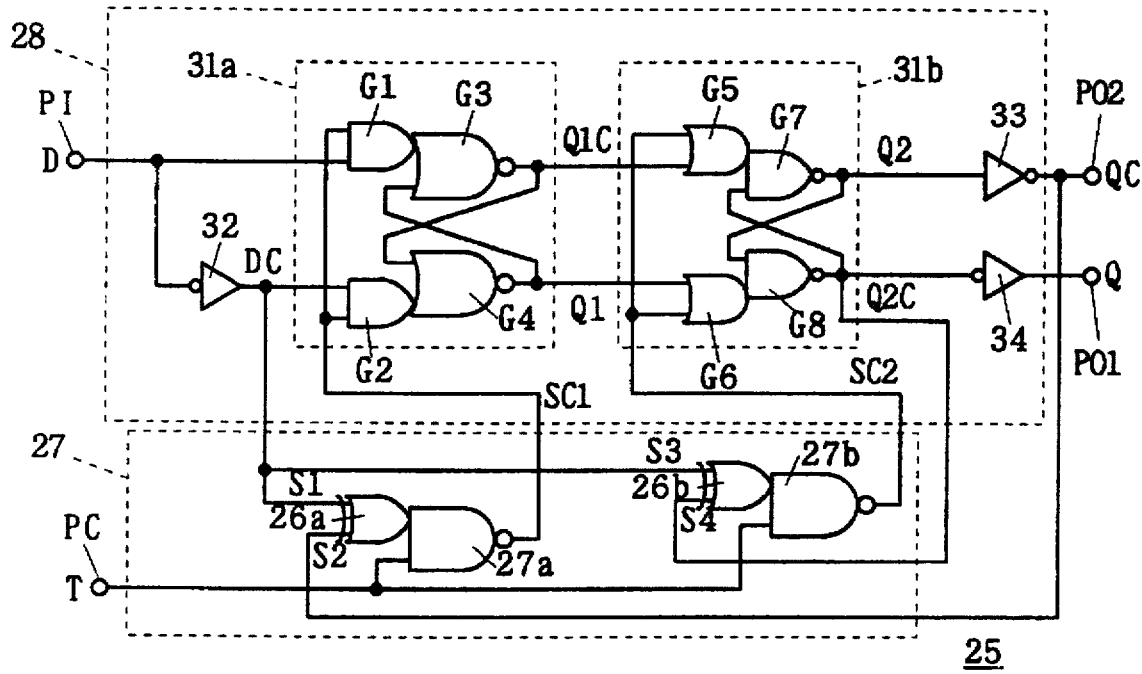
FIG. 40 is a circuit diagram showing the structure of the thirty-eighth preferred embodiment of the present invention.

FIG. 40 is a circuit diagram showing one unit structure of the FF 25 according to a thirty-eighth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted output data QC
Comparison data S3 . . . Inverted input data DC
Comparison data S4 . . . Inverted internal data Q2C The correspondence relation among the comparison data S1–S4 in the thirty-eighth preferred embodiment corresponds to [Table 3, Table 4], and it has the first feature. Accordingly, since the output data Q corresponds to none of the comparison data S1–S4, the load on the output terminal PO1 can be minimized. As a result, in addition to the low power consumption effect and the high speed operation effect of the basic structure, it has the first effect of transferring the inverted output data QC at high speed with a minimized propagation delay time even if the fan-out of the output terminal PO1 is large.

Furthermore, the correspondence relation among the comparison data S1–S4 of the thirty-eighth preferred embodiment also corresponds to [Table 11, Table 12], and it has the fifth feature, too. Accordingly, since the input data D corresponds to none of the comparison data S1–S4, the load on the input terminal PI can be minimized. As a result, it has the fifth effect of transferring the input data D at high speed with a minimized propagation delay time even if the fan-in of the input terminal PI is large in the relation with the external.

<Thirty-ninth Preferred Embodiment>

Figure 41:
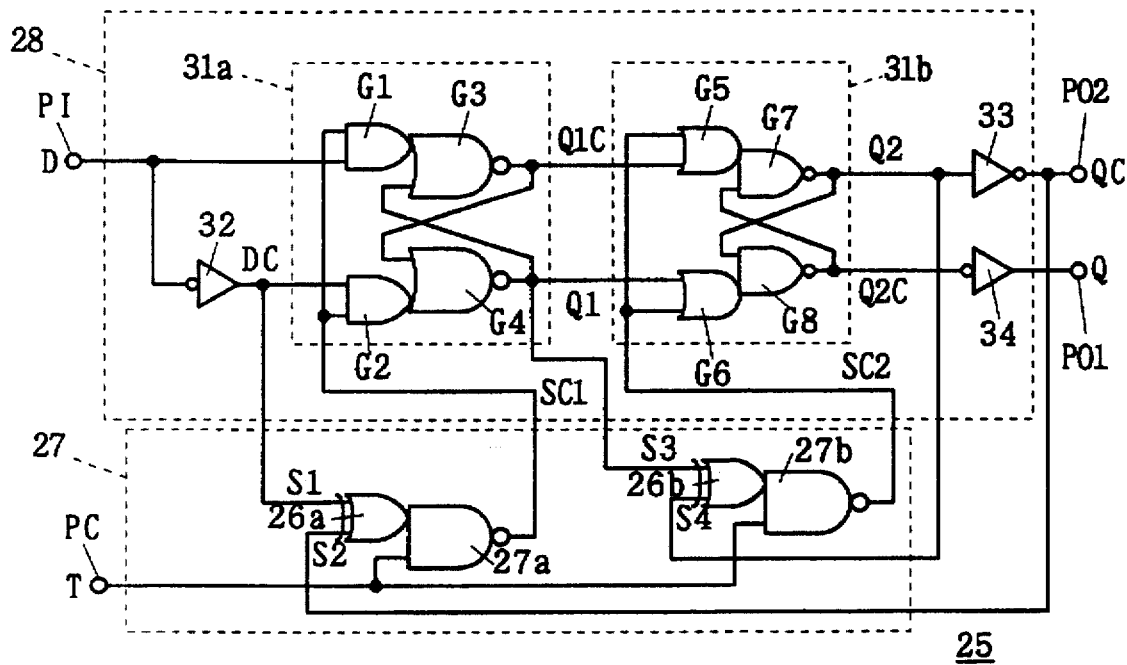
FIG. 41 is a circuit diagram showing the structure of the thirty-ninth preferred embodiment of the present invention.

FIG. 41 is a circuit diagram showing one unit structure of the FF 25 according to a thirty-ninth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted output data QC
Comparison data S3 . . . Internal data Q1
Comparison data S4 . . . Internal data Q2

The correspondence relation among the comparison data S1–S4 in the thirty-ninth preferred embodiment corresponds to [Table 5, Table 6], and it has the second feature. Accordingly, since the output data Q and the inverted internal data Q2C correspond to none of the comparison data S1–S4, the load on the output terminal PO1 can be minimized and the load put on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

Furthermore, the correspondence relation among the comparison data S1–S4 of the thirty-ninth preferred embodiment also corresponds to [Table 11, Table 12], and it has the fifth feature, too. Accordingly, since the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation with the external.

<Fortieth Preferred Embodiment>

Figure 42:
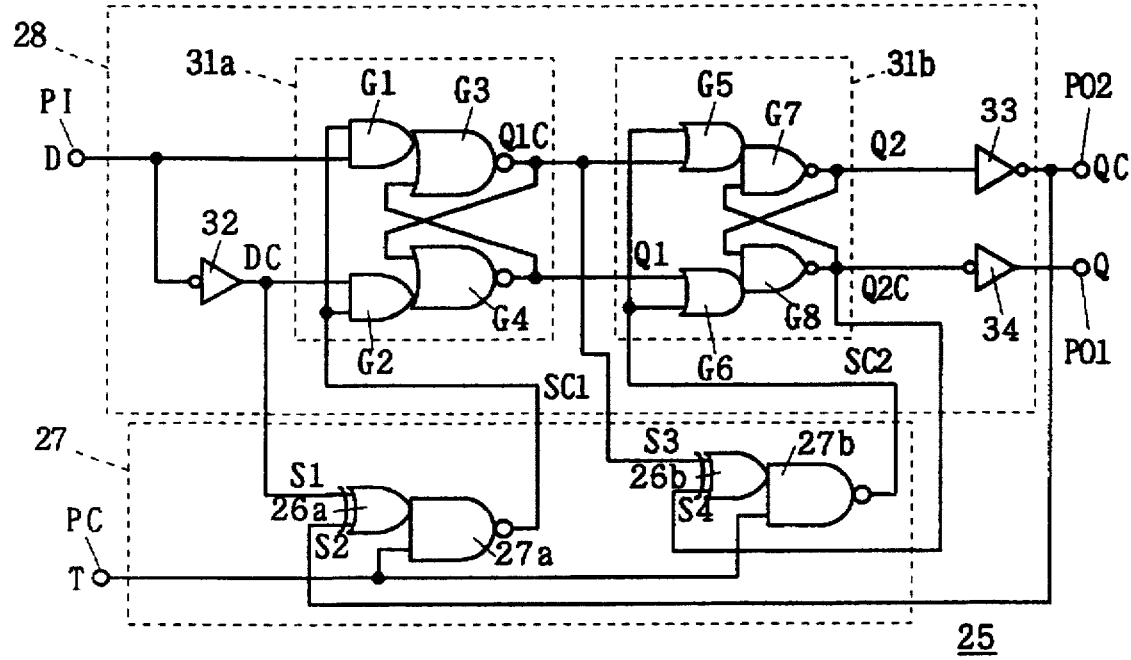
FIG. 42 is a circuit diagram showing the structure of the fortieth preferred embodiment of the present invention.

FIG. 42 is a circuit diagram showing one unit structure of the FF 25 according to a fortieth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted output data QC
Comparison data S3 . . . Inverted internal data Q1C
Comparison data S4 . . . Inverted internal data Q2C The correspondence relation among the comparison data S1–S4 in the fortieth preferred embodiment corresponds to [Table 3, Table 4], and it has the first feature. Accordingly, since the output data Q corresponds to none of the comparison data S1–S4, the load put on the output terminal PO1 can be minimized. As a result, in addition to the low power consumption effect and the high speed operation effect of the basic structure, it has the first effect of transferring the inverted output data QC at high speed with a minimized propagation delay time even if the fan-out of the output terminal PO1 is large.

Furthermore, the correspondence relation among the comparison data S1–S4 of the fortieth preferred embodiment also corresponds to [Table 11, Table 12], and it has the fifth feature, too. Accordingly, since the input data D corresponds to none of the comparison data S1–S4, the load on the input terminal PI can be minimized. As a result, it has the fifth effect of transferring the input data D at high speed with a minimized propagation delay time even if the fan-in of the input terminal PI is large in the relation with the external.

<Forty-first Preferred Embodiment>

Figure 43:
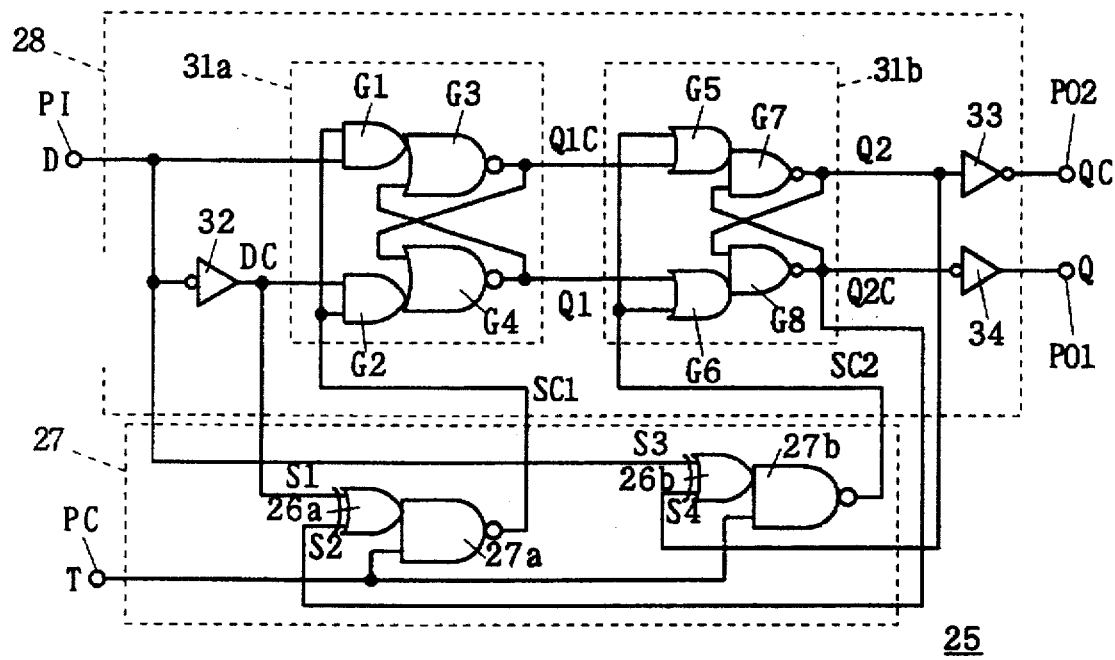
FIG. 43 is a circuit diagram showing the structure of the forty-first preferred embodiment of the present invention.

FIG. 43 is a circuit diagram showing one unit structure of the FF 25 according to a forty-first preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted internal data Q2C
Comparison data S3 . . . Input data D
Comparison data S4 . . . Internal data Q2

The correspondence relation among the comparison data S1–S4 in the forty-first preferred embodiment corresponds to [Table 13, Table 14], and it has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Forty-second Preferred Embodiment>

Figure 44:
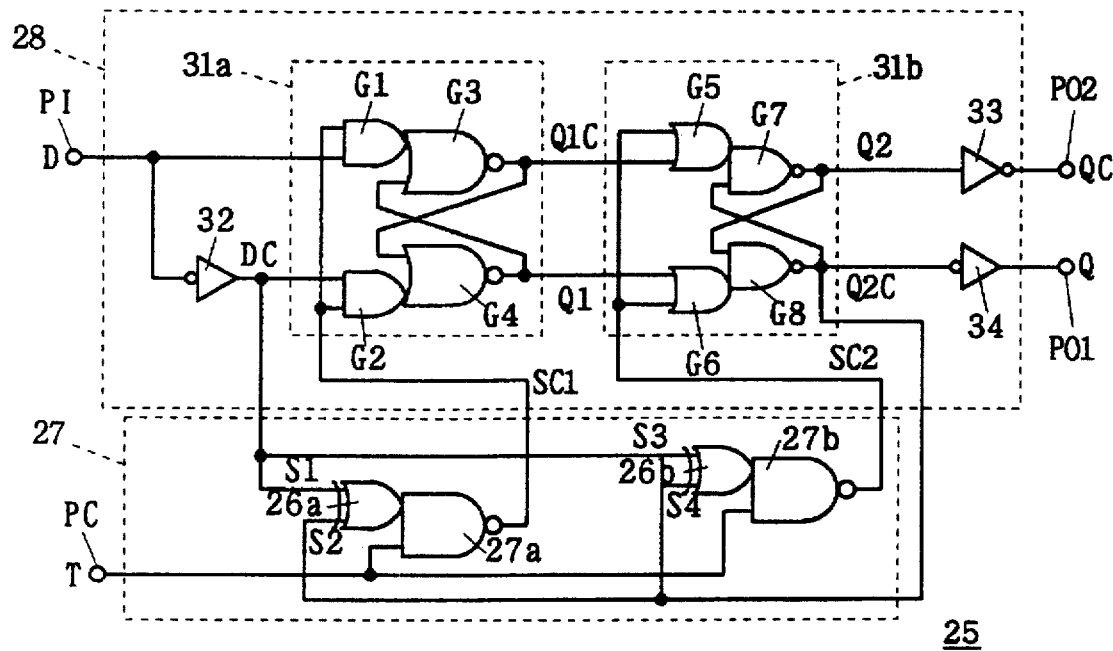
FIG. 44 is a circuit diagram showing the structure of the forty-second preferred embodiment of the present invention.

FIG. 44 is a circuit diagram showing one unit structure of the FF 25 according to a forty-second preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q2C
Comparison data S3 . . . Inverted input data DC
Comparison data S4 . . . Inverted internal data Q2C The correspondence relation among the comparison data S1–S4 in the forty-second preferred embodiment corresponds to [Table 11, Table 12], and it has the fifth feature. Accordingly, as the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the forty-second preferred embodiment also corresponds to [Table 13, Table 14], and it also has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

43

<Forty-third Preferred Embodiment>

Figure 45:
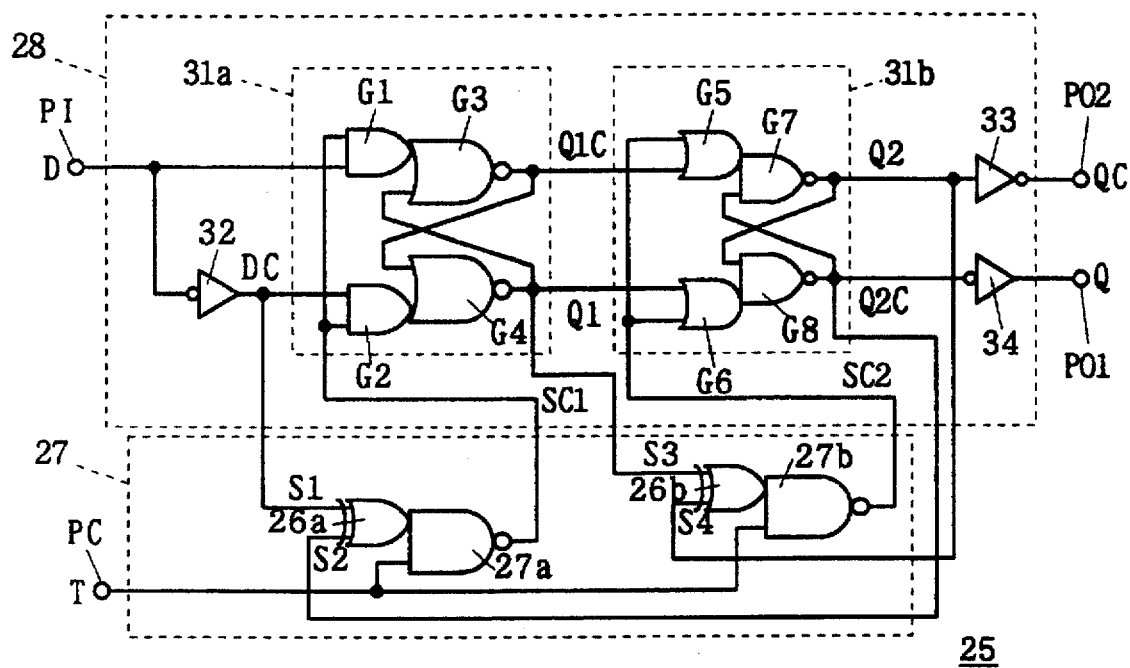
FIG. 45 is a circuit diagram showing the structure of the forty-third preferred embodiment of the present invention.

FIG. 45 is a circuit diagram showing one unit structure of the FF 25 according to a forty-third preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q2C
Comparison data S3 . . . Internal data Q1
Comparison data S4 . . . Internal data Q2

The correspondence relation among the comparison data S1–S4 of the forty-third preferred embodiment corresponds to [Table 11, Table 12], and it has the fifth feature. Accordingly, as the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the forty-third preferred embodiment also corresponds to [Table 13, Table 14], and it also has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Forty-fourth Preferred Embodiment>

Figure 46:
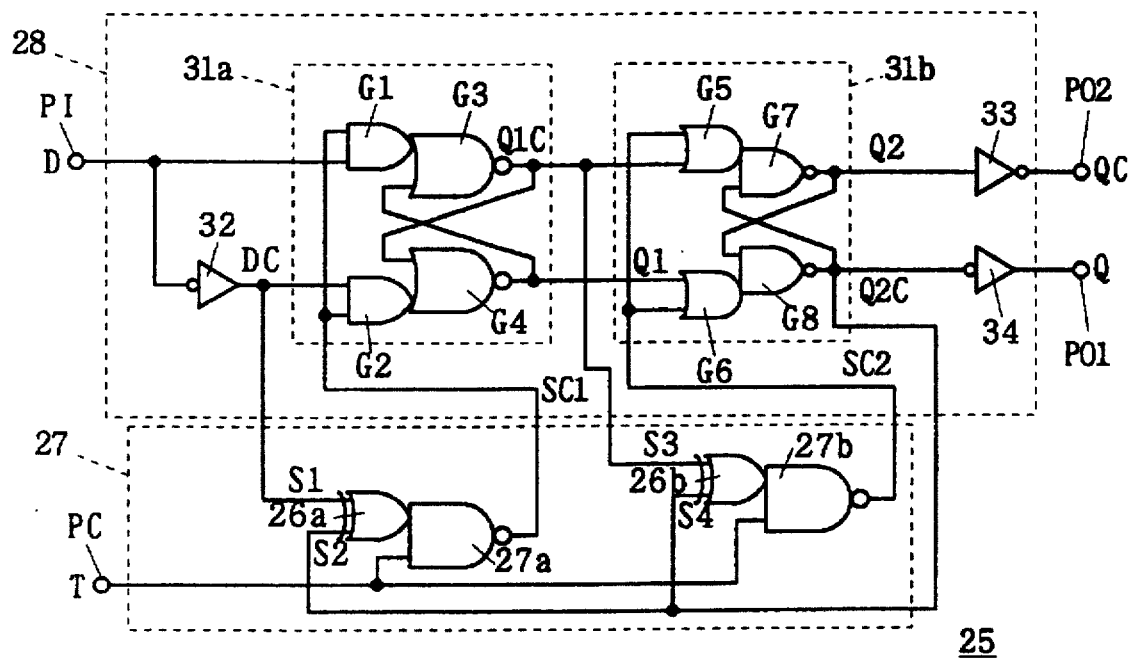
FIG. 46 is a circuit diagram showing the structure of the forty-fourth preferred embodiment of the present invention.

FIG. 46 is a circuit diagram showing one unit structure of the FF 25 according to a forty-fourth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted internal data Q2C
Comparison data S3 . . . Inverted internal data Q1C
Comparison data S4 . . . Inverted internal data Q2C The correspondence relation among the comparison data S1–S4 of the forty-fourth preferred embodiment corresponds to [Table 11, Table 12], and it has the fifth feature. Accordingly, as the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the forty-fourth preferred embodiment also corresponds to [Table 13, Table 14], and it has the sixth feature, too. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it has the seventh effect of eliminating a signal propagation delay between the output data Q and the inverted output data QC when the output terminal PO1 and the output terminal PO2 have equal fan-out in the relation with the external.

<Forty-fifth Preferred Embodiment>

Figure 47:
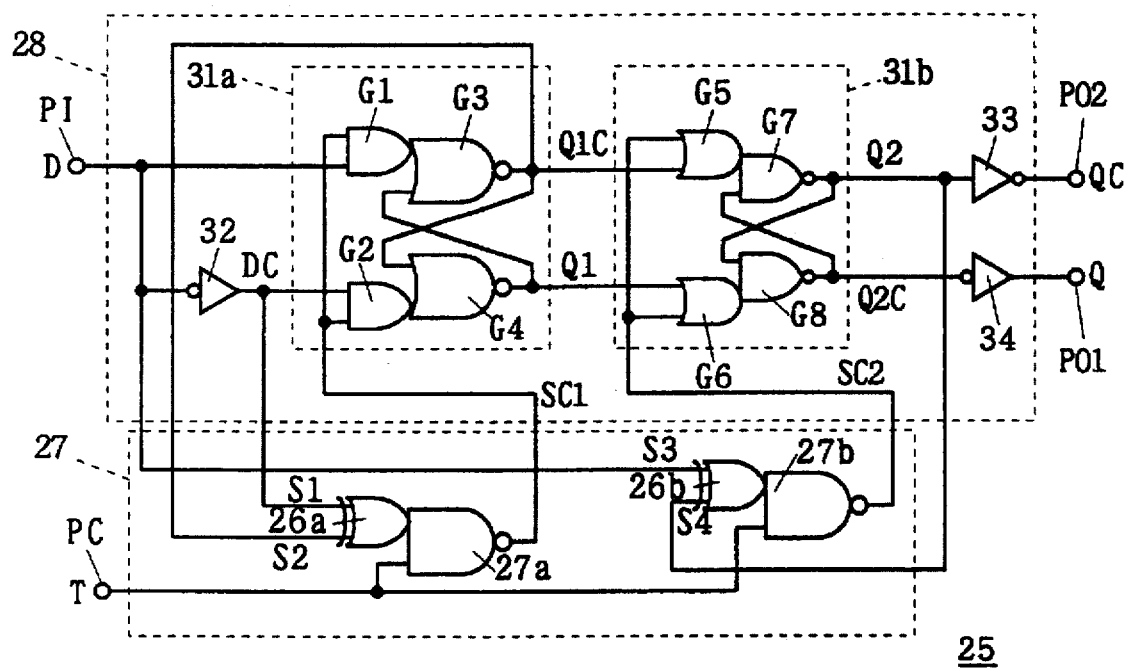
FIG. 47 is a circuit diagram showing the structure of the forty-fifth preferred embodiment of the present invention.

FIG. 47 is a circuit diagram showing one unit structure of the FF 25 according to a forty-fifth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Input data D
Comparison data S4 . . . Internal data Q2

The correspondence relation among the comparison data S1–S4 in the forty-fifth preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Forty-sixth Preferred Embodiment>

Figure 48:
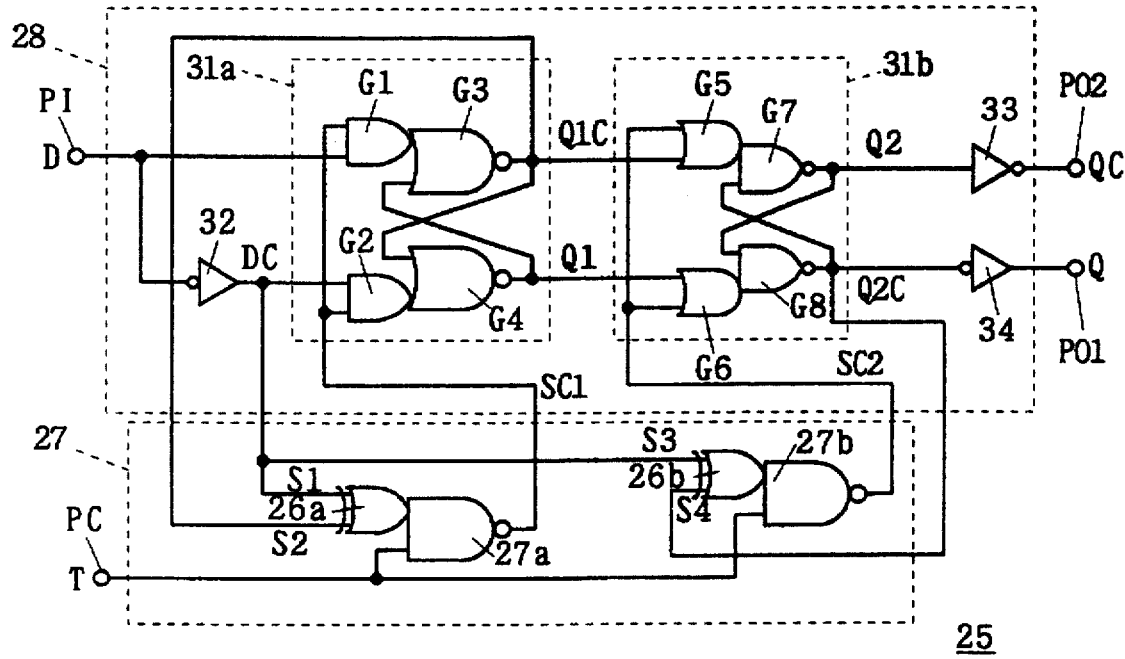
FIG. 48 is a circuit diagram showing the structure of the forty-sixth preferred embodiment of the present invention.

FIG. 48 is a circuit diagram showing one unit structure of the FF 25 according to a forty-sixth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Inverted input data DC
Comparison data S2 . . . Inverted internal data Q1C
Comparison data S3 . . . Inverted input data DC
Comparison data S4 . . . Inverted internal data Q2C The correspondence relation among the comparison data S1–S4 of the forty-sixth preferred embodiment corresponds to [Table 11, Table 12], and it has the fifth feature. Accordingly, as the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the forty-sixth preferred embodiment also corresponds to [Table 13, Table 14], and it has the sixth feature, too. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Forty-seventh Preferred Embodiment>

Figure 49:
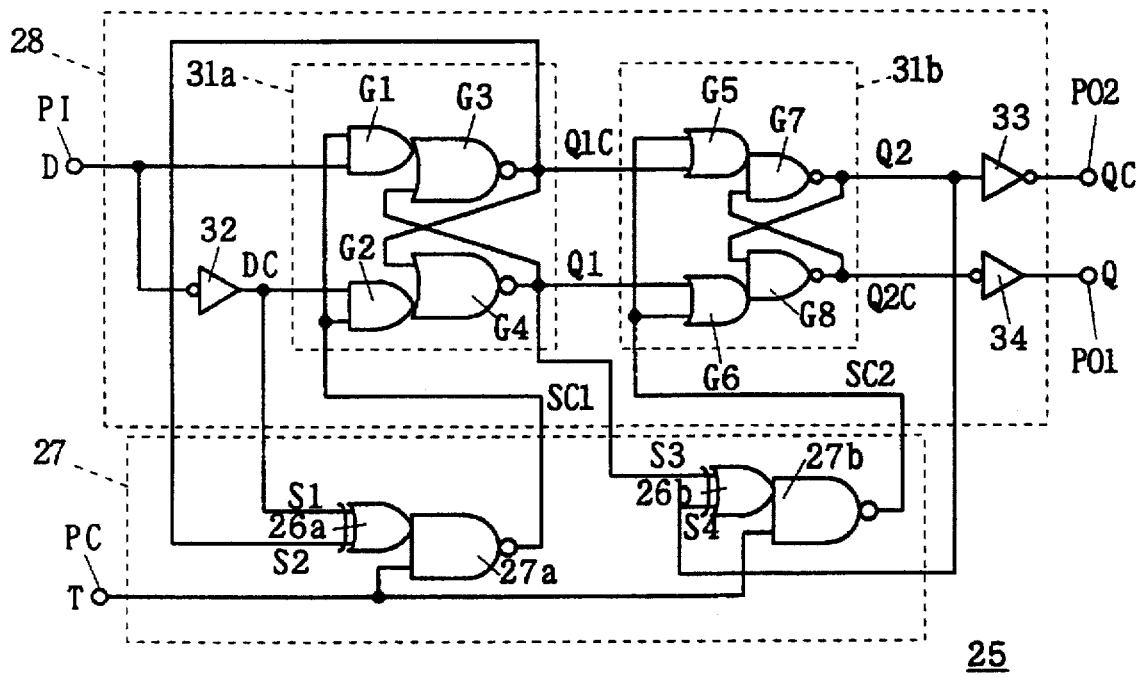
FIG. 49 is a circuit diagram showing the structure of the forty-seventh preferred embodiment of the present invention.

FIG. 49 is a circuit diagram showing one unit structure of the FF 25 according to a forty-seventh preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC

Comparison data S2 . . . Inverted internal data Q1C

Comparison data S3 . . . Internal data Q1

Comparison data S4 . . . Internal data Q2

The correspondence relation among the comparison data S1–S4 of the forty-seventh preferred embodiment corresponds to [Table 11, Table 12], and it has the fifth feature. Accordingly, as the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the forty-seventh preferred embodiment also corresponds to [Table 13, Table 14], and it has the sixth feature, too. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Forty-eighth Preferred Embodiment>

Figure 50:
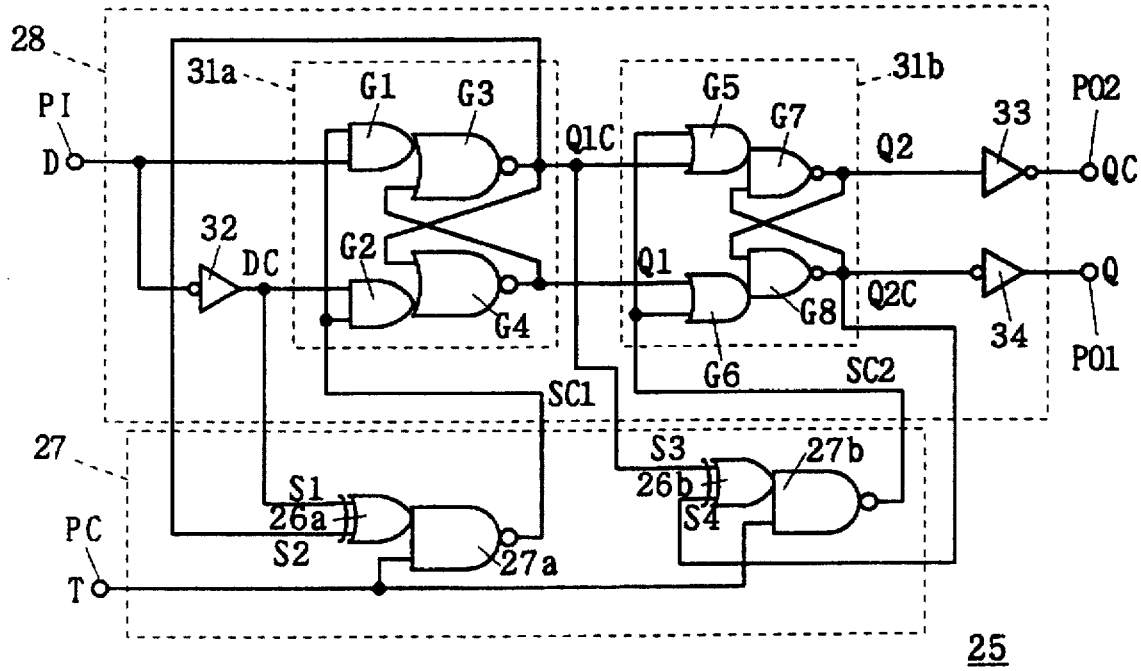
FIG. 50 is a circuit diagram showing the structure of the forty-eighth preferred embodiment of the present invention.

FIG. 50 is a circuit diagram showing one unit structure of the FF 25 according to a forty-eighth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC

Comparison data S2 . . . Inverted internal data Q1C

Comparison data S3 . . . Inverted internal data Q1C

Comparison data S4 . . . Inverted internal data Q2C

The correspondence relation among the comparison data S1–S4 of the forty-eighth preferred embodiment corresponds to [Table 11, Table 12], and it has the fifth feature. Accordingly, as the input data D corresponds to none of the comparison data S1–S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the forty-eighth preferred embodiment also corresponds to [Table 13, Table 14], and it has the sixth feature, too. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Forty-ninth Preferred Embodiment>

Figure 51:
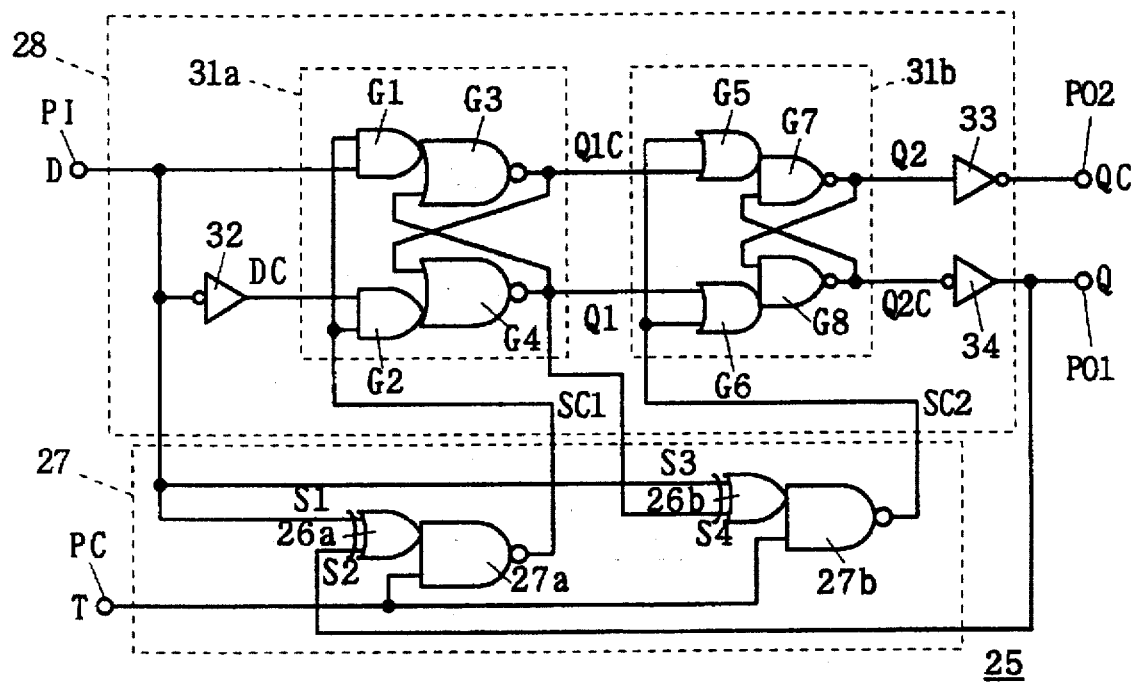
FIG. 51 is a circuit diagram showing the structure of the forty-ninth preferred embodiment of the present invention.

FIG. 51 is a circuit diagram showing one unit structure of the FF 25 according to a forty-ninth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D

Comparison data S2 . . . Output data Q

Comparison data S3 . . . Input data D

Comparison data S4 . . . Internal data Q1

The correspondence relation among the comparison data S1–S4 in the forty-ninth preferred embodiment corresponds to [Table 9, Table 10], and it has the fourth feature. Accordingly, since the inverted output data QC and the internal data Q2 correspond to none of the comparison data S1–S4, the load put on the output terminal PO2 can be minimized and the load put on the input/output of the inverter can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Fiftieth Preferred Embodiment>

Figure 52:
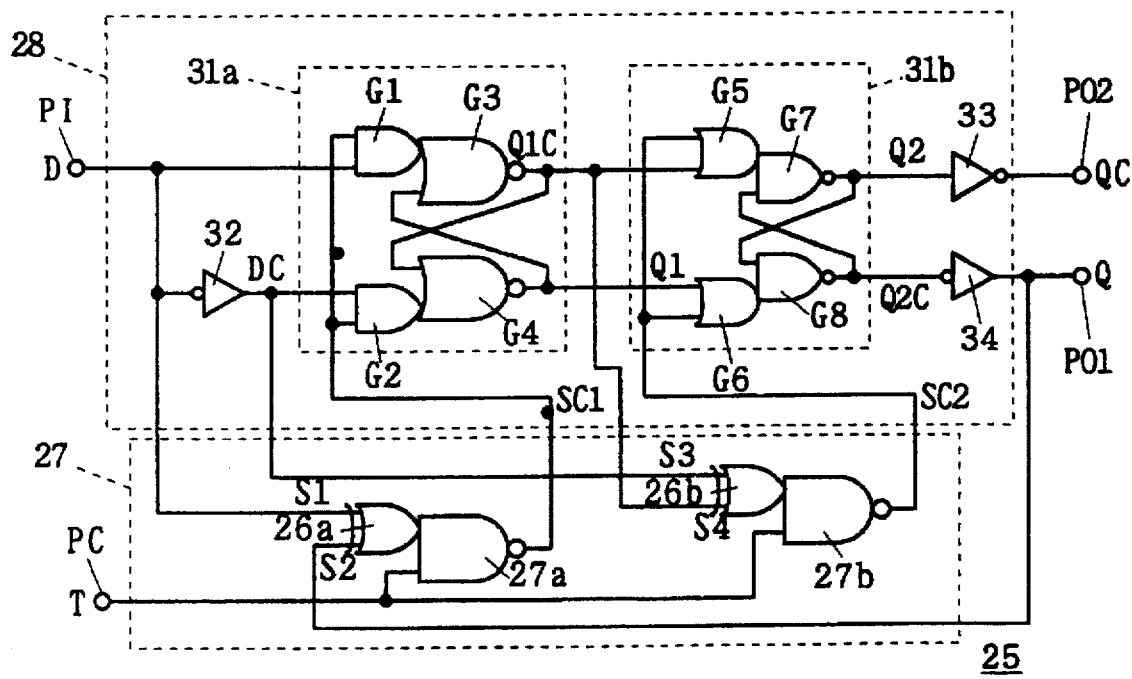
FIG. 52 is a circuit diagram showing the structure of the fiftieth preferred embodiment of the present invention.

FIG. 52 is a circuit diagram showing one unit structure of the FF 25 according to a fiftieth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Output data Q
Comparison data S3 . . . Inverted input data DC
Comparison data S4 . . . Inverted internal data Q1C The correspondence relation among the comparison data S1–S4 in the fiftieth preferred embodiment corresponds to [Table 9, Table 10], and it has the fourth feature. Accordingly, since the inverted output data QC and the internal data Q2 correspond to none of the comparison data S1–S4, the load on the output terminal PO2 can be minimized and the load on the input/output of the inverter 33 can also be minimized. As a result, in addition to the low power consumption effect and the high speed operation effect of the basic structure, it has the third and fourth effects of transferring the inverted output data QC at still higher speed with a minimized propagation delay time even if the fan-out of the output terminal PO2 is large.

<Fifty-first Preferred Embodiment>

Figure 53:
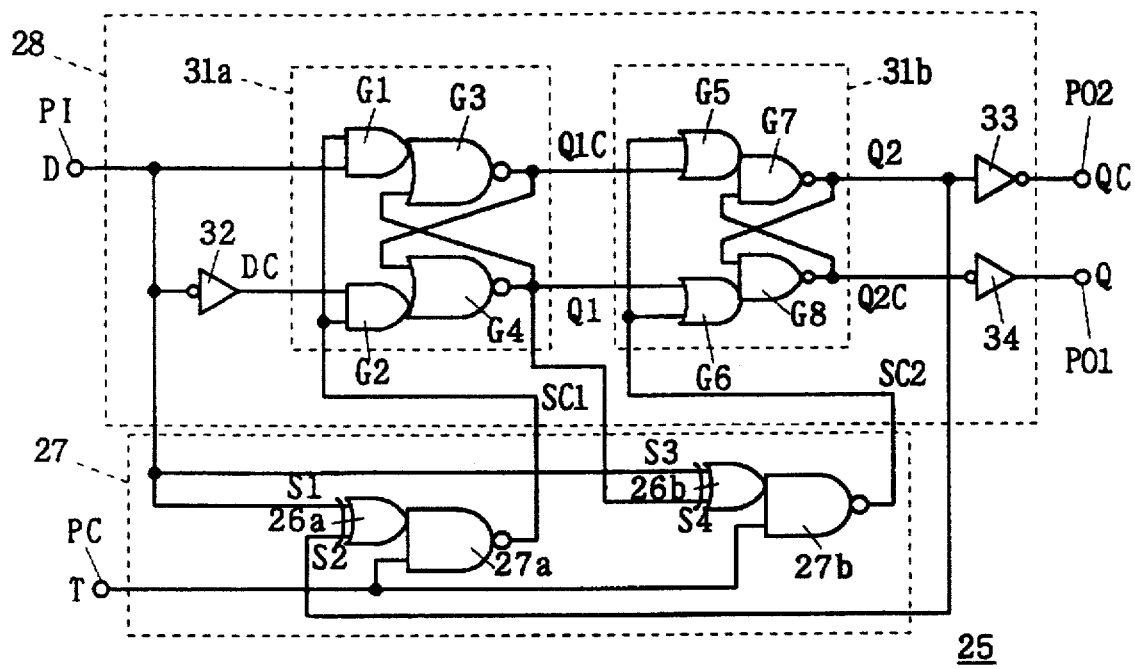
FIG. 53 is a circuit diagram showing the structure of the fifty-first preferred embodiment of the present invention.

FIG. 53 is a circuit diagram showing one unit structure of the FF 25 according to a fifty-first preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Internal data Q2
Comparison data S3 . . . Input data D
Comparison data S4 . . . Internal data Q1

The correspondence relation among the comparison data S1–S4 in the fifty-first preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Fifty-second Preferred Embodiment>

Figure 54:
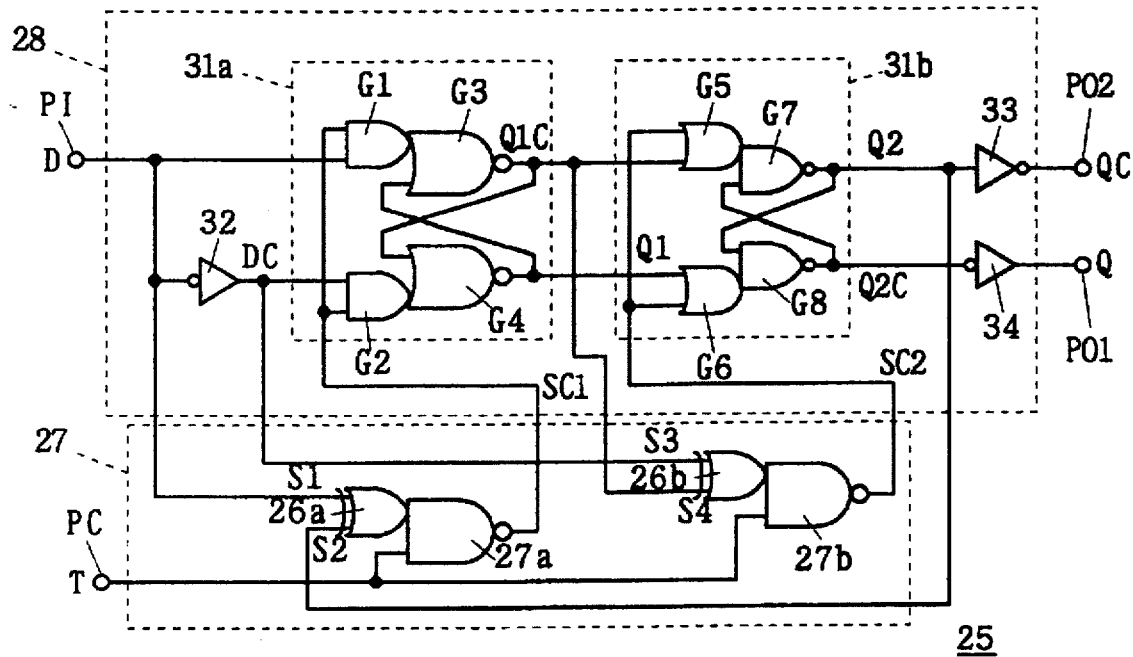
FIG. 54 is a circuit diagram showing the structure of the fifty-second preferred embodiment of the present invention.

FIG. 54 is a circuit diagram showing one unit structure of the FF 25 according to a fifty-second preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q2
Comparison data S3 . . . Inverted input data DC
Comparison data S4 . . . Inverted internal data Q1C The correspondence relation among the comparison data S1–S4 in the fifty-second preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Fifty-third Preferred Embodiment>

Figure 55:
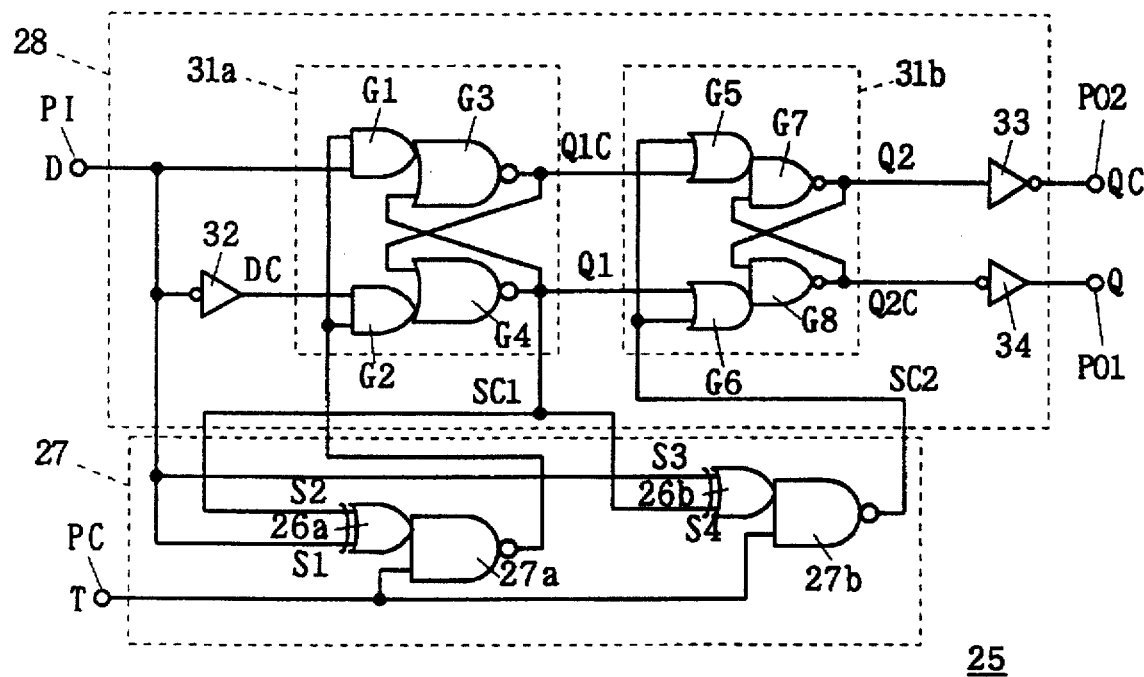
FIG. 55 is a circuit diagram showing the structure of the fifty-third preferred embodiment of the present invention.

FIG. 55 is a circuit diagram showing one unit structure of the FF 25 according to a fifty-third preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Input data D
Comparison data S2 . . . Internal data Q1
Comparison data S3 . . . Input data D
Comparison data S4 . . . Internal data Q1

The correspondence relation among the comparison data S1–S4 in the fifty-third preferred embodiment corresponds to [Table 13, Table 14], and it has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Fifty-fourth Preferred Embodiment>

Figure 56:
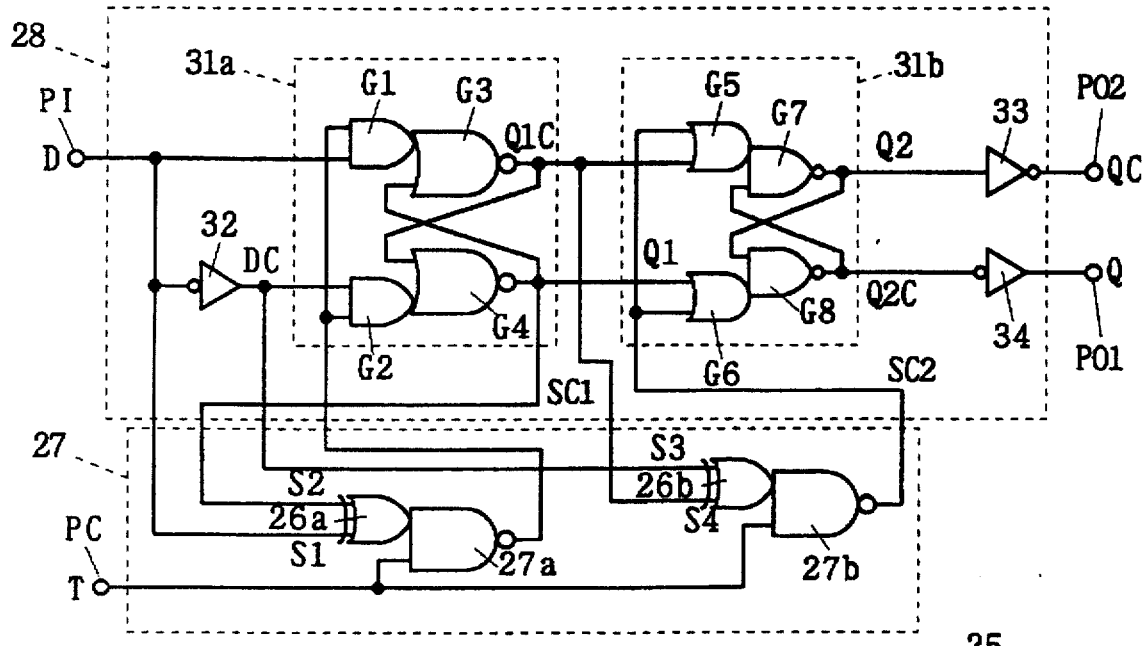
FIG. 56 is a circuit diagram showing the structure of the fifty-fourth preferred embodiment of the present invention.

FIG. 56 is a circuit diagram showing one unit structure of the FF 25 according to a fifty-fourth preferred embodiment of the present invention. The structures of the clock input control means 27 and the data holding means 28 are the same as those shown in the circuit diagram of FIG. 2.

Here, the comparison data S1–S4 are set as shown below.

Comparison data S1 . . . Input data D
Comparison data S2 . . . Output data Q
Comparison data S3 . . . Inverted input data DC
Comparison data S4 . . . Inverted internal data Q1C The correspondence relation among the comparison data S1–S4 in the fifty-fourth preferred embodiment corresponds to [Table 13, Table 14], and it has the sixth feature. Accordingly, since the output data Q and the inverted output data QC correspond to none of the comparison data S1–S4, the loads put on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Fifty-fifth Preferred Embodiment>

Figure 57:
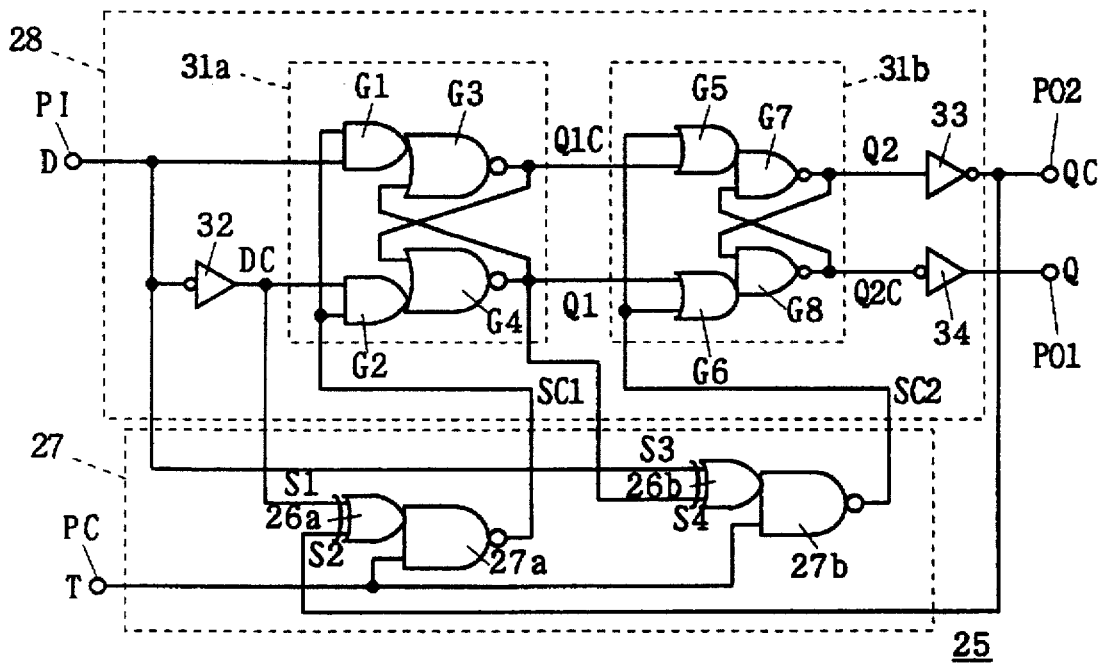
FIG. 57 is a circuit diagram showing the structure of the fifty-fifth preferred embodiment of the present invention.

FIG. 57 is a circuit diagram showing one unit structure of the FF 25 according to a fifty-fifth preferred embodiment of the present invention. The structures of the clock input control means 27 and the data holding means 28 are the same as those shown in the circuit diagram of FIG. 2.

However, the comparison data S1-S4 are set as shown below.

Comparison data S1 . . . Inverted input data DC
Comparison data S2 . . . Inverted output data QC
Comparison data S3 . . . Input data D
Comparison data S4 . . . Internal data Q1

The correspondence relation among the comparison data S1-S4 in the fifty-fifth preferred embodiment corresponds to [Table 5, Table 6], and it has the second feature. Accordingly, since the output data Q and the inverted internal data Q2C correspond to none of the comparison data S1-S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Fifty-sixth Preferred Embodiment>

Figure 58:
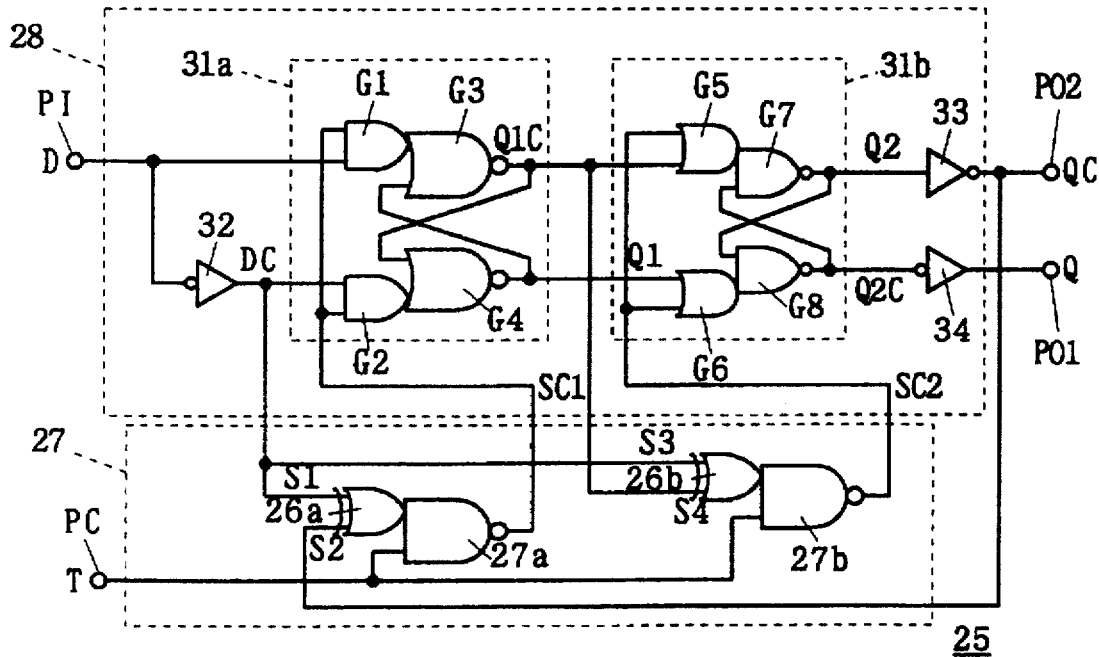
FIG. 58 is a circuit diagram showing the structure of the fifty-sixth preferred embodiment of the present invention.

FIG. 58 is a circuit diagram showing one unit structure of the FF 25 according to a fifty-sixth preferred embodiment of the present invention. The structures of the clock input control means 27 and the data holding means 28 are the same as those shown in the circuit diagram of FIG. 2.

However, the comparison data S1-S4 are set as shown below.

Comparison data S1 . . . Inverted input data DC
Comparison data S2 . . . Inverted output data QC
Comparison data S3 . . . Inverted input data DC
Comparison data S4 . . . Inverted internal data Q1C The correspondence relation among the comparison data S1-S4 in the fifty-sixth preferred embodiment corresponds to [Table 5, Table 6], and it has the second feature. Accordingly, since the output data Q and the inverted internal data Q2C correspond to none of the comparison data S1-S4, the load on the output terminal PO1 can be minimized and the load on the input/output of the inverter 34 can also be minimized. As a result, in addition to the low power consumption effect and the high speed operation effect of the basic structure, it has the first and second effects of transferring the inverted output data QC at still higher speed with a minimized propagation delay time even if the fan-out of the output terminal PO1 is large.

<Fifty-seventh Preferred Embodiment>

Figure 59:
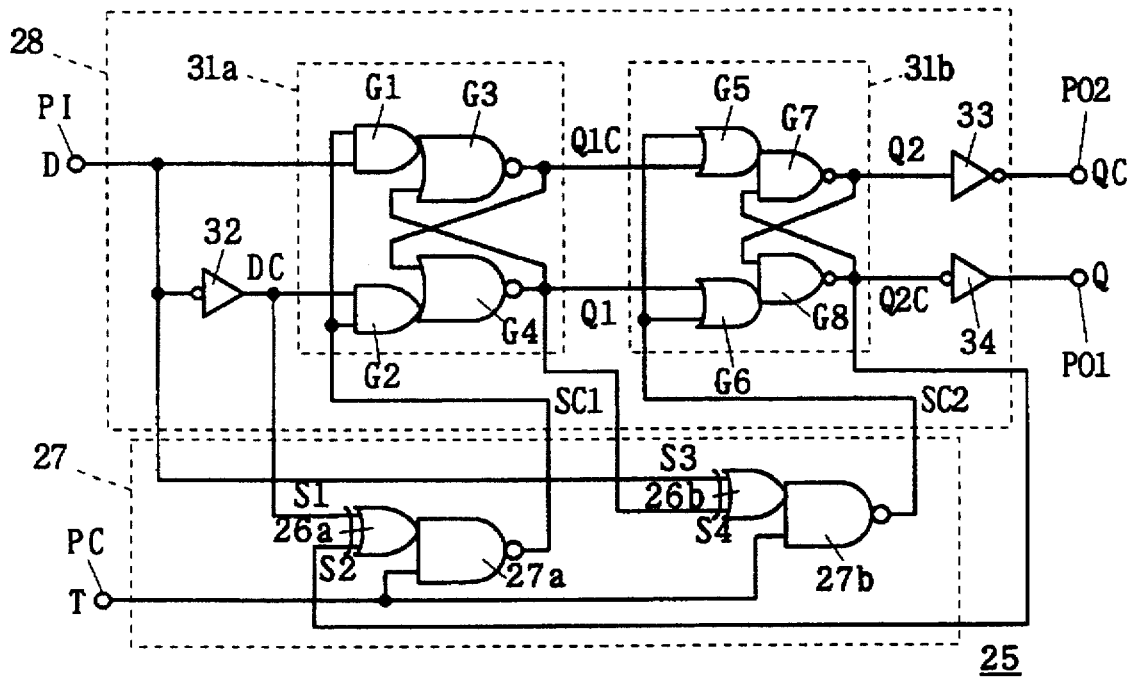
FIG. 59 is a circuit diagram showing the structure of the fifty-seventh preferred embodiment of the present invention.

FIG. 59 is a circuit diagram showing one unit structure of the FF 25 according to a fifty-seventh preferred embodiment of the present invention. The structures of the clock input control means 27 and the data holding means 28 are the same as those shown in the circuit diagram of FIG. 2.

Here, the comparison data S1-S4 are set as shown below.

Comparison data S1 . . . Inverted input data DC
Comparison data S2 . . . Inverted internal data Q2C
Comparison data S3 . . . Input data D
Comparison data S4 . . . Internal data Q1

The correspondence relation among the comparison data S1-S4 in the fifty-seventh preferred embodiment corresponds to [Table 13, Table 14], and it has the sixth feature. Accordingly, since the output data Q and the inverted output data QC correspond to none of the comparison data S1-S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Fifty-eighth Preferred Embodiment>

Figure 60:
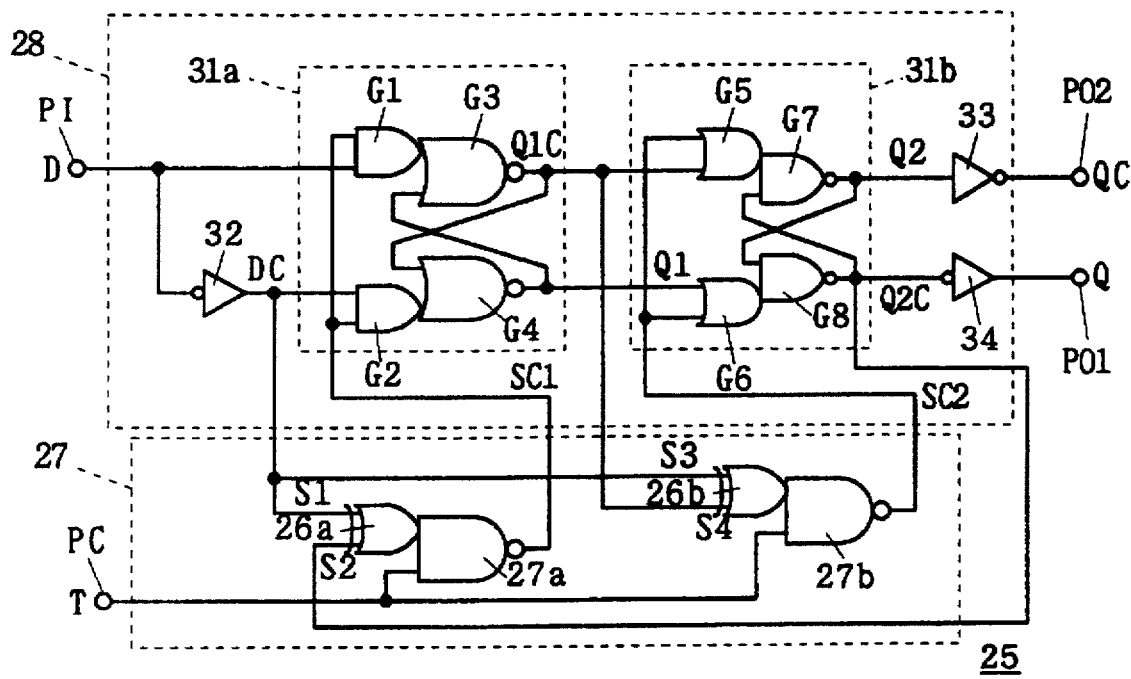
FIG. 60 is a circuit diagram showing the structure of the fifty-eighth preferred embodiment of the present invention.

FIG. 60 is a circuit diagram showing one unit structure of the FF 25 according to a fifty-eighth preferred embodiment of the present invention. The structures of the clock input control means 27 and the data holding means 28 are the same as those shown in the circuit diagram of FIG. 2.

However, the comparison data S1-S4 are set as shown below.

Comparison data S1 . . . Inverted input data DC
Comparison data S2 . . . Inverted internal data Q2C
Comparison data S3 . . . Inverted input data DC
Comparison data S4 . . . Inverted internal data Q1C The correspondence relation among the comparison data S1-S4 of the fifty-eighth preferred embodiment corresponds to [Table 11, Table 12], and it has the fifth feature. Accordingly, as the input data D corresponds to none of the comparison data S1-S4, the load put on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1-S4 in the fifty-eighth preferred embodiment also corresponds to [Table 13, Table 14], and it has the sixth feature. Accordingly, since the output data Q and the inverted output data QC correspond to none of the comparison data S1-S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Fifty-ninth Preferred Embodiment>

Figure 61:
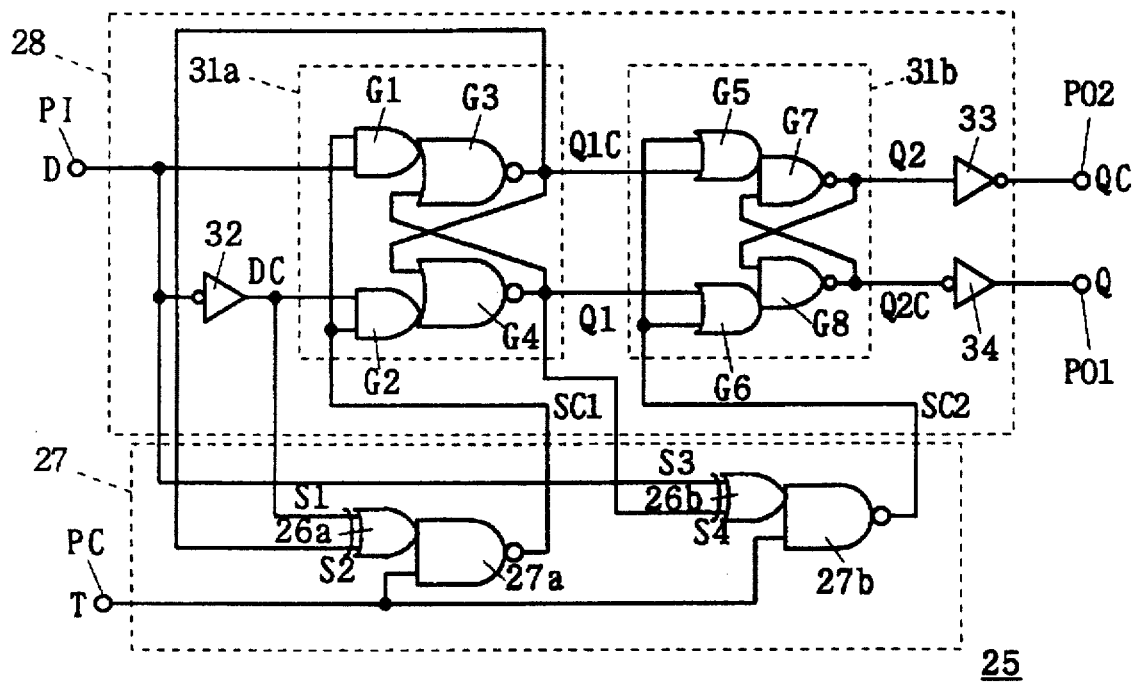
FIG. 61 is a circuit diagram showing the structure of the fifty-ninth preferred embodiment of the present invention.

FIG. 61 is a circuit diagram showing one unit structure of the FF 25 according to a fifty-ninth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Input data D
Comparison data S4 . . . Internal data Q1

The correspondence relation among the comparison data S1–S4 in the fifty-ninth preferred embodiment corresponds to [Table 13, Table 14], and it has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it also has the seventh effect of eliminating a signal propagation delay between the output data Q and the inverted output data QC when the output terminal PO1 and the output terminal PO2 have equal fan-out in the relation with the external.

<Sixtieth Preferred Embodiment>

Figure 62:
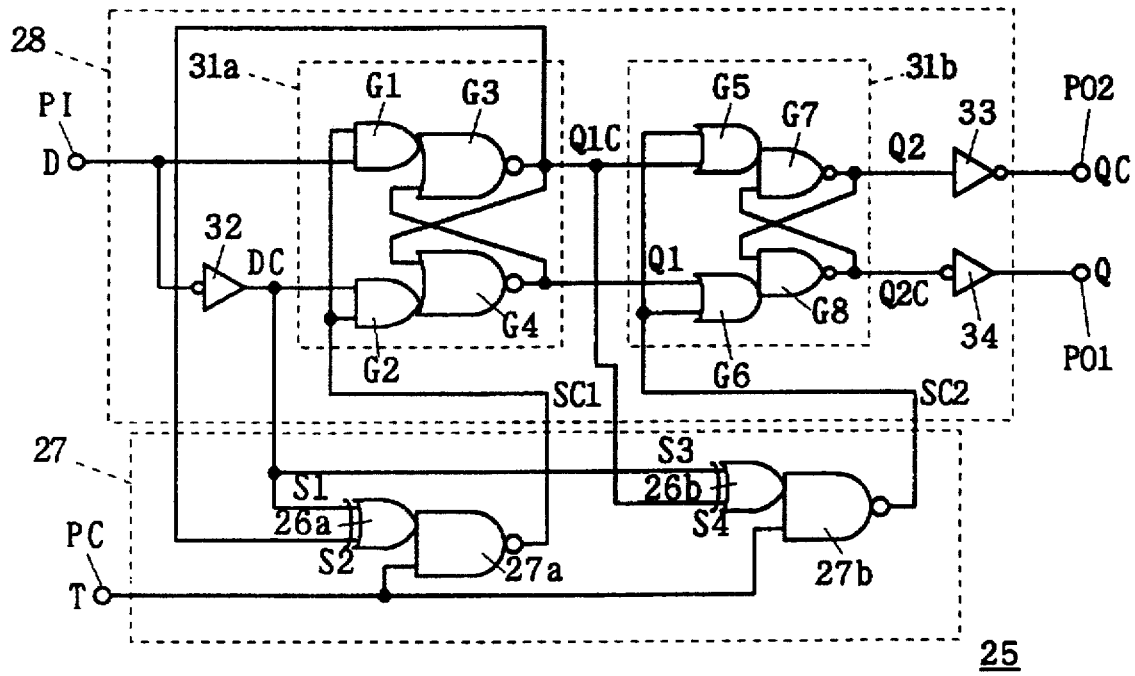
FIG. 62 is a circuit diagram showing the structure of the sixtieth preferred embodiment of the present invention.

FIG. 62 is a circuit diagram showing one unit structure of the FF 25 according to a sixtieth preferred embodiment of the present invention. The structures of the clock input control means 27 and the data holding means 28 are the same as those shown in the circuit diagram of FIG. 2.

However, the comparison data S1–S4 are set as shown below.

Comparison data S1 . . . Inverted input data DC
Comparison data S2 . . . Inverted internal data Q1C
Comparison data S3 . . . Inverted input data DC
Comparison data S4 . . . Inverted internal data Q1C The correspondence relation among the comparison data S1–S4 in the sixtieth preferred embodiment corresponds to [Table 11, Table 12], and it has the fifth feature. Accordingly, since the input data D corresponds to none of the comparison data S1–S4, the load on the input terminal PI can be minimized. As a result, it has the fifth effect of transferring the input data D at high speed with a minimized propagation delay time even if the fan-in of the input terminal PI is large in the relation to the external.

Furthermore, the correspondence relation among the comparison data S1–S4 in the sixtieth preferred embodiment also corresponds to [Table 13, Table 14], and it also has the sixth feature. Accordingly, since the output data Q and the inverted output data QC correspond to none of the comparison data S1–S4, the loads on the output terminal PO1 and the output terminal PO2 can be minimized. As a result, it has the sixth effect of transferring the output data Q and the inverted output data QC at high speed with a minimized propagation delay time even if the fan-outs of the output terminal PO1 and the output terminal PO2 are large in the relation to the external.

In addition, as equal loads are put on the output terminal PO1 and the output terminal PO2, it has the seventh effect of eliminating a signal propagation delay between the output data Q and the inverted output data QC when the output terminal PO1 and the output terminal PO2 have equal fan-out in the relation with the external.

<Sixty-first Preferred Embodiment>

Figure 63:
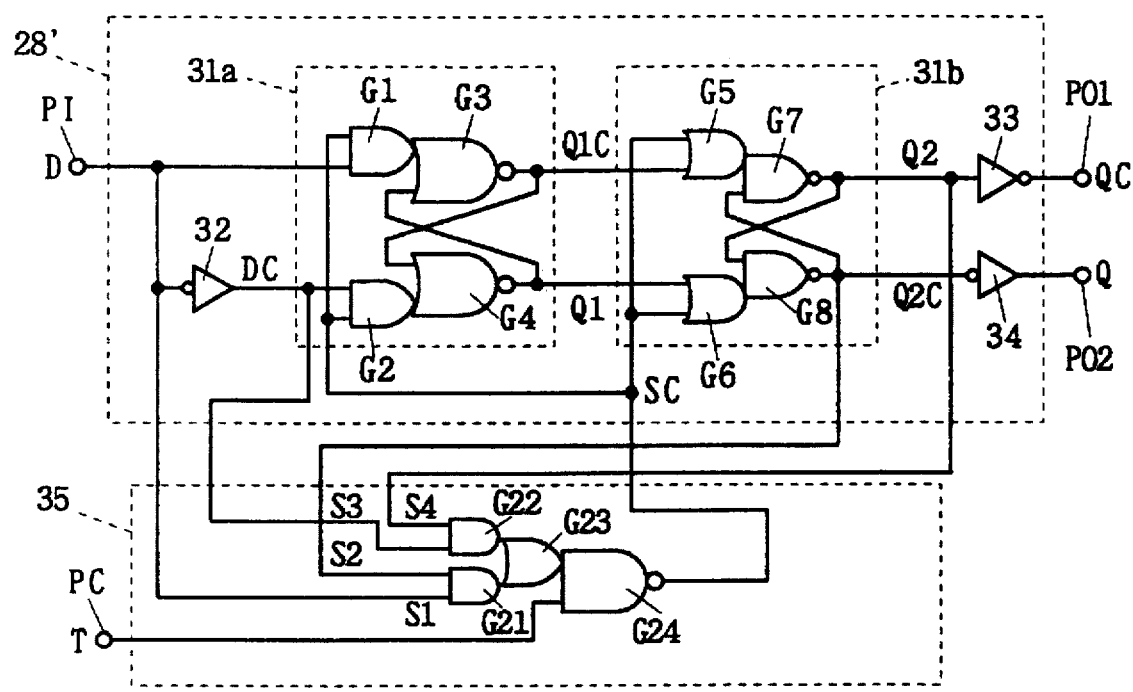
FIG. 63 is a circuit diagram showing the structure of the sixty-first preferred embodiment of the present invention.

FIG. 63 is a circuit diagram showing the structure of a sixty-first preferred embodiment. The structure shown in FIG. 63 shows a structure of one unit (for 1 bit) of the FF 25 (25a–25d) shown in FIG. 1. As shown in the figure, the FF 25 includes clock input control means 35 and data holding means 28'. It has as its external input/output terminals an input terminal PI receiving the input data D, a clock input terminal PC receiving the reference clock T, an output terminal PO1 outputting the output data Q, and an output terminal PO2 outputting the inverted output data QC.

The data holding means 28' has the same structure as that of the data holding means 28 shown in FIG. 2 except that a control signal SC is inputted in common to the AND gates G1 and G2 and the OR gates G5 and G6 in the data holding portion 31a instead of the control signal SC1 and the control signal SC2.

The clock input control means 35 includes AND gates G21, G22, an OR gate G23 and an NAND gate G24. The AND gate G21 receives the input data D as comparison data S1, which is its one input, and receives the internal data Q2 as comparison data S2, which is its other input. The AND gate G22 receives the inverted input data DC as comparison data S3 which is its one input, and receives the inverted internal data Q2C as comparison data S4 which is its other input.

The OR gate G23 receives outputs of the AND gate G21 and the AND gate G22. The NAND gate G24 serving as a clock control gate receives the output of the OR gate G23 and the reference clock T and outputs its output, a control signal SC to the AND gate G1, the AND gate G2, the OR gate G5 and the OR gate G6 as a controlling clock.

Candidates for the comparison data S1 and S3 include the input data D and the inverted input data DC. Candidates for the comparison data S2 and S4 include the internal data Q1, the internal data Q2, the output data Q, the inverted internal data Q1C, the inverted internal data Q2C and the inverted output data QC.

The comparison data S1–S4 have the relation as shown in Table 16, where if the comparison data S1 is the input data D, the comparison data S2 is one data of the inverted internal data Q1C, the inverted internal data Q2C and the inverted output data QC, the comparison data S3 is the inverted input data DC, and the comparison data S4 is one data of the internal data Q1, the internal data Q2 and the output data Q. If the comparison data S1 is the inverted input data DC, then the comparison data S2 is one data of the internal data Q1, the internal data Q2 and the output data Q, the comparison data S3 is the input data D, and the comparison data S4 is one data of the inverted internal data Q1C, the inverted internal data Q2C and the inverted output data QC.

TABLE 16

| | Comparison Data | | |
|---|---|---|---|
| S1 | S2 | S3 | S4 |
| D | Q1C | | Q1 |
| | Q2C | DC | Q2 |
| | QC | | Q |
| DC | Q1 | | Q1C |
| | Q2 | D | Q2C |
| | Q | | QC |

Accordingly, when the input data D and the output data Q (the internal data Q1, the internal data Q2) match, one of the comparison data S1 and S2 is always at "L", and one of the comparison data S3 and S4 is always at "L", so that both outputs of the AND gates 621 and G22 are at "L" and the output of the OR gate is at "L".

That is to say, when the input data D and the output data Q (the internal data Q1, the internal data Q2) match and there is no need of writing the input data D into the data holding portion 31a and the data holding portion 31b, the control signal SC is fixed at "H" and the reference clock T is made invalid.

When the input data D and the output data Q (the internal data Q1, the internal data Q2) mismatch, one of the comparison data S1 and S2, and one of the comparison data S3 and S4 are always at "H" and "H", so that the output of the OR gate G23 attains "H".

That is to say, when the input data D and the output data Q (the internal data Q1, the internal data Q2) mismatch and the input data D must be written into the data holding portion 31a and the data holding portion 31b, the reference clock T is intactly (actually an inverted value of the reference clock T) provided as the control signal SC and the data holding portions 31a and 31b are caused to perform data writing operation for the input data D in synchronization with the SC (reference clock T).

This way, in the semiconductor integrated circuit according to the sixty-first preferred embodiment, the reference clock T is provided as the control signal SC only when data writing operation by the data holding portion 31a and the data holding portion 31b is needed, and when there is no need of writing, the control signal SC is fixed to "H" and the reference clock T is made invalid. Accordingly, the semiconductor integrated circuit according to the sixty-first preferred embodiment has a low power consumption effect that it is sufficient to charge/discharge the reference clock T only for the wire capacitance of the clock signal line 4 and gate capacitance of a transistor at the input stage of the NAND gate G24 of each FF 25 when there is no need of writing.

Figure 64:
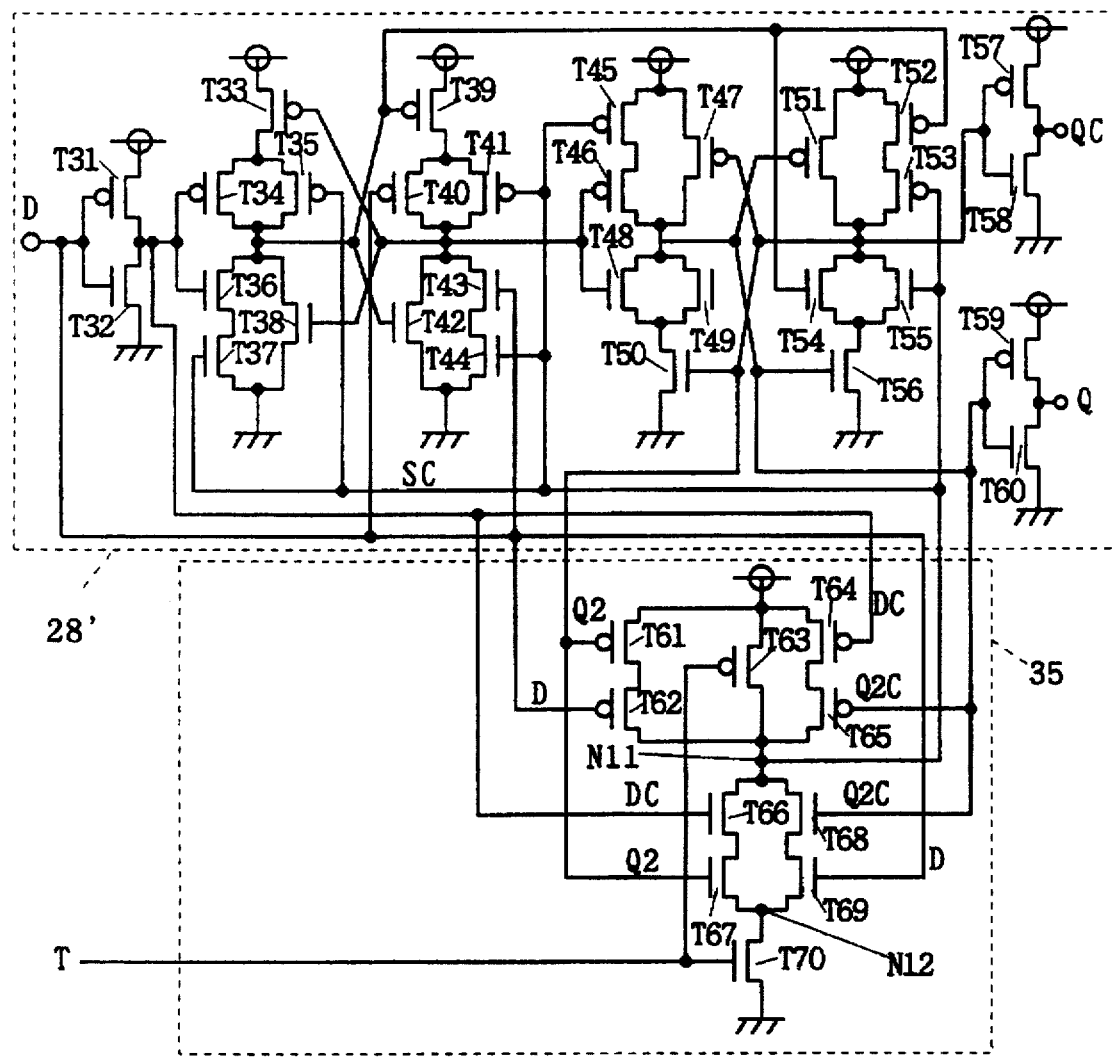
FIG. 64 is a circuit diagram showing the structure at the transistor level of the sixty-first preferred embodiment.

FIG. 64 is a circuit diagram showing the structure of the FF of FIG. 63 at the transistor level. As shown in this figure, the data holding means 28' includes transistors T31–T60. the transistors T31 and T32 form the inverter 32, the transistors T33–T38 form the AND gate G1 and the NOR gate G3, the transistors T39–T44 form the AND gate G2 and the NOR gate G4, the transistors T45–T50 form the OR gate G5 and the NAND gate G7, the transistors T51–T56 form the OR gate G6 and the NAND gate G8, the transistors T57 and T58 form the inverter 33, and the transistors T59 and T60 form the inverter 34.

The clock input control means 35 includes ten transistors T61–70. The PMOS transistors T61 and T62 are formed in series between the and the node N11 to receive the internal data Q2 and the input data D at their gates. The PMOS transistors T64 and T65 are formed in series between the power-source $V_{dd}$ and the node N11 to receive the inverted input data DC and the inverted internal data Q2C at their gates, respectively. The PMOS transistor T63 is formed between the power-source $V_{DD}$ and the node N11, and receives the reference clock T at its gate. The NMOS transistors T66 and T67 are formed in series between the nodes N11 and N12, and receives the inverted input data DC and the internal data Q2 at their gates, respectively. The NMOS transistors T68 and T69 are formed in series between the nodes N11 and N12, and receives the inverted internal data Q2C and the input data D at their gates, respectively.

This way, by forming the transistors T61–T70, the clock input control means 35 which is a combinational circuit formed of the AND gates G21, G22, the OR gate G23 and the NAND gate G24 can be manufactured with a relatively small number of transistors, thus enhancing the degree of integration.

<Sixty-second Preferred Embodiment>

Figure 65:
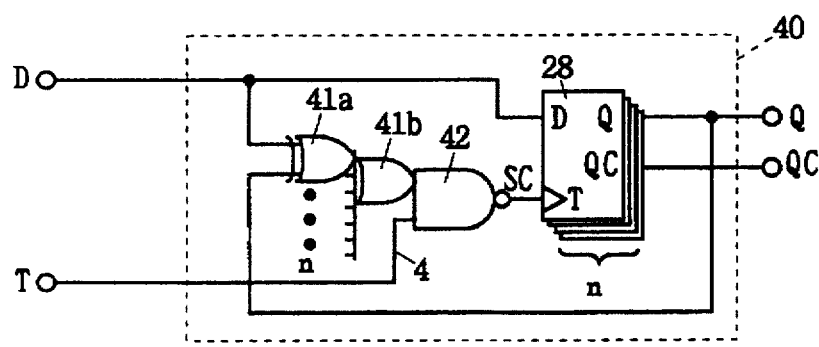
FIG. 65 is a circuit diagram showing the structure of the sixty-second preferred embodiment of the present invention.

FIG. 65 is a circuit diagram showing the structure of a sixty-second preferred embodiment of the present invention. As shown in this figure, a data holding circuit group 40 includes n data holding means 28, n exclusive OR gates 41a, one n-input OR gate 41b and one 2-input AND gate 42.

The n exclusive OR gates 41a respectively receive corresponding input data D and output data Q in the n input data D and the output data Q of the n data holding means 28. The OR gate 41b receives the outputs of the n exclusive OR gates 41a. The AND gate 42, or the clock control gate, receives the output of the OR gate 41b and the reference clock T, and provides its output to clock inputs of the data holding means 28 as a control signal SC.

The data holding circuit group 40 with such structure fixes the control signal SC, which is a controlling clock, to "L" and makes the reference clock T invalid when the n input data D and the n output data Q all agree and there is no need of writing the n input data D into the n data holding means 28.

If the n input data D and the n output data Q disagree even partially and the n input data D must be written into at least one of the n data holding means 28, the reference clock T is intactly provided as the control signal SC, and the n data holding means 28 are caused to perform data writing operation of the n input data D in synchronization with the control signal SC (reference clock T).

This way, in the semiconductor integrated circuit according to the sixty-second preferred embodiment, the reference clock T is provided as the control signal SC only when data writing operation by at least one of the n data holding means is required, and when there is no need of writing, the control signal SC is fixed at "L" and the reference clock T is made invalid. Hence, the semiconductor integrated circuit according to the sixty-second preferred embodiment has a low power consumption effect that charge/discharge of the reference clock T is made only for the wire capacitance of the clock signal line 4 and gate capacitance of a transistor serving as an input stage of the AND gate 42 when there is no need of writing.

In addition, as clock control of the n data holding means 28 is made only with one OR gate 41b and AND gate 42, it can be realized with simple circuit structure.

<Sixty-third Preferred Embodiment>

Figure 66:
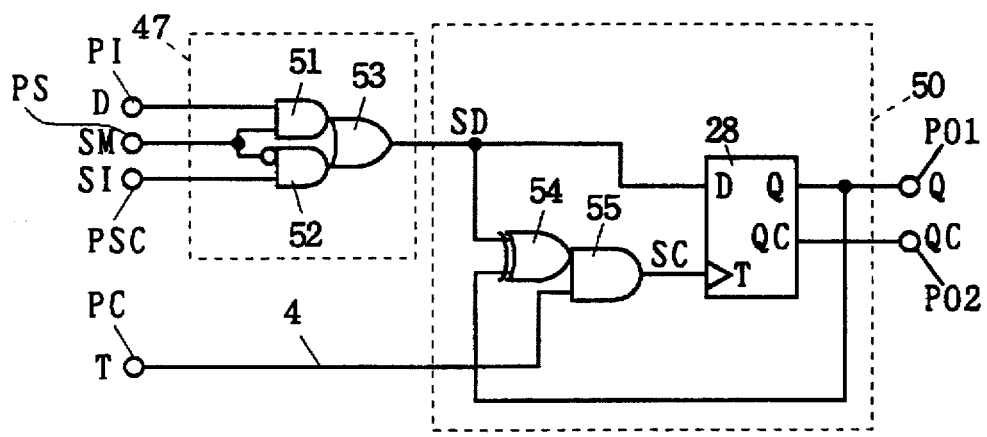
FIG. 66 is a circuit diagram showing the structure of the sixty-third preferred embodiment of the present invention.
Figure 67:
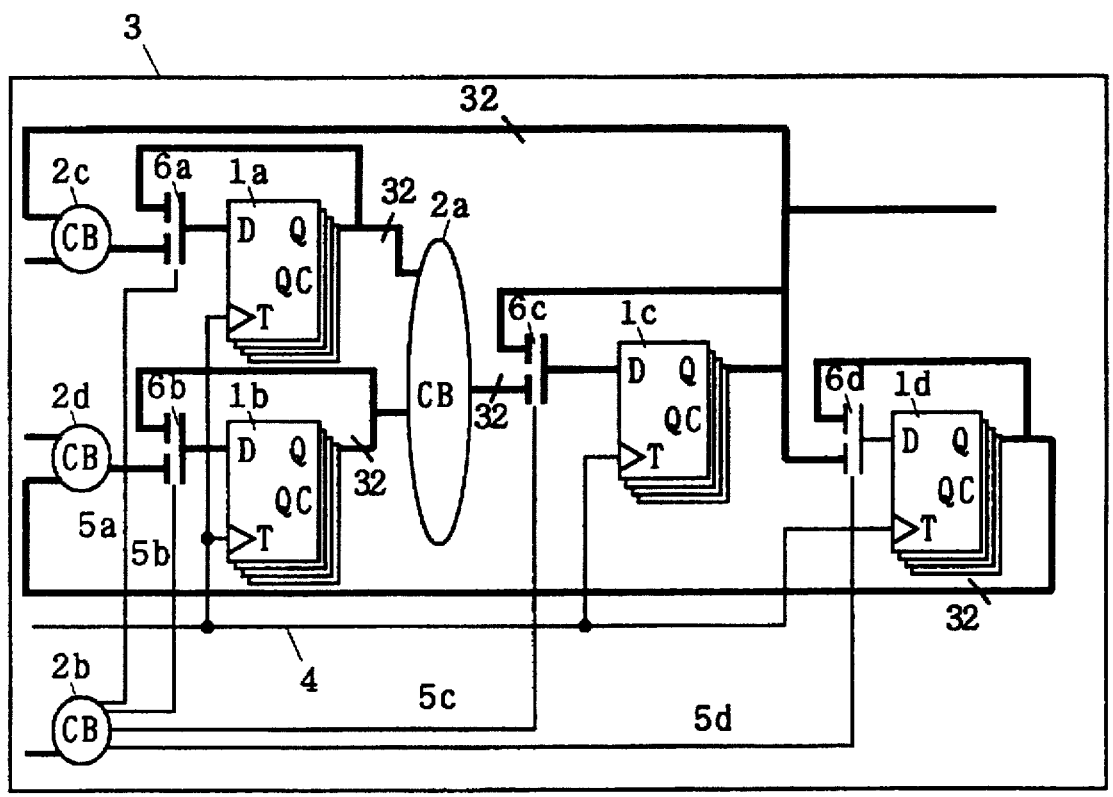
FIG. 67 is a descriptive diagram showing the structure of a conventional semiconductor integrated circuit having FF's.
Figure 68:
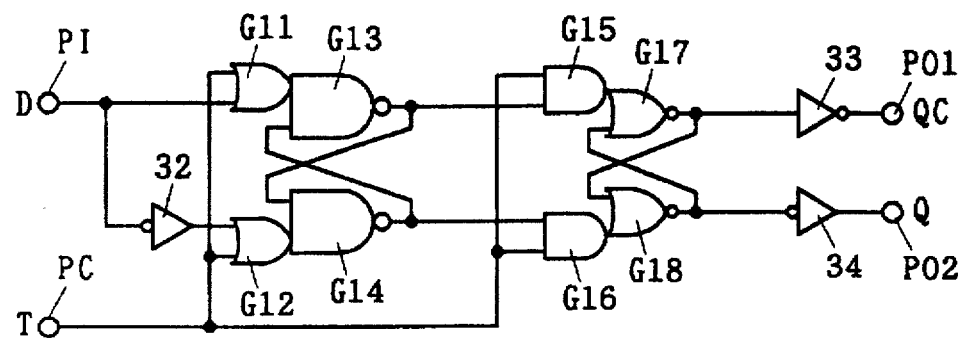
FIG. 68 is a circuit diagram showing the structure of the FF.
Figure 69:
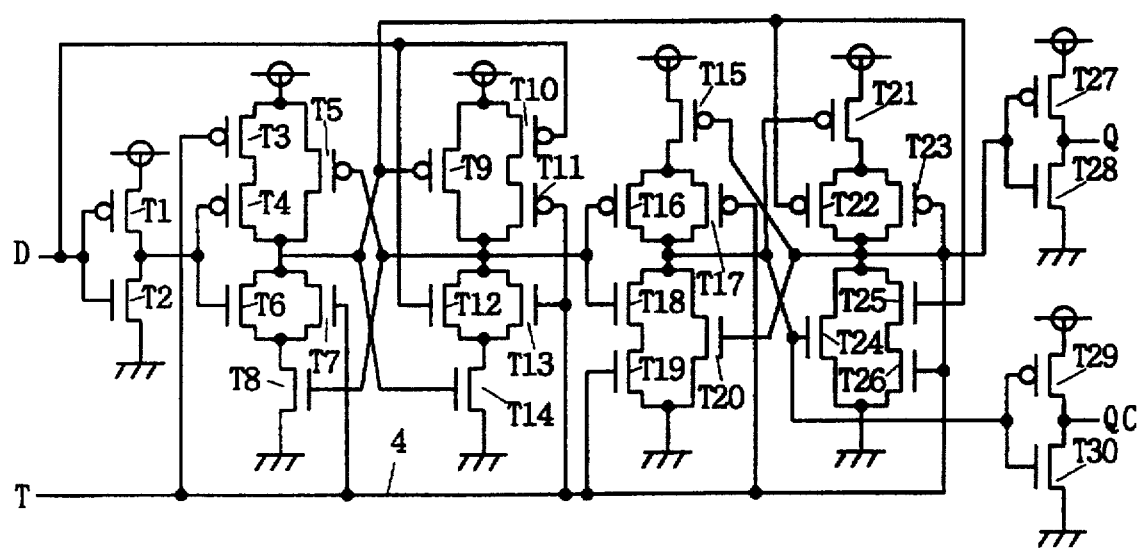
FIG. 69 is a circuit diagram showing the structure at the transistor level of the FF.
Figure 70:
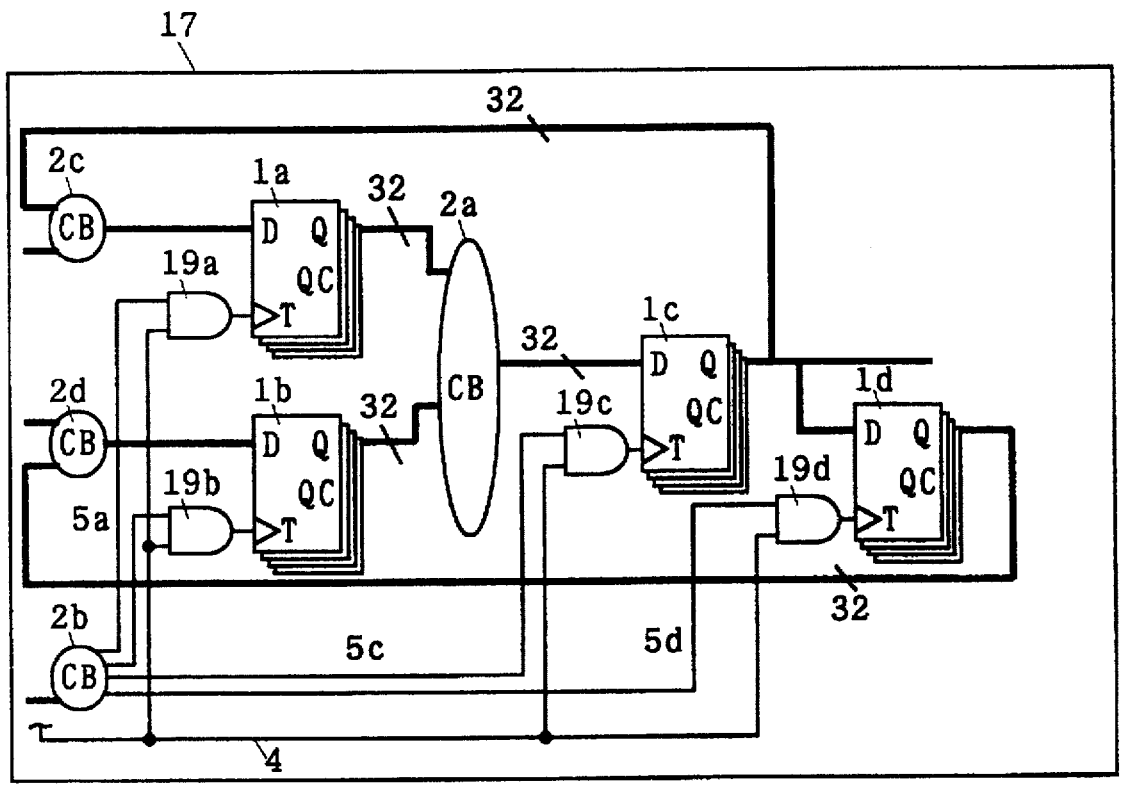
FIG. 70 is a descriptive diagram showing another structure of a conventional semiconductor integrated circuit having FF's.
Figure 71:
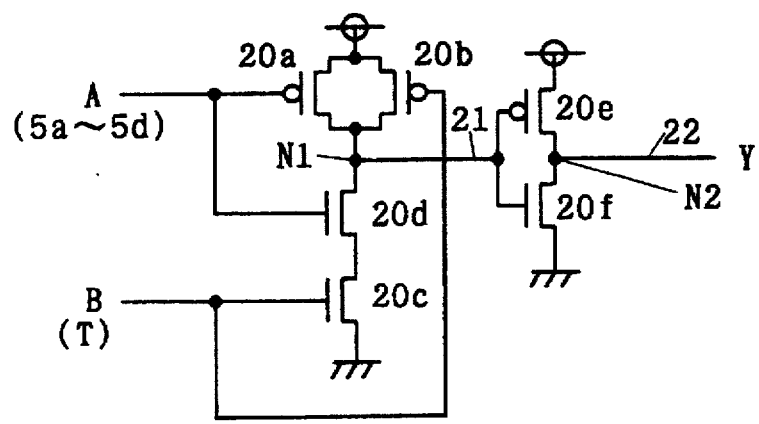
FIG. 71 is a circuit diagram showing the internal structure of the AND gate of FIG. 70.

FIG. 66 is a circuit diagram showing the structure of a semiconductor integrated circuit according to a sixty-third preferred embodiment of the present invention. As shown in this figure, the sixty-third preferred embodiment includes an FF 50 and a data selecting circuit 47. The FF 50 includes data holding means 28, an exclusive OR gate 54 and an AND gate 55. The exclusive OR gate 54 receives selection data SD and output data Q of the data holding means 28, and the AND gate 55 receives the output of the exclusive OR gate 54 and the reference clock T. The data holding means 28 receives the selection data SD as input data and receives the control signal SC, which is an output of the AND gate 55, at its clock input.

The data selecting circuit 47 includes AND gates 51 and 52 and an NOR gate 53, where the AND gate 51 receives input data D and selection signal SM respectively from the input terminal PI and the selection signal input terminal PS, and the AND gate 52 receives an inverted value of the selection signal SM and scan input data SI obtained from a scan input terminal PSC. The OR gate 53 receives outputs of the AND gates 51 and 52 and outputs its OR as the selection data SD.

The data selecting circuit 47 with such structure outputs the input data D as the selection data SD when the selection signal SM is at "H", and outputs the scan input data SI as the selection data SD when the selection signal SM is at "L".

The FF 50 with such structure fixes the control signal SC, which is a controlling clock to "L" and makes the reference clock T invalid when the selection data SD and the output data Q agree and there is no need of writing the selection data SD into the data holding means 28.

When the selection data SD and the output data Q disagree and the selection data SD must be written into the data holding means 28, the reference clock T is provided as it is as the control signal SC and the data holding means 28 is caused to perform data writing operation for the selection data SD in synchronization with the control signal SC (reference clock T).

This way, in the semiconductor integrated circuit according to the sixty-third preferred embodiment, only when data writing operation by the data holding means 28 is needed, the reference clock T is provided as the control signal SC, and when there is no need of writing, the control signal SC is fixed at "L" and the reference clock T is made invalid. Hence, the semiconductor integrated circuit according to the sixty-third preferred embodiment has a low power consumption effect that charge/discharge of the reference clock T is made only for the wire capacitance of the clock signal line 4 and gate capacitance of a transistor serving as an input stage of the AND gate 55 when writing is not needed.

Furthermore, the data selecting circuit 47 outputs on the basis of the selection signal SM one data of the input data D and the scan input data SI as the selection data SD, so that selecting the scan input data SI as the selection data SD allows a scan test to be executed with low power consumption.

While the invention has been described in detail, the foregoing description is in all aspects illustrative and not restrictive. It is understood that numerous other modifications and variations can be devised without departing from the scope of the invention.

We claim:

1. A semiconductor integrated circuit, comprising:

an input terminal receiving input data;

first and second output terminals;

input data inverting means for outputting inverted input data which is a logical inversion of said input data obtained through said input terminal;

first data holding means receiving said input data and said inverted input data, for holding a logical value indicated by said input data as first internal output data and holding a logical value indicated by said inverted input data as first inverted internal output data in synchronization with a first controlling clock;

second data holding means receiving said first internal output data and said first inverted internal output data, for holding a logical value indicated by said first internal output data as second internal output data and holding a logical value indicated by said first inverted internal output data as second inverted internal output data in synchronization with a second controlling clock;

first external data output means for logically inverting said second inverted internal output data to output output data from said first output terminal;

second external data output means for logically inverting said second internal output data to output inverted output data from said second output terminal;

first clock control means receiving first and second comparison data and a reference clock, for outputting said reference clock/a fixed voltage as said first controlling clock on the basis of match/mismatch of logical values of said first comparison data and said second comparison data; and second clock control means receiving third and fourth comparison data and said reference clock, for outputting said reference clock/a fixed voltage as said second controlling clock on the basis of match/mismatch of logical values of said third comparison data and said fourth comparison data;

wherein said first comparison data is one data of said input data and said inverted input data, and said second comparison data is one data of said first internal data, said second internal data, said output data, said first inverted internal data, said second inverted internal data and said inverted output data;

when said first comparison data is said input data, said second comparison data is one data of said first internal data, said second internal data and said output data; and when said first comparison data is said inverted input data, said second comparison data is one data of said first inverted internal data, said second inverted internal data and said inverted output data; and said third comparison data is one data of said input data, said first internal data, said inverted input data and said first inverted internal data, and said fourth comparison data is one data of said first internal data, said second internal data, said output data, said first inverted internal data, said second inverted internal data and said inverted output data; and when said third comparison data is said input data, said fourth comparison data is one data of said first internal data, said second internal data and said output data;

when said third comparison data is said first internal data, said fourth comparison data is one data of said second internal data and said output data;

when said third comparison data is said inverted input data, said fourth comparison data is one data of said first inverted internal data, said second inverted internal data and said inverted output data; and when said third comparison data is said first inverted internal data, said fourth comparison data is one data of said second inverted internal data and said inverted output data.

2. The semiconductor integrated circuit according to claim 1, wherein when said first comparison data is said input data, said second comparison data is one data of said first internal data and said second internal data, when said third comparison data is said input data, said fourth comparison data is one data of said first internal data and said second internal data, and when said third comparison data is said first internal data, said fourth comparison data is said second internal data.

3. The semiconductor integrated circuit according to claim 2, wherein when said first comparison data is said inverted input data, said second comparison data is one data of said first inverted internal data and said inverted output data, when said third comparison data is said inverted input data, said fourth comparison data is one data of said first inverted internal data and said inverted output data, and when said third comparison data is said first inverted internal data, said fourth comparison data is said inverted output data.

4. The semiconductor integrated circuit according to claim 1, wherein when said first comparison data is said inverted input data, said second comparison data is one data of said first inverted internal data and said second inverted internal data, when said third comparison data is said inverted input data, said fourth comparison data is one data of said first inverted internal data and said second inverted internal data, and when said third comparison data is said first inverted internal data, said fourth comparison data is said second inverted internal data.

5. The semiconductor integrated circuit according to claim 4, wherein when said first comparison data is said input data, said second comparison data is one data of said first internal data and said output data, when said third comparison data is said input data, said fourth comparison data is one data of said first internal data and said inverted output data, and when said third comparison data is said first internal data, said fourth comparison data is said output data.

6. The semiconductor integrated circuit according to claim 1, wherein said first comparison data is said inverted input data, and said third comparison data is one data of said first internal data, said inverted input data and said first inverted internal data.

7. The semiconductor integrated circuit according to claim 1, wherein when said first comparison data is said input data, said second comparison data is one data of said first internal data and said second internal data, when said first comparison data is said inverted input data, said second comparison data is one data of said first inverted internal data and said second inverted internal data, when said third comparison data is said input data, said fourth comparison data is one data of said first internal data and said second internal data, when said third comparison data is said first internal data, said fourth comparison data is said second inverted internal data, when said third comparison data is said inverted input data, said fourth comparison data is one data of said first inverted internal data and said second inverted internal data, and when said third comparison data is said first inverted internal data, said fourth comparison data is said second inverted internal data.

8. The semiconductor integrated circuit according to claim 1, wherein when said first comparison data is said input data, said second comparison data is said output data, said third comparison data is one data of said inverted input data and said first inverted internal data, and said fourth comparison data is said inverted output data, and when said first comparison data is said inverted input data, said second comparison data is said inverted output data, said third comparison data is one data of said input data and said first internal data, and said fourth comparison data is said output data.

9. A semiconductor integrated circuit, comprising:

input data inverting means receiving input data for outputting inverted input data which is a logical inversion of said input data;

first data holding means receiving said input data and said inverted input data, for holding a logical value indicated by said input data as first internal output data and holding a logical value indicated by said inverted input data as first inverted internal output data in synchronization with a controlling clock;

second data holding means receiving said first internal output data and said first inverted internal output data, for holding a logical value indicated by said first internal output data as second internal output data and holding a logical value indicated by said first inverted internal output data as second inverted internal output data in synchronization with said controlling clock;

first external data output means for logically inverting said second inverted internal output data to output output data;

second external data output means for logically inverting said second internal output data to output inverted output data; and clock control means receiving first to fourth comparison data and a reference clock, for outputting said reference clock or a fixed voltage as said controlling clock on the basis of said first through fourth comparison data;

said clock control means comprising, a first AND gate receiving said first and second comparison data for executing AND operation of said first comparison data and said second comparison data to output first logical data, a second AND gate receiving said third and fourth comparison data for executing AND operation of said third comparison data and said fourth comparison data to output second logical data, an OR gate for executing OR operation of said first and second logical data to output third logical data, and a clock control gate receiving said reference clock and said third logical data for outputting said reference clock/said fixed voltage as said controlling clock on the basis of "H"/"L" of said third logical data, wherein said first comparison data is one data of said input data and said inverted input data, when said first comparison data is said input data, said second comparison data is one data of said first inverted internal data, said second inverted internal data and said inverted output data, said third comparison data is data of said inverted input data, and said fourth comparison data is one data of said first internal data, said second internal data and said output data, and when said first comparison data is said inverted input data, said second comparison data is one data of said first internal data, said second internal data and said output data, said third comparison data is said input data, and said fourth comparison data is one data of said first inverted internal data, said second inverted internal data, and said inverted output data.

10. A semiconductor integrated circuit, comprising:

first to n-th data holding means respectively receiving first to n-th input data, for in synchronization with a common controlling clock, holding logical values indicated by said first to n-th input data respectively as first to n-th output data and holding inverted values of the logical values respectively indicated by said first to n-th input data as first to n-th inverted output data;

first to n-th comparison means respectively receiving said first to n-th input data and said first to n-th output data, for respectively comparing said first to n-th input data and said first to n-th output data to respectively output first to n-th comparison signals indicating match/mismatch; and clock control means receiving said first to n-th comparison signals and a reference clock, for outputting a fixed voltage as said controlling clock only when said first to n-th comparison signals all indicate match and otherwise outputting said reference clock as said controlling clock.

11. A semiconductor integrated circuit, comprising:

input data selecting means receiving input data and scan input data, for outputting one data of said input data and said scan input data as selection data on the basis of a selection signal;

data holding means receiving said selection data for holding a logical value indicated by said selection data as output data in synchronization with a controlling clock; and clock control means receiving said selection data, said output data and a reference clock, for comparing said selection data and said output data to, on the basis of match/mismatch thereof, output a fixed voltage/said reference clock as said controlling clock.

* * * * *

UNITED STATES PATENT AND TRADEMARK OFFICE
CERTIFICATE OF CORRECTION

PATENT NO. : 5,703,513
DATED : December 30, 1997
INVENTOR(S) : Takeshi HASHIZUME ET AL.

It is certified that error appears in the above-identified patent and that said Letters Patent is hereby corrected as shown below:

Column 57, line 22, delete "inverted"

Signed and Sealed this

Second Day of May, 2000

Attest:

Q. TODD DICKINSON

*Attesting Officer*           *Director of Patents and Trademarks*